United States Patent
Bridges et al.

(10) Patent No.: US 10,249,821 B2
(45) Date of Patent: Apr. 2, 2019

(54) FORMATION AND STRUCTURE OF LYOTROPIC LIQUID CRYSTALLINE MESOPHASES IN DONOR-ACCEPTOR SEMICONDUCTING POLYMERS

(71) Applicant: The Regents of the University of California, Oakland, CA (US)

(72) Inventors: Colin R. Bridges, Goleta, CA (US); Michael J. Ford, Santa Barbara, CA (US); Guillermo C. Bazan, Santa Barbara, CA (US); Rachel A. Segalman, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days.

(21) Appl. No.: 15/661,442

(22) Filed: Jul. 27, 2017

(65) Prior Publication Data

US 2018/0033971 A1 Feb. 1, 2018

Related U.S. Application Data

(60) Provisional application No. 62/367,401, filed on Jul. 27, 2016, provisional application No. 62/480,693, filed on Apr. 3, 2017.

(51) Int. Cl.
*H01L 51/00* (2006.01)
*C08G 61/12* (2006.01)
*H01L 51/05* (2006.01)

(52) U.S. Cl.
CPC ........ *H01L 51/0036* (2013.01); *C08G 61/122* (2013.01); *C08G 61/123* (2013.01); *C08G 61/126* (2013.01); *H01L 51/0043* (2013.01); *C08G 2261/11* (2013.01); *C08G 2261/12* (2013.01); *C08G 2261/146* (2013.01); *C08G 2261/1412* (2013.01); *C08G 2261/312* (2013.01); *C08G 2261/3241* (2013.01); *C08G 2261/3243* (2013.01); *C08G 2261/3246* (2013.01); *C08G 2261/3321* (2013.01); *C08G 2261/344* (2013.01); *C08G 2261/92* (2013.01); *H01L 51/0558* (2013.01); *H01L 51/0566* (2013.01)

(58) Field of Classification Search
CPC .......................... C08G 61/126; H01L 41/0036
USPC .............................................. 257/40; 438/99
See application file for complete search history.

(56) References Cited

U.S. PATENT DOCUMENTS

| | | | | |
|---|---|---|---|---|
| 5,597,890 A | * | 1/1997 | Jenekhe | C08G 61/00 524/417 |
| 9,315,618 B2 | * | 4/2016 | Kim | C08G 61/126 |
| 9,711,728 B1 | * | 7/2017 | Facchetti | H01L 51/0043 |
| 2009/0065057 A1 | * | 3/2009 | Marder | C07D 487/14 136/263 |
| 2009/0179194 A1 | * | 7/2009 | Wu | H01L 21/02126 257/40 |
| 2015/0011721 A1 | | 1/2015 | Kim et al. | |
| 2017/0133611 A1 | * | 5/2017 | Wang | H01L 51/0558 |
| 2017/0200892 A1 | * | 7/2017 | Tseng | H01L 51/0043 |
| 2017/0233384 A1 | * | 8/2017 | Chen | C07D 417/14 548/126 |
| 2017/0260325 A1 | * | 9/2017 | Blouin | C08G 61/126 |
| 2017/0338415 A1 | * | 11/2017 | Ford | H01L 51/0035 |
| 2017/0365801 A1 | * | 12/2017 | Margulies | H01L 51/0085 |
| 2018/0052136 A1 | * | 2/2018 | Diao | G01N 27/4141 |
| 2018/0079858 A1 | * | 3/2018 | He | C08G 61/126 |

OTHER PUBLICATIONS

Bridges, C.R., et al., "Molecular Considerations for Mesophase Interaction and Alignment of Lyotropic Liquid Crystalline Semiconducting Polymers", ACS Macro Lett., 2017, pp. 619-624, 6(6) (including supporting information).

Bridges, C.R., et al., "Formation and Structure of Lyotropic Liquid-Crystalline Mesophases in Donor-Acceptor Semiconducting Polymers", Macromolecules, 2016, pp. 7220-7229, 49 (19) (including supporting information).

Kim, B-G., et al., "A molecular design principle of lyotropic liquidcrystalline conjugated polymers with directed alignment capability for plastic electronics", Nature Materials, Jul. 2013, pp. 659-664, vol. 12.

Ying et al., "Regioregular Pyridal[2,1,3]Thiadiazole Π-Conjugated Copolymers". J. Am. Chem. Soc. 2011, 133 (46), 18538-18541.

Tseng et al., "High-Mobility Field-Effect Transistors Fabricated with Macroscopic Aligned Semiconducting Polymers". Adv. Mater 2014, 26 (19), 2993-2998.

Giri et al. "Effect of Solution Shearing Method on Packing and Disorder of Organic Semiconductor Polymers". Chem. Mater. 2015, 27 (7), 2350-2359.

Giri et al., "Tuning Charge Transport in Solution-Sheared Organic Semiconductors Using Lattice Strain". Nature 2011, 480 (7378), 504-508.

(Continued)

Primary Examiner — George Fourson, III
(74) Attorney, Agent, or Firm — Gates & Cooper LLP

(57) ABSTRACT

Design of side chains yielding highly amphiphilic conjugated polymers is proven to be an effective and general method to access lyotropic liquid crystalline mesophases, allowing greater control over crystalline morphology and improving transistor performance. The general strategy enables variations in structure and interactions that impact alignment and use of liquid crystalline alignment methods. Specifically, solvent-polymer interactions are harnessed to facilitate the formation of high quality polymer crystals in solution. Crystallinity developed in solution is then transferred to the solid state, and thin films of donor-acceptor copolymers cast from lyotropic solutions exhibit improved crystalline order in both the alkyl and π-stacking directions. Due to this improved crystallinity, transistors with active layers cast from lyotropic solutions exhibit a significant improvement in carrier mobility compared to those cast from isotropic solution. One or more embodiments of the present invention achieve a maximum carrier mobility of 0.61 $cm^2V^{-1}s^{-1}$.

21 Claims, 15 Drawing Sheets

(56) References Cited

OTHER PUBLICATIONS

Bridges et al., "Formation and Structure of Lyotropic Liquid Crystalline Mesophases in Donor-Acceptor Semiconducting Polymers". Macromolecules 2016, 49 (19), 7220-7229.

Bridges, et al., "Molecular Considerations for Mesophase Interaction and Alignment of Lyotropic Liquid Crystalline Semiconducting Polymers". ACS Macro Leff. 2017, 619-624.

Kim, "Molecular Design Principle of Lyotropic Liquid-Crystalline Conjugated Polymers with Directed Alignment Capability for Plastic Electronics". Nature Materials 2013, 12 (7), 659-664.

Fu et al., "Enhancing Field-Effect Mobility of Conjugated Polymers Through Rational Design of Branched Side Chains". Adv. Funct. Mater. 2014, 24 (24), 3734-3744.

Kim et al., "High-Performance Organic Field-Effect Transistors with Directionally Aligned Conjugated Polymer Film Deposited From Pre-Aggregated Solution". Chem. Mater. 2015, 27 (24), 8345-8353.

Heeney et al., "Alkylidene Fluorene Liquid Crystalline Semiconducting Polymers for Organic Field Effect Transistor Devices". Macromolecules 2004, 37 (14), 5250-5256.

* cited by examiner

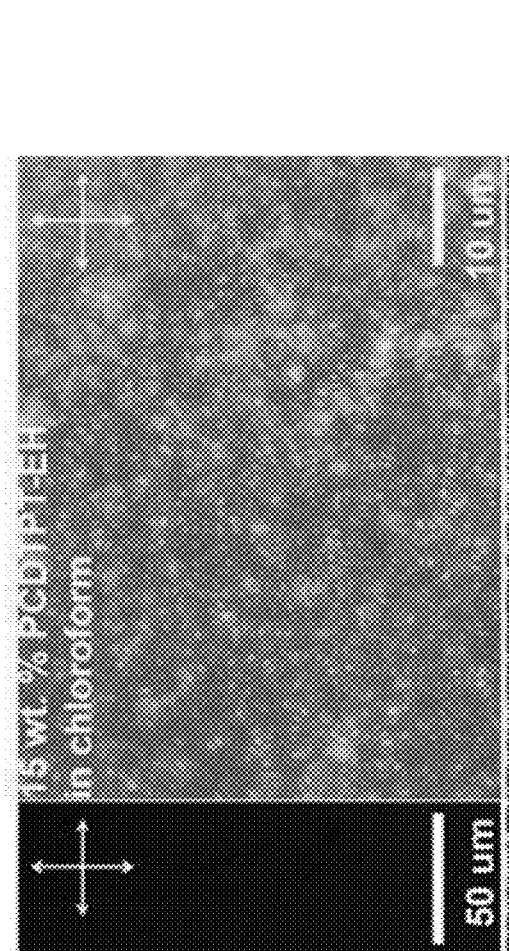
*Figure 3(b)*
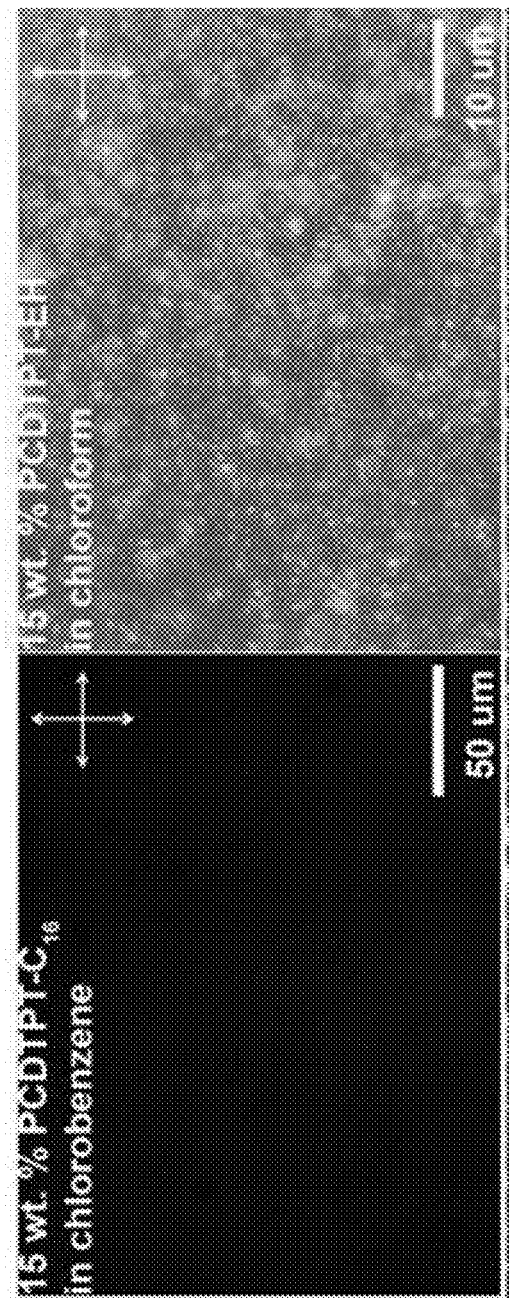
*Figure 3(a)*
*Figure 3(c)*
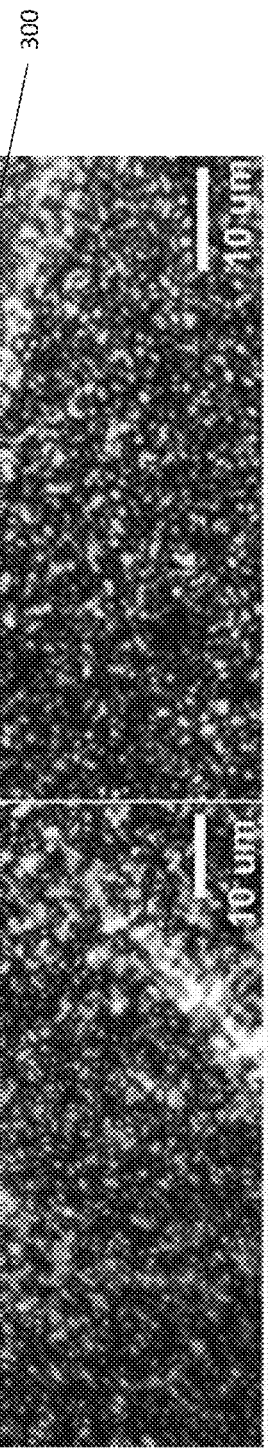
*Figure 3(d)*

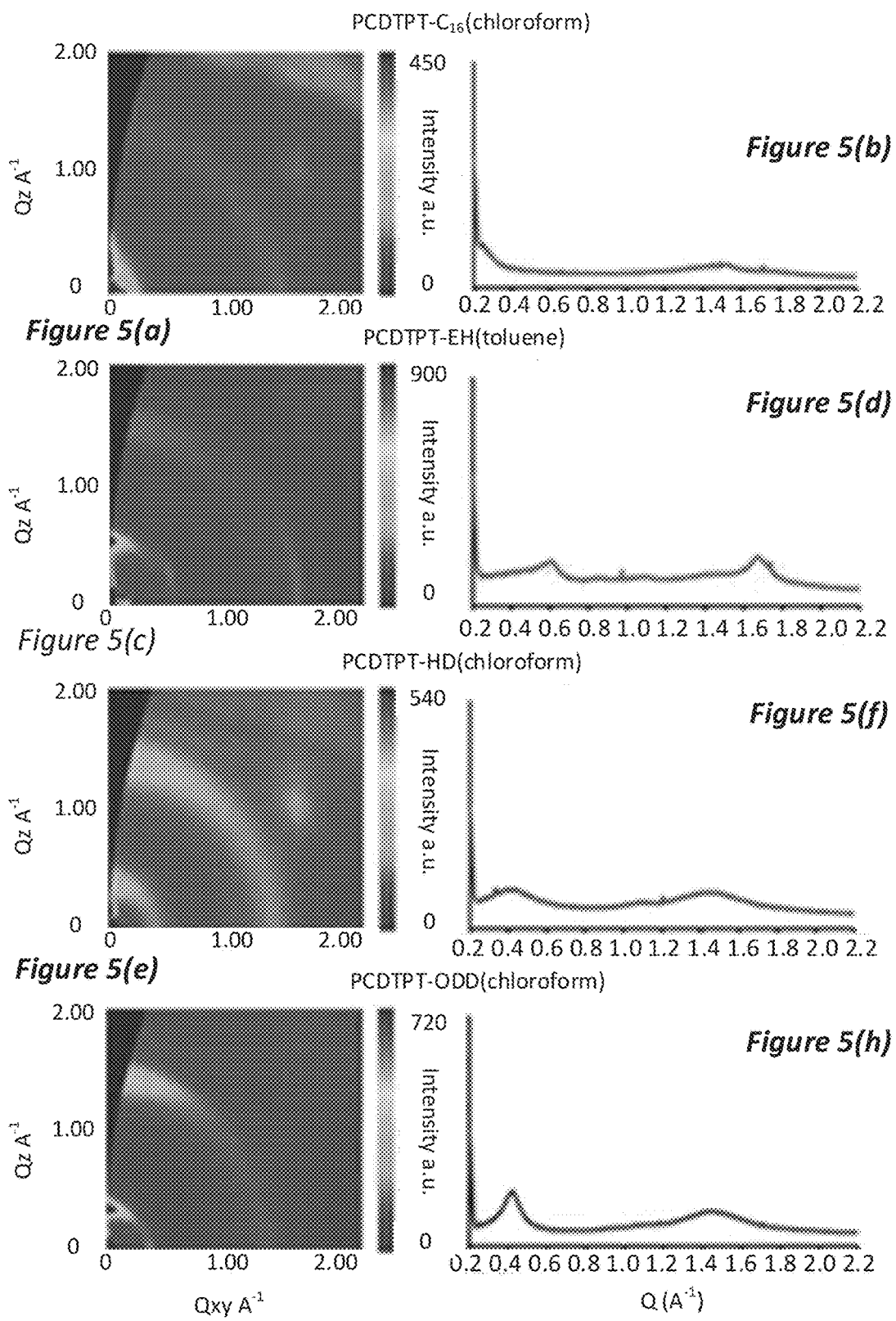

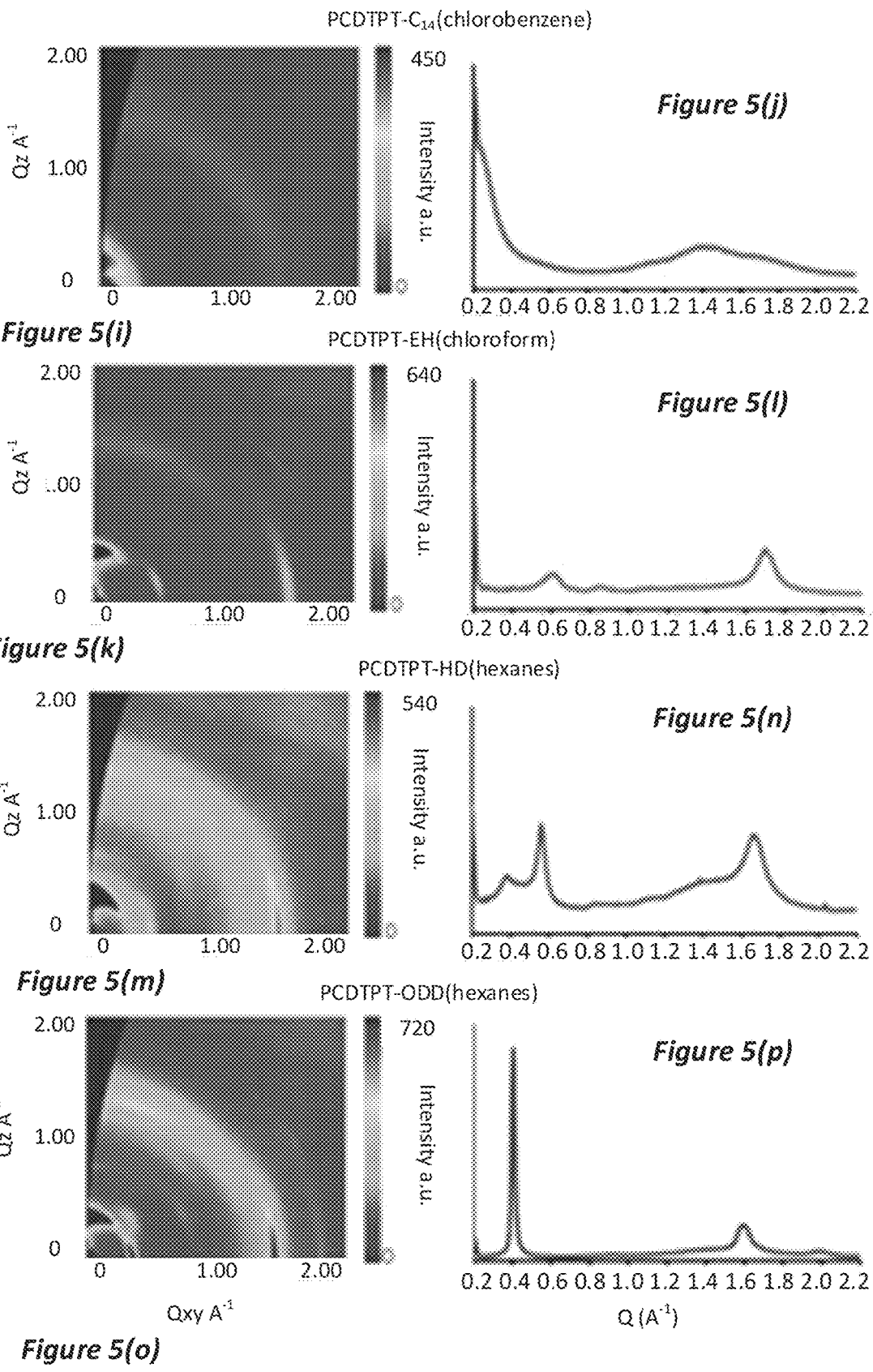

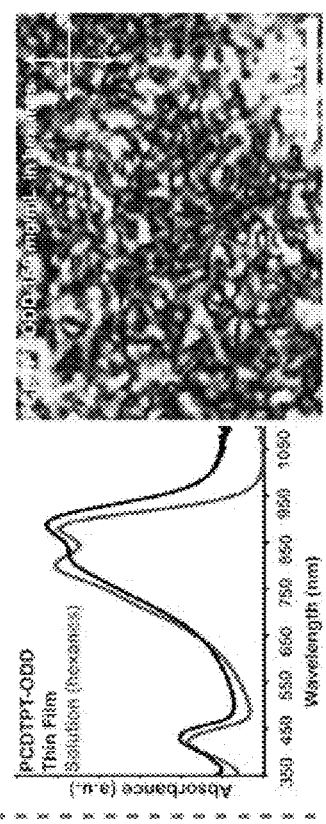
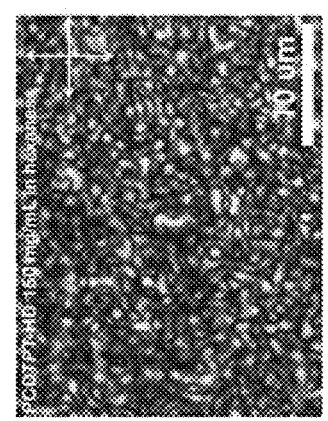
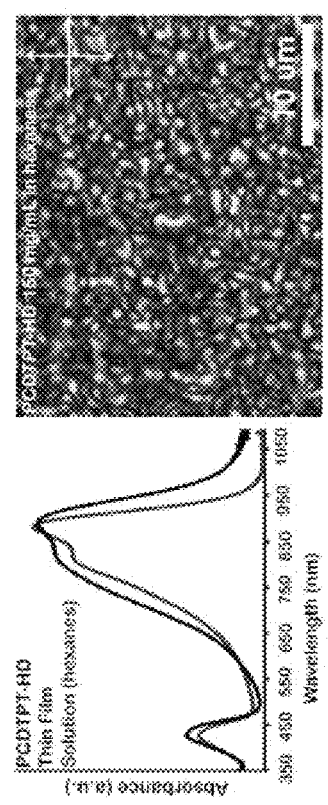
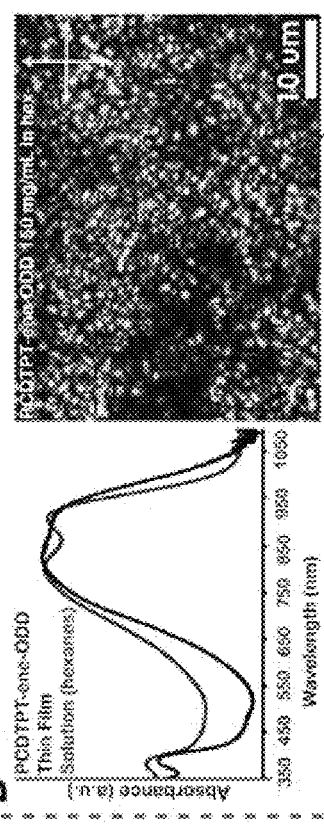
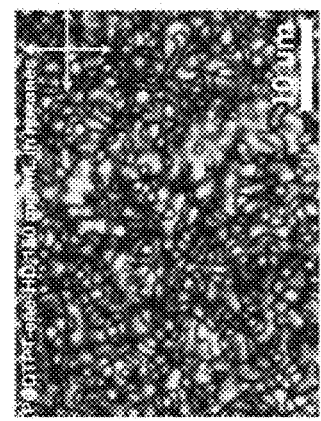
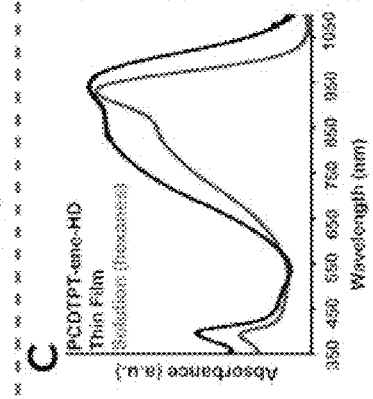

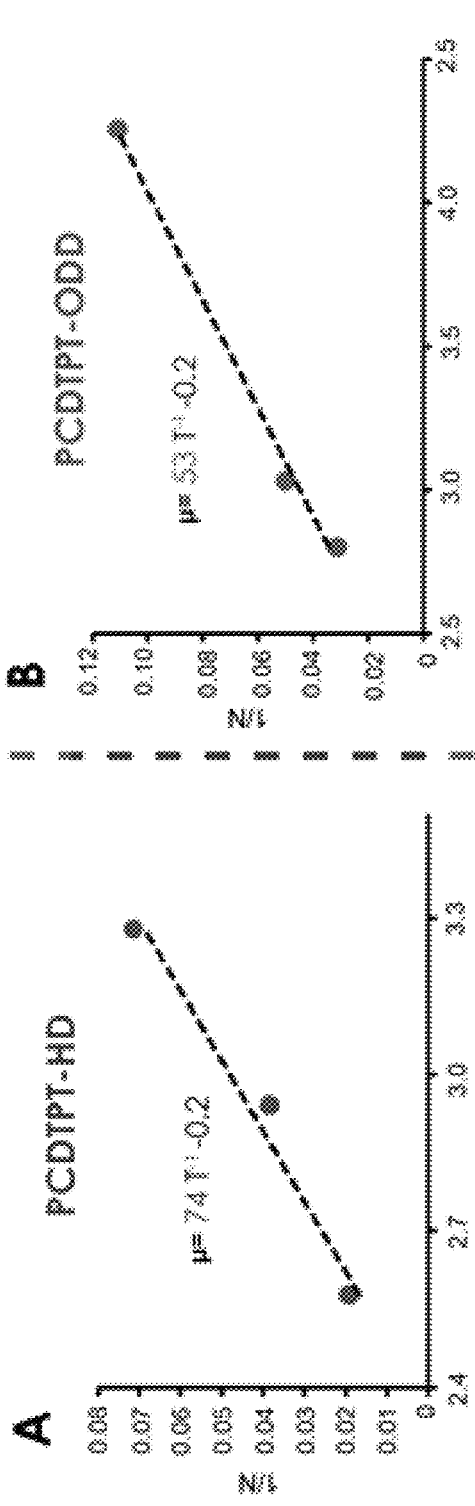
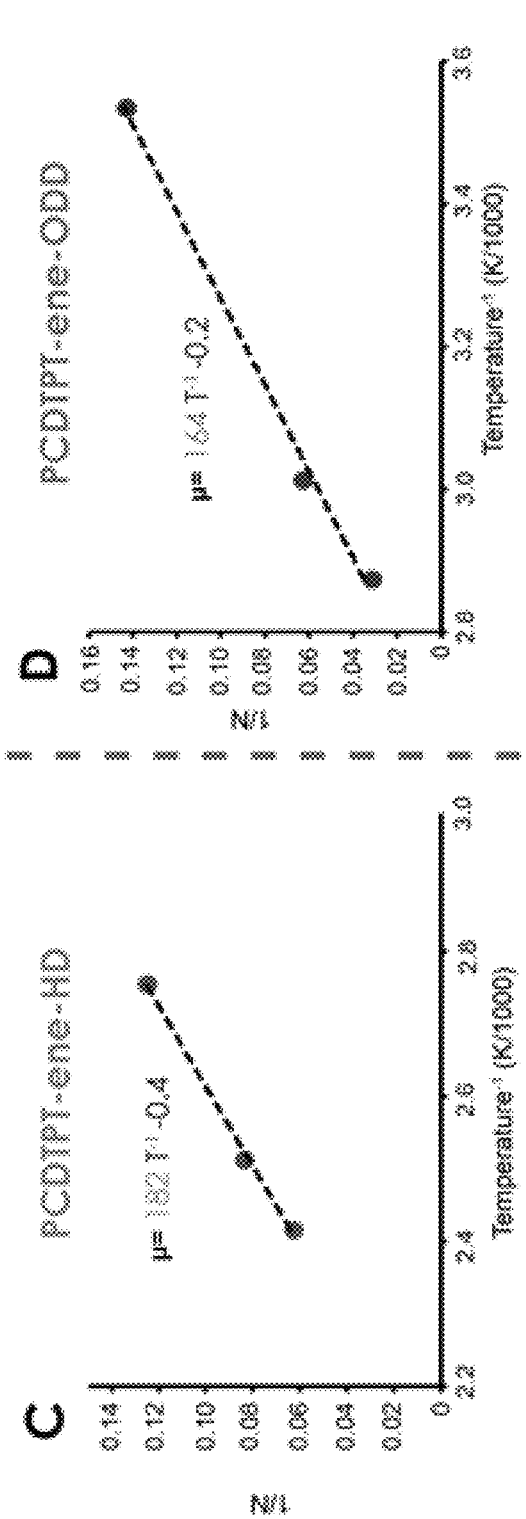
Figure 9(a), Figure 9(b), Figure 9(c), Figure 9(d)

*Figure 10(e)*
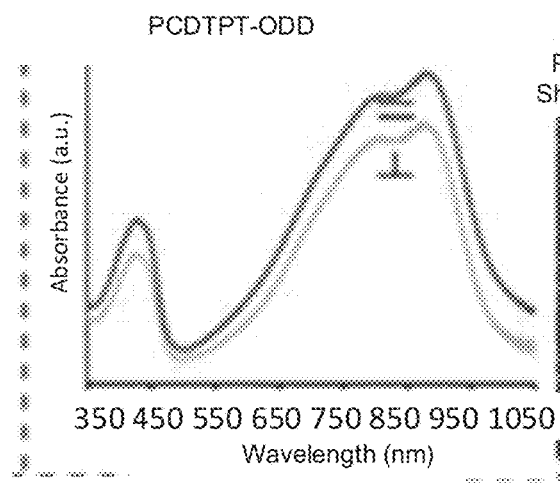
*Figure 10(f)*
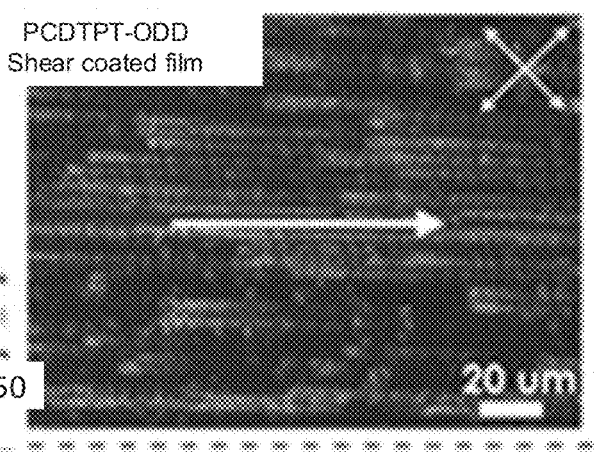
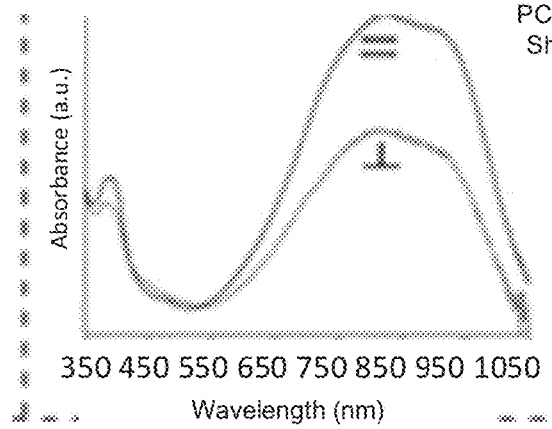
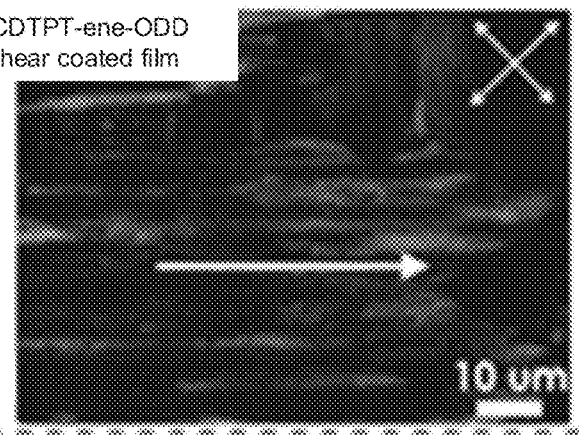
*Figure 10(g)*        *Figure 10(h)*

FORMATION AND STRUCTURE OF LYOTROPIC LIQUID CRYSTALLINE MESOPHASES IN DONOR-ACCEPTOR SEMICONDUCTING POLYMERS

CROSS REFERENCE TO RELATED APPLICATIONS

This application claims the benefit under 35 U.S.C. Section 119(e) of the following and commonly-assigned applications:

U.S. Provisional Patent Application No. 62/367,401, filed Jul. 27, 2016, by Colin R. Bridges, Michael J. Ford, Guillermo C. Bazan, and Rachel A. Segalman, entitled "FORMATION AND STRUCTURE OF LYOTROPIC LIQUID CRYSTALLINE MESOPHASES IN DONOR-ACCEPTOR SEMICONDUCTING POLYMERS,"; and U.S. Provisional Patent Application No. 62/480,693 filed Apr. 3, 2017, by Colin Bridges and Rachel A. Segalman, entitled "MOLECULAR CONSIDERATIONS FOR MESOPHASE INTERACTION AND ALIGNMENT OF LYOTROPIC LIQUID CRYSTALLINE SEMICONDUCTING POLYMERS,";

both of which applications are incorporated by reference herein.

This application is related to the following co-pending and commonly-assigned U.S. patent applications:

U.S. Utility patent application Ser. No. 15/400,579, filed Jan. 6, 2017, by Michael J. Ford and Guillermo Bazan, entitled "STABLE ORGANIC FIELD-EFFECT TRANSISTORS BY INCORPORATING AN ELECTRON-ACCEPTING MOLECULE,", which application claims the benefit under 35 U.S.C. Section 119(e) of U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE,";

U.S. Utility patent application Ser. No. 15/496,826, filed Apr. 25, 2017, by Guillermo Bazan and Ming Wang, entitled "NOVEL WEAK DONOR-ACCEPTOR CONJUGATED COPOLYMERS FOR FIELD-EFFECT TRANSISTOR APPLICATIONS,", which application claims the benefit under 35 U.S.C. Section 119(e) of U.S. Provisional Patent Application No. 62/327,311, filed Apr. 25, 2016, by Guillermo C. Bazan and Ming Wang, entitled "NOVEL WEAK DONOR-ACCEPTOR CONJUGATED COPOLYMERS FOR FIELD-EFFECT TRANSISTOR APPLICATIONS,"; and U.S. Provisional Patent Application No. 62/489,303, filed Apr. 24, 2017, by Guillermo C. Bazan and Ming Wang, entitled "LINEAR CONJUGATED POLYMER BACKBONES IMPROVE THE ANISOTROPIC MORPHOLOGY IN NANOGROOVE ASSISTED ALIGNMENT ORGANIC FIELD-EFFECT TRANSISTOR APPLICATIONS,", U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS,";

U.S. Utility patent application Ser. No. 15/599,816, filed May 19, 2017, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT,", which application claims the benefit under 35 U.S.C. Section 119(e) of U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT,";

U.S. Utility patent application Ser. No. 15/349,920, filed Nov. 11, 2016, by Ming Wang and Guillermo Bazan, entitled "FLUORINE SUBSTITUTION INFLUENCE ON BENZO [2,1,3]THIODIAZOLE BASED POLYMERS FOR FIELD-EFFECT TRANSISTOR APPLICATIONS,", which application claims the benefit under 35 U.S.C. Section 119(e) of U.S. Provisional Patent Application No. 62/253,975, filed Nov. 11, 2015, by Ming Wang and Guillermo Bazan, entitled "FLUORINE SUBSTITUTION INFLUENCE ON BENZO [2,1,3]THIODIAZOLE BASED POLYMERS FOR FIELD-EFFECT TRANSISTOR APPLICATIONS,";

U.S. Utility patent application Ser. No. 15/349,920, filed Nov. 11, 2016, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,", which application claims the benefit under 35 U.S.C. Section 119(e) of U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,";

U.S. Utility patent application Ser. No. 15/256,160, filed Sep. 2, 2016, by Byoung Hoon Lee and Alan J. Heeger, entitled "DOPING-INDUCED CARRIER DENSITY MODULATION IN POLYMER FIELD-EFFECT TRANSISTORS,", which application claims the benefit under 35 U.S.C. Section 119(e) of co-pending and commonly-assigned U.S. Provisional Patent Application No. 62/214,076, filed Sep. 3, 2015, by Byoung Hoon Lee and Alan J. Heeger, entitled "DOPING-INDUCED CARRIER DENSITY MODULATION IN POLYMER FIELD-EFFECT TRANSISTORS,";

U.S. Utility patent application Ser. No. 15/241,949 filed Aug. 19, 2016, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS,", which application claims the benefit under 35 U.S.C. Section 119(e) of U.S. Provisional Patent Application No. 62/207,707, filed Aug. 20, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS,"; and U.S. Provisional Patent Application No. 62/262,025, filed Dec. 2, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS,";

U.S. Utility application Ser. No. 15/213,029 filed on Jul. 18, 2016 by Byoung Hoon Lee and Alan J. Heeger, entitled "FLEXIBLE ORGANIC TRANSISTORS WITH CONTROLLED NANOMORPHOLOGY", , which application claims the benefit under 35 U.S.C. Section 119(e) of U.S. Utility U.S. Provisional Application Ser. No. 62/193,909 filed on Jul. 17, 2015 by Byoung Hoon Lee and Alan J. Heeger, entitled "FLEXIBLE ORGANIC TRANSISTORS WITH CONTROLLED NANOMORPHOLOGY", ;

U.S. Utility patent application Ser. No. 15/058,994, filed Mar. 2, 2016, by Shrayesh N. Patel, Edward J. Kramer, Michael L. Chabinyc, Chan Luo and Alan J. Heeger, entitled "BLADE COATING ON NANOGROOVED SUB- STRATES YIELDING ALIGNED THIN FILMS OF HIGH MOBILITY SEMICONDUCTING POLYMERS,", which application claims the benefit under 35 U.S.C. Section 119(e) of U.S. Provisional Patent Application No. 62/127,116, filed Mar. 2, 2015, by Shrayesh N. Patel, Edward J. Kramer, Michael L. Chabinyc, Chan Luo and Alan J. Heeger, entitled "BLADE COATING ON NANO-GROOVED SUBSTRATES YIELDING ALIGNED THIN FILMS OF HIGH MOBILITY SEMICONDUCTING POLYMERS,";

U.S. Utility patent application Ser. No. 14/585,653, filed on Dec. 30, 2014, by Chan Luo and Alan Heeger, entitled "HIGH MOBILITY POLYMER THIN FILM TRANSISTORS WITH CAPILLARITY MEDIATED SELF-ASSEMBLY", , which application claims the benefit under 35 U.S.C. Section 119(e) of U.S. Provisional Patent Application Ser. No. 61/923,452, filed on Jan. 3, 2014, entitled "HIGH MOBILITY POLYMER THIN FILM TRANSISTORS WITH CAPILLARITY MEDIATED SELF-ASSEMBLY,";

U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS," which application claims the benefit under 35 U.S.C. § 365 of PCT International patent application serial no. PCT/US13/058546 filed Sep. 6, 2013, which application claims the benefit under 35 U.S.C. Section 119(e) of U.S. Provisional Patent Application Ser. Nos. 61/698,065, filed on Sep. 7, 2012, and 61/863,255, filed on Aug. 7, 2013, entitled "FIELD-EFFECT TRANSISTORS BASED ON MACROSCOPICALLY ORIENTED POLYMERS,"; and U.S. Utility patent application Ser. No. 13/526,371, filed on Jun. 18, 2012, by G. Bazan, L. Ying, B. Hsu, W. Wen, H-R Tseng, and G. Welch entitled "REGIOREGULAR PYRIDAL[2,1,3]THIADIAZOLE PI-CONJUGATED COPOLYMERS FOR ORGANIC SEMICONDUCTORS", which application claims priority under 35 U.S.C. § 119(e) to U.S. Provisional Patent Application Ser. No. 61/498,390, filed on Jun. 17, 2011, by G. Bazan, L. Ying, B. Hsu, and G. Welch entitled "REGIOREGULAR CONSTRUCTIONS FOR THE SYNTHESIS OF THIADIAZOLO (3,4) PYRIDINE CONTAINING NARROW BAND GAP CONJUGATED POLYMERS" and U.S. Provisional Patent Application Ser. No. 61/645,970, filed on May 11, 2012, by G. Bazan, L. Ying, and Wen, entitled "REGIOREGULAR PYRIDAL[2,1,3]THIADIAZOLE PI-CONJUGATED COPOLYMERS FOR ORGANIC SEMICONDUCTORS";

all of which applications are incorporated by reference herein.

BACKGROUND OF THE INVENTION

1. Field of the Invention

This invention relates to method for fabricating organic devices using lyotropic semiconducting polymers and designing semiconducting polymer materials that exhibit liquid crystalline mesophases.

2. Description of the Related Art (Note: This application references a number of different references as indicated throughout the specification by one or more reference numbers in superscripts, e.g.,[x]. A list of these different references ordered according to these reference numbers (and in parentheses) can be found below in the section entitled "References." Each of these references is incorporated by reference herein.)

The relative size, fraction, and orientation of crystalline and amorphous regions in the active layer of polymer electronics vastly influences performance, as they directly affect how tortuous the path a charge carrier must follow. Additionally, as packing motifs directly influence intermolecular charge transport (i.e., close and ordered π-stacking are favored), the unit cell can have a profound impact on charge transport. Both power conversion efficiency and charge carrier mobility in polymeric thin film devices vary several orders of magnitude depending on morphology and molecular packing.[1-15] As such, gaining control over both short and long range molecular ordering is vital for optimizing function. Morphology optimization has focused on processing parameters that nucleate and grow preferred crystallite orientations, or trap non-equilibrium crystal structures.[1,2,13-20] Lyotropic conjugated polymers are attractive systems for solution-based self-assembly since they exhibit high fidelity ordering, and the director may be readily templated and propagated during processing.[21-25] Conjugated polymers generally consist of a rigid aromatic backbone and flexible side chains, which have similar structural characteristics to many molecules exhibiting thermotropic or lyotropic mesophases. In fact, conjugated polymers have been predicted to be liquid crystals, but due to their high melting temperatures, they degrade before melting.[26]

Low-melting thiophene based polymers, such as poly(3-alkylthiophenes) (P3AT), poly-(2,5-dialkyl)-1,4-phenylenevinylene) and poly(2,5-bis(3-alkyl-2-yl)-thieno[3,2-b]thiophene) (PBTTT), and some poly(9,9'-dialkylfluorene) based conjugated polymers, do exhibit thermotropic liquid crystalline mesophases.[27-35] P3AT's and PBTTT's are main chain thermotropic liquid crystalline systems that exhibit similar packing motifs: paracrystalline π-stacking and highly crystalline spacing between inter-digitated side chains. In the case of P3AT's, only those with very long or branched side chains exhibit thermotropic mesophases.[27] Depending on the length of its side chain, PBTTT exhibits a mesophase across a broad range of temperatures.[31, 35] As a result of the readily accessible thermotropic mesophases for these materials, the effects structure has on the electronic and optical characteristics are thorough and informative. In general, high performance transistors can be fabricated using a highly crystalline mesophases of PBTTT or P3AT's, a result attributed to their high crystallinity and high fidelity π-stacking.[27,31, 36-38]

To date, structure-property relationships in conjugated polymers have focused on P3ATs. In the context of high performance polymer electronics, P3ATs have been surpassed by donor-acceptor copolymers consisting of fused ring systems, which have a vastly different molecular structure and crystalline properties. Currently, less is known about how their structure can be manipulated using self-assembly, and how this affects device performance. As such, developing an understanding of the structure and formation of lyotropic mesophases in donor-acceptor conjugated polymers exhibiting intrinsically high carrier mobility remains an important goal. One or more embodiments of the present invention satisfy this need.

SUMMARY OF THE INVENTION

Controlling crystallinity and molecular packing at nano- and macroscopic length scales in conjugated polymer thin films is vital for improving the performance of polymer based electronic devices. To this end, the present disclosure describes a strategy for design of rigid donor-acceptor copolymers with soft side chains that facilitates the formation of lyotropic mesophases that can be used to improve polymer alignment. As described herein, the amphiphilicity of specially designed rigid donor-acceptor copolymers with backbones used in high performance polymer electronics is leveraged to allow the formation of highly ordered lyotropic mesophases. By increasing the length and branching of solubilizing chains, amphiphilicity can be increased, and lyotropic liquid crystalline mesophases are observed in selective solvents. These lyotropic mesophases consist of chain extended polymers exhibiting close, ordered π-stacking. This is evidenced by birefringent solutions, and redshifted absorbance spectra displaying pronounced excitonic coupling. Crystallinity developed in solution can be transferred to the solid state, and thin films of donor-acceptor copolymers cast from lyotropic solutions exhibit improved crystalline order in both the alkyl and π-stacking directions.

In addition, prior to the present disclosure, the role of intermolecular interactions in achieving correlated alignment of molecular and crystalline morphologies (that provide direct pathways for charge carriers to follow) was unexplored. The present disclosure demonstrates intermolecular interactions in conjugated polymers influence crystallinity, self-assembly, and packing motif, factors which in turn crucially impact charge transport properties such as carrier mobility in organic electronic devices. As described herein, a series of lyotropic liquid crystalline conjugated polymers were synthesized with variable side chain structure to lend distinct steric repulsion and Van der Waals attractive forces to each mesophase and investigate the role of intermolecular interactions on mesophase alignment. The strength of intermolecular interaction for each mesophase is compared by measuring melting temperature, π-stacking distance, and the Maier-Saupe interaction parameter. In general, the present disclosure reports that side chain structure can impact interaction strength by varying steric repulsion and backbone attractions, and that the Maier-Saupe interaction parameters correlates with higher degrees of alignment after shearing, achieving a dichroic absorbance ratio of up to 2 in some examples (Dichroic ratio calculated from polarized light absorption is different with the dichroic ratio calculated from polarized emission and they are not comparable).

This approach of rational side chain design bridges the gap from solution structure to solid state structure, and is a promising and general approach to allow the expression of lyotropic mesophases in rigid conjugated polymers.

Due to this improved crystallinity, transistors with active layers cast from lyotropic solutions exhibit a significant improvement in carrier mobility compared to those cast from isotropic solution, reaching a maximum value of 0.61 $cm^2V^{-1}s^{-1}$ in one or more embodiments. Moreover, the discovery that intermolecular interactions influence crystallinity is used to develop equilibrium processing methods for fabricating macroscopically aligned polymer substrates used in transistors, improving mobility by a factor of three compared to spin coated devices.

Thus, embodiments of the present invention disclose various examples of lyotropic semiconducting polymers each having a donor-acceptor copolymer backbone and a side chain attached to the backbone, wherein the donor-acceptor copolymer backbone comprises fused aromatic rings.

To better illustrate the composition of matter and methods described herein, a non-limiting list of examples is provided here:

In Example 1, the semiconducting polymers are amphiphilic semiconducting polymers and the side chains dissolve in a solvent more effectively than the backbone.

In Example 2, the composition of matter of Example 1 further comprises a lyotropic solution comprising a solvent and the side chains dissolved in the solvent.

In Example 3, the composition of matter of one or any preceding example further comprises a lyotropic solution including the lyotropic semiconducting polymers stacked into a crystalline structure.

In Example 4, the composition of matter of Example 3 is characterized by having a thermal transition expected for a crystalline transition (e.g., as measured by DSC).

In Example 5, solvent enhanced intermolecular interactions between the lyotropic semiconducting polymers of one or any combination of Examples 1-4 align, or correlate alignment of, the lyotropic semiconducting polymers with a direction of a shear force applied to the solution.

In Example 6, the composition of one or any combination of Examples 1-5 is a liquid crystal comprising an aggregate including at least 100 of the lyotropic semiconducting polymers bonded with pi-pi bonds, wherein the liquid crystal is characterized by a Maier-Saupe interaction parameter of at least 50 (e.g., in a range of 50-200).

In Example 7, the composition of one or any combination of Examples 1-6 is a liquid crystal comprising an aggregate of the lyotropic semiconducting polymers bonded with pi-pi bonds, wherein the lyotropic semiconducting polymers have a number of segments or repeating units N and $N^{-1}$ is a linear function of (nematic-isotropic clearing temperature)$^{-1}$ (K).

In Example 8, the composition of one or any combination of Examples 1-7 further includes a solvent comprising water or at least one hydrocarbon selected from an alkane (e.g., hexane), an alkene, an alkyne, an ether, an ester, an alcohol, a halide, an aldehyde, a ketone, an amine, and an amide.

In Example 9, the side chain in one or any combination of Examples 1-8 is a branched $C_8$-$C_{50}$ or $C_3$-$C_{50}$ alkyl chain.

In Example 10, the side chain in one or any combination of Examples 1-9 is a branched $C_3$-$C_{50}$ chain extending more towards a direction parallel to the backbone than towards a direction perpendicular to the backbone.

In Example 11, the side chains in one or any combination of Examples 1-10 are in plane with the backbone to increase intermolecular interactions and pi-pi stacking between the semiconducting polymers and increase alignment of the semiconducting polymers (as compared to side chains that are out of plane with the backbone that reduce the intermolecular interactions and do not align the semiconducting polymers as well).

In Example 12, side chains in adjacent semiconducting polymers in one or any combination of Examples 1-11 are interdigitated and/or intercalated.

In Example 13, the side chain in one or any combination of Examples 1-12 are connected to the backbone via a double bond that is incapable of rotating about an axis connecting the side chain to the backbone.

In Example 14, the side chains in one or any combination of Examples 1-13 are selected to reduce steric repulsion between side chains and increase attraction between the backbones in adjacent semiconducting polymers.

In Example 15, the composition of one or any combination of Examples 1-14 is a solid state crystalline film comprising the lyotropic semiconducting polymers combined in a stack and pi-pi bonds between the lyotropic semiconducting polymers.

In Example 16, the solid state film of Example 15 is cast or deposited from a lyotropic solution and has increased crystallinity and mobility as compared to an active region comprising the same semiconducting polymers cast from an isotropic solution.

In Example 17, the solid state film of one or any combination of Examples 15-16 includes π-π stacking of the lyotropic semiconductor polymers characterized by a peak having a full width at half maximum of 0.11 Å$^{-1}$ or less, as measured by X-ray scattering.

In Example 18, the solid state film of one or any combination of Examples 15-17 includes π-π stacking of the lyotropic semiconductor polymers characterized by observation of secondary (0n0) and (n00) reflections and off-axis peaks, as measured by X-ray scattering (n is an integer).

In Example 19, the composition of one or any combination of Examples 15-18, the lyotropic semiconducting polymers at a top of the film are aligned with the semiconducting polymers at a bottom of the film.

In Example 20, the fused rings of one or any combination of Examples 1-19 do not include an aliphatic ring fused to an aromatic ring.

In Example 21, the backbone in one or any combination of Examples 1-20 does not comprise a fluorine-sulfur bond.

In Example 22, the backbone in one or any combination of Examples 1-20 comprises a fluorine-sulfur bond (e.g., PCDTFBT).

In Example 23, the backbone in one or any combination of Examples 1-22 comprises a donor attached to an acceptor, the donor and/or the acceptor comprising a fused aromatic ring.

In Example 24, the backbone in one or any combination of Examples 1-23 has a repeat unit that comprises:

an acceptor of the structure:

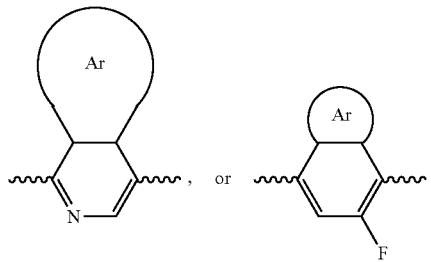

wherein Ar is a substituted or non-substituted aromatic functional group, or Ar is nothing and the valence of the pyridine ring or the fluorinated ring is completed with hydrogen; and a donor of the structure:

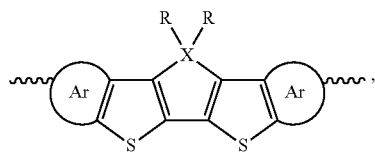

wherein each Ar is independently a substituted or non-substituted aromatic functional group, or each Ar is independently nothing and the valence of its respective thiophene ring is completed with hydrogen; each R is independently hydrogen or a substituted or non-substituted alkyl, aryl or alkoxy chain; and X is C, C=C, Si, Ge, N or P.

In Example 25, the lyotropic semiconducting polymers of one or any combination of Examples 1-24 comprise at least one compound selected from PCDTPT-EH, PCDTPT-HD, PCDTPT-ODD, PCDTPT-ene-HD, and PCDTPT-ene-ODD.

In Example 26, the lyotropic semiconducting polymers of one or any combination of Examples 1-25 are disposed in an active region in an organic device.

In Example 27, a method of fabricating an organic device of Example 26 comprises obtaining or preparing a lyotropic solution comprising semiconducting polymers disposed in a lyotropic liquid crystalline mesophase, wherein the semiconducting polymers each have a donor-acceptor copolymer backbone comprising fused aromatic rings attached to side chains; and solution processing the lyotropic solution on a substrate to form an active region comprising the semiconducting polymers.

In Example 28, the method of Example 27 further comprises selecting a selective solvent for the side chains; and combining the semiconducting polymers and the selective solvent so that the lyotropic solution is formed.

In Example 29, small variations in the structure and intermolecular interactions of the semiconducting polymers of Examples 27-28 are used to impact alignment and use of liquid crystalline alignment methods.

In Example 30, differential solvent interactions with the semiconducting polymers of one or any combination of the Examples 1-29 are used to make amphiphilic structures that form ordered aggregates, e.g., similar to micellation.

In Example 31, intermolecular interactions between the lyotropic semiconducting polymers of one or any combination of Examples 1-30 are controlled and increased/enhanced to achieve high alignment of the semiconducting polymers in the solid state.

In Example 32, a liquid crystal mesophase fabricated using the method of one or any combination of Examples 27-31 is present at concentrations of at least 0.01 mg/ml and above of the lyotropic solution.

In Example 33 the solution processing of one or any combination of Examples 27-32 comprises coating the lyotropic solution onto the substrate using an equilibrium coating method selected from blade coating, bar coating, roll coating, dip coating, dye coating, gravure coating, flow coating, and other directional coating processes.

In Example 34, the solution processing of one or any combination of Examples 27-33 includes coating the lyotropic solution onto the substrate, comprising applying a shear force/field to the lyotropic solution, wherein increased intermolecular interactions between the semiconducting polymers (tailored using the side chains and/or solvent) increase the effectiveness of shear alignment of the semiconducting polymers caused by the shear force/field.

In Example 35, the shear coating of Example 33 comprises applying the shear force with a blade having a larger area (e.g., more than a single contact point) of contact with the lyotropic solution so as to increase a period of time and/or distance the lyotropic solution is in the shear field/force.

BRIEF DESCRIPTION OF THE DRAWINGS

Referring now to the drawings in which like reference numbers represent corresponding parts throughout:

FIGS. 3(a)-3(d). Optical images of concentrated PCDTPT copolymer solutions under crossed polarizers. PCDTPT-$C_{16}$ does not exhibit birefringence in any solvent, PCDTPT-EH exhibits weak birefringence in chloroform, PCDTPT-HD and PCDTPT-ODD both exhibit strong birefringence in hexanes. The threaded texture indicates a nematic lyotropic liquid crystalline mesophase.

FIGS. 5(a)-5(p). two dimensional grazing incidence wide angle X-Ray Scattering (2D-GIWAXS) data and in-plane line-cuts for PCDTPT copolymers. While PCDTPT-$C_{16}$ is mostly amorphous, PCDTPT-EH, PCDTPT-HD and PCDTPT-ODD exhibit sharper diffraction peaks in both the alkyl (n00) and π stacking (0n0) directions when cast from lyotropic solutions.

FIGS. 8(a)-8(h). Absorbance Spectroscopy of solutions (colored trace) and thin film (black trace) of lyotropic conjugated polymers, and polarized optical microscopy images (FIGS. 8(b),8(d), 8(f), 8(h)). Both solid state and solution absorbance spectra all exhibit pronounced peaks attributed to crystalline π-stacking in solution. Concentrated lyotropic solutions exhibit a threaded birefringent texture under crossed polarizers, indicating a nematic lyotropic liquid crystalline mesophase. The lyotropic mesophase exists across all concentrations studied, from dilute solution in absorbance spectroscopy (0.1 mg/mL) and concentrated solutions in polarized optical microscopy (150 mg/mL).

FIGS. 9(a)-9(d). Maier-Saupe interaction parameter measurements for PCDTPT-HD (9(a)), PCDTPT-ODD (9(b)), PCDTPT-ene-HD (9(c)), and PCDTPT-ene-ODD (9(d)) were determined by plotting inverse nematic-isotropic clearing temperature as a function of inverse molecular weight. Nematic to isotropic clearing temperatures were determined using DSC on 150 mg/mL solutions of each polymer in decane.

FIGS. 10(a)-10(i) show dichroism of absorbance and polarized optical microscopy of thin films of PCDTPT and PCDTPT-ene copolymers after shear coating from lyotropic solution at 10 mg/mL. Liquid crystalline texture is aligned parallel to the shear direction as indicated by the arrow, and thin films exhibit higher absorbance when light is polarized with the direction of shearing. The Maier-Saupe A parameter can be correlated with dichroic ratio upon shearing (FIG. 10(i)).

DETAILED DESCRIPTION OF THE INVENTION

Figures 1A, 1B, 1C, 1D:
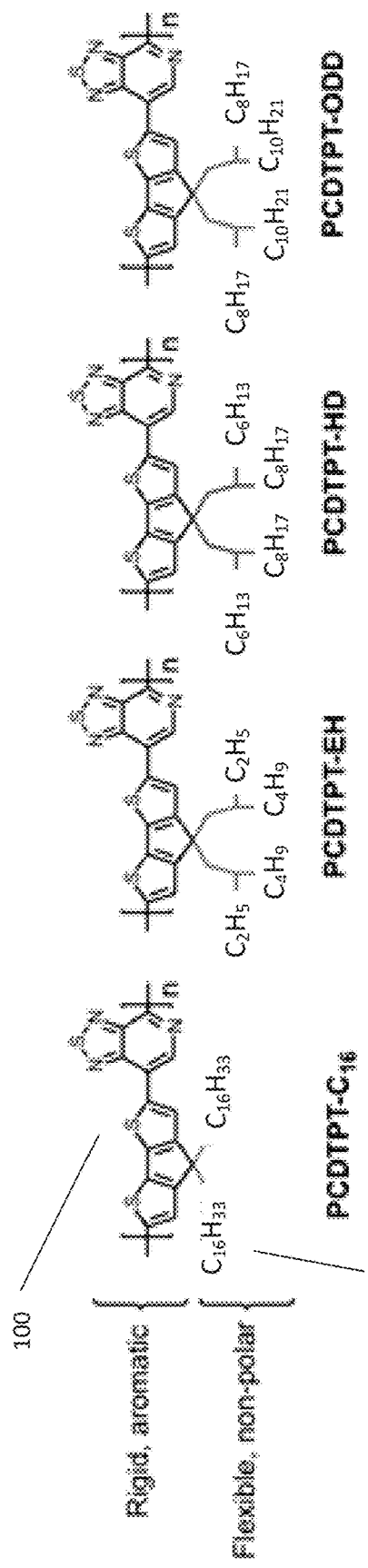
FIGS. 1(a)-1(d). Chemical structures, molecular weights, solubility, and shorthand names for the polymers used in this study. The side chains become more bulky (left to right) while the conjugated backbone remains constant.
Figure 2B:
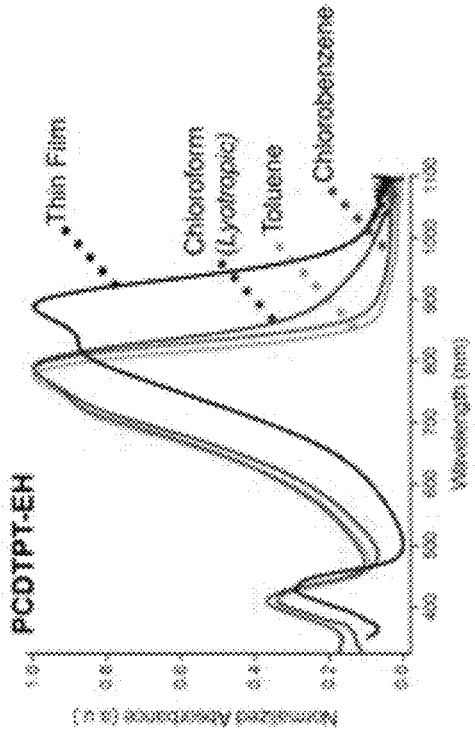
FIG. 2(a)-2(d). UV-vis spectra for PCDTPT copolymers in solution (colored traces) and thin films (black trace). Solutions of PCDTPT-HD and PCDTPT-ODD in lyotropic (birefringent) solutions exhibit red-shifted spectra and pronounced vibronic structure, similar to what is observed in the crystalline thin film. No birefringence is observed in solvents that do not exhibit these features. Thin films were spin coated from a 10 mg/mL solution. Solution absorbance was measured at a concentration of 0.1 mg/mL.
Figure 2D:
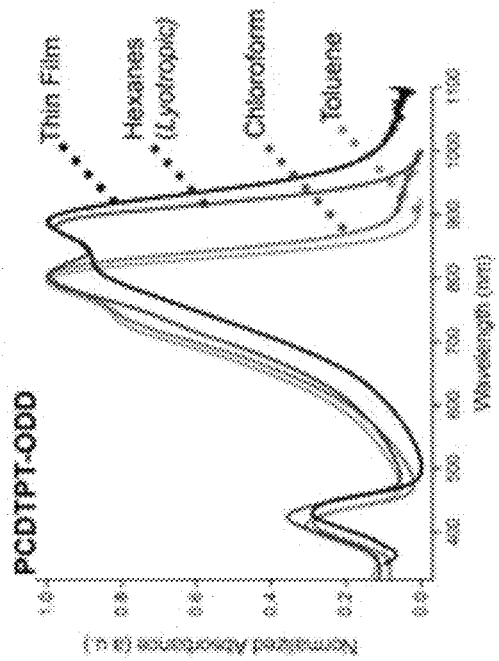
Figure 2A:
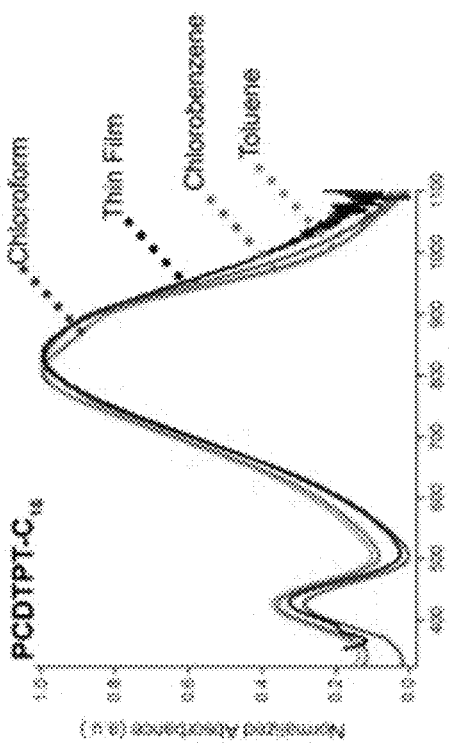
Figure 2C:
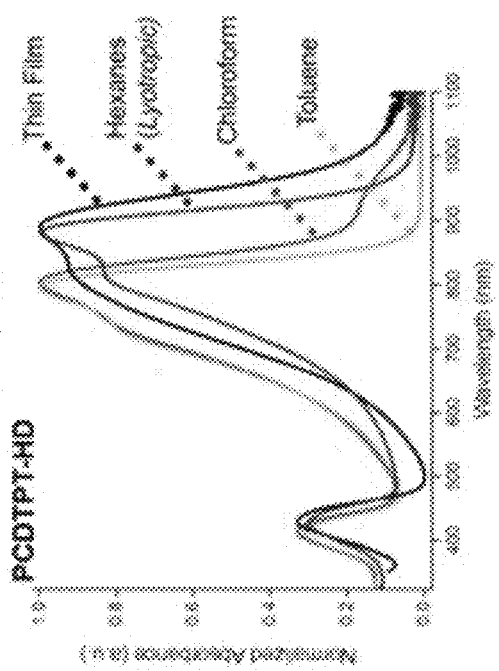
Figure 4A:
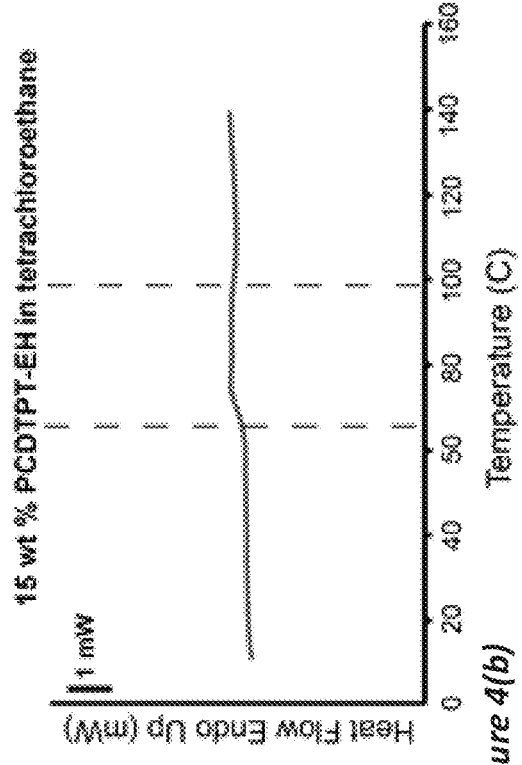
FIGS. 4(a)-4(d). Differential scanning calorimetry (DSC) of concentrated lyotropic solutions of PCDTPT-copolymers showing the lyotropic to isotropic transition ($T_{l-i}$). PCDTPT-$C_{16}$ is not lyotropic in any solvent, and no transition is seen. PCDTPT-EH exhibits weak birefringence, and only a weak transition is seen. Dashed or lines indicate the onset and endpoint of birefringence loss.
Figure 4B:
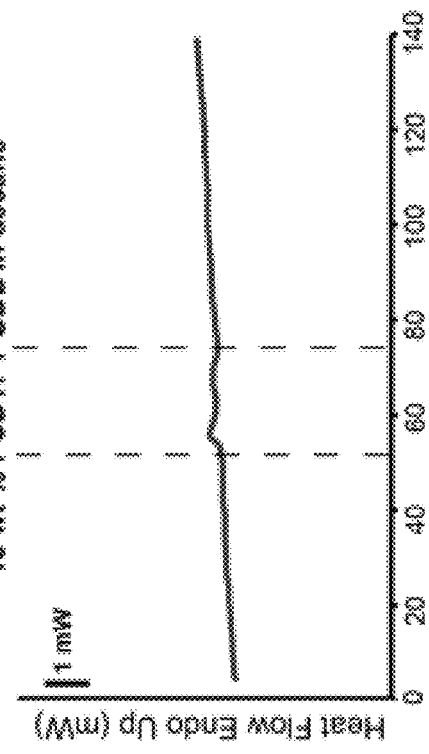
Figure 4C:
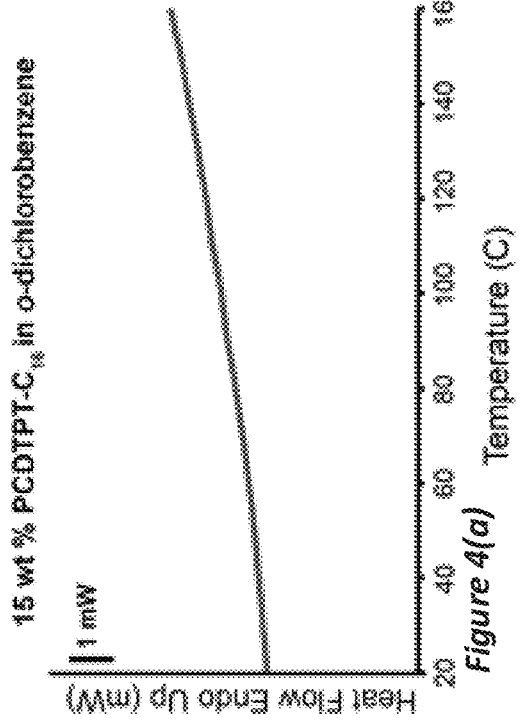
Figure 4D:
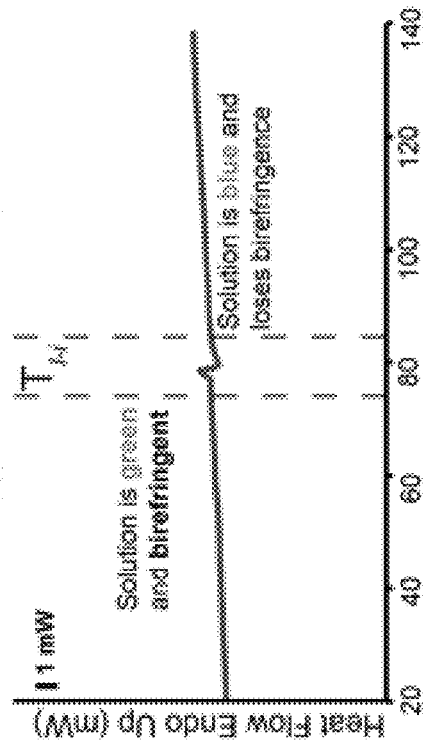

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

Technical Description

Introduction

In the context of thin film polymer electronics, it is recognized that while the electronic properties of a material (i.e. bandgap, electron affinity, ionization potential) play important roles in charge carrier mobility, there is also a tremendous effect of the size and fraction of crystalline and amorphous regions, as well as the molecular packing motif. Typical design considerations focus on changing the polymer backbone to affect electronic structure or crystal packing in the solid state, and how coating or annealing conditions can be tailored to improve the solid state morphology of a specific polymer. However, conventional methods do not provide molecular design guidelines applicable to designing polymers that are more susceptible to macroscopic alignment.

The present disclosure describes how donor-acceptor conjugated polymers can be designed as amphiphiles consisting of a rigid aromatic backbone and flexible non-polar alkyl chains used to impart solubility to the resulting polymer. As illustrated herein, the amphiphilic polymers adopt a lyotropic mesophase when dissolved in a solvent that has propensity to dissolve only one end of the molecule, i.e. a selective solvent. Thus, by varying the size and flexibility of the solubilizing group while maintaining a constant conjugated backbone, the relative strength of solvent interactions between side chain and backbone can be controlled. Sufficient backbone rigidity leads to conjugated polymers that exhibit a lyotropic mesophase in a solvent selective to the non-polar alkyl chain. Chlorinated or aromatic solvents such as toluene, chlorobenzene, or chloroform are typically used to process conjugated polymers because they are moderate to good solvents for both conjugated aromatic systems and non-polar alkyl chains.[43] This is described by the Abraham solvation model for polycyclic aromatic hydrocarbons, which also shows non-polar solvents such as hexanes, decane, or other hydrocarbons have nearly no propensity to dissolve conjugated aromatic systems.[43] As a result, while non-polar solvents are considered poor solvents for conjugated polymers, they act as selective solvent towards the non-polar alkyl chain. As described herein, increasing the solubilizing strength (i.e. the size and branching) of the alkyl chains allows conjugated polymers to be fully soluble in non-polar solvents selective to the alkyl chain. Poly(3-hexylthiophene) has shown lyotropic liquid crystallinity in chlorobenzene solutions after extensive aging.[39-41] Kim et.

al. showed thiophene-phenylene alternating copolymers exhibited concentration induced planarization in solution, leading to the formation of lyotropic mesophases in some cases.[42] However, conventional methods[39-41, 42] do not obtain the surprising and unexpected result of crystalline rigid donor-acceptor copolymer structures in solution, as described herein.

A liquid crystalline mesophase is called lyotropic if formed by dissolving an amphiphilic compound (mesogen) in a suitable solvent, under appropriate conditions of concentration, temperature and pressure.

1. PCDTPT-$C_{16}$, PCDTPT-EH, PCDTPT-HD, and PCDTPT-ODD Examples

FIGS. 1(a)-1(d) illustrate a series of poly[4-(4,4-dialkyl-4H-cyclopenta[1,2-b:5,4-b0]dithiophen-2-yl)-alt-[1,2,5]-thiadiazolo[3,4-c]pyridine] (PCDTPT) donor-acceptor conjugated polymers having a rigid backbone 100 and synthesized with varying amphiphilic character (by changing the length and flexibility of the solubilizing alkyl chain 102).[44-46] The choice of solvent directly affects the formation and structure of lyotropic mesophases, and thus directly impacts the optical and electronic properties of the semiconducting polymers.

TABLE 1

Solubility of various polymers according to embodiments of the present invention.

| Solvent | PCDTPT-$C_{16}$<br>$M_n$ = 23 kDa, Đ = 2.0<br>Solubility: | PCDTPT-EH<br>$M_n$ = 19 kDa, Đ = 1.6<br>Solubility: | PCDTPT-HD<br>$M_n$ = 26 kDa, Đ = 1.8<br>Solubility: | PCDTPT-ODD<br>$M_n$ = 23 kDa, Đ = 1.8<br>Solubility: |
| --- | --- | --- | --- | --- |
| Toluene | Aggregates | Isotropic | Isotropic | Isotropic |
| Chloroform | Aggregates | Weak Lyotropic | Isotropic | Isotropic |
| Hexanes | Not Soluble | Not Soluble | Lyotropic | Lyotropic |

Polymers with larger amphiphilicity can be dissolved in solvents selective to the side chains. This allows the formation of lyotropic liquid crystalline mesophases consisting of extended polymer chains exhibiting high fidelity π-stacking. Thin films cast from lyotropic solutions show higher crystallinity and closer π-stacking. As a result of this improved crystallinity, transistors with active layers cast from lyotropic solutions exhibit a significant improvement in carrier mobility compared to those cast from isotropic solution.

As the side chain becomes larger and more bulky, polymers have increased solubility in selective non-polar solvents such as hexanes. This increased amphiphilicity allows for the expression of lyotropic liquid crystalline mesophases. Most conjugated polymers are only soluble in solvents that are mutual to the aromatic backbone and side chains such as toluene, chloroform, or chlorobenzene, as is the case for PCDTPT-$C_{16}$. As the side chain becomes larger and more bulky, PCDTPT-HD and PCDTPT-ODD become soluble in selective solvents. For a direct comparison of how amphiphilicity affects solubility, structure, optical, and electronic properties, the molecular weight and chain length distribution is kept constant around $M_n$=23 kDa and Đ=1.8. These materials were synthesized using adapted literature procedures[45] using the methods described in the methods section (section 3).

a. Solution Properties

Polymers that form lyotropic mesophases in selective solvents exhibit distinct optical signatures of chain extension and π-stacking depending on the strength and relative affinity of the solvent towards the side chain and backbone. In donor-acceptor conjugated polymer crystallites, the polymer chains become more planar and extended compared to in solution, and two packing directions are commonly observed: spacing between the alkyl chains and π-stacking.[46-53] Absorbance spectroscopy can be used to identify lyotropic mesophases, as chain planarization and π-stacking are evidenced by a red-shifted spectrum and sharp, low-energy transitions due to excitonic coupling, respectively.[54, 55] Lyotropic mesophases also exhibit birefringence, and display a thermodynamic transition upon heating through the lyotropic to isotropic transition. As such, absorbance spectroscopy, polarized optical microscopy (POM), and differential scanning calorimetry (DSC) are used to support the assignment and structure of these lyotropic mesophases. For thermal experiments, decane was used in place of hexanes because of its higher boiling point, however the solutions still show the same birefringence and optical absorbance (see Figure S4 in Appendix A of the priority application[111].

When comparing the solid state and solution absorbance spectra for PCDTPT-$C_{16}$, an identical broad and featureless peak is seen in all cases (FIGS. 2(a)-2(d)). This indicates a similar level of chain extension is occurring in solution and solid state. Dynamic light scattering (DLS) indicates aggregation (see Figure S2 in Appendix A of U.S. Provisional Patent Application No. 62/367,401), which accounts for the apparent chain extension in solution. The lack of vibronic structure in the low energy region of the spectra is evidence these aggregates are not highly ordered. In spite of its aggregation, PCDTPT-$C_{16}$ is not birefringent in any solvent (chloroform, toluene, or chlorobenzene) (FIGS. 3(a)-3(d)), and displays no thermal transition upon heating in solution (FIGS. 4(a)-4(d)). These observations all point to the absence of an ordered mesophase in PCDTPT-$C_{16}$.

FIGS. 2(a)-2(d) show the absorbance spectra of PCDTPT-EH, PCDTPT-HD, and PCDTPT-ODD thin films have two characteristic absorbances in the low energy region (700-1100 nm), analogous to previous reports, and are attributed to planar extended chain segments ($\lambda_{max}$ ~800 nm), and excitonic coupling or π-stacking between chains ($\lambda_{max}$ ~900 nm).[17, 56-58] Controlling solvent interactions is critical to forming highly crystalline films of PCDTPT-EH, PCDTPT-HD and PCDTPT-ODD. When cast from mutual solvents such as toluene or chlorobenzene, these polymers do not show absorbance characteristics of crystalline thin films.

The color difference when comparing solutions of PCDTPT-HD and PCDTPT-ODD in mutual solvents (i.e., chlorobenzene and toluene) and selective solvents (i.e. hexanes) is immediately apparent as the solution transitions from blue to green. This is seen in the absorbance spectrum as it becomes red-shifted, and exhibits a pronounced contribution from excitonic coupling (FIGS. 2(a)-2(d)). This is attributed to the polymer chains becoming planarized and extended in solution, and to the emergence of π-stacking typically found in crystalline thin films. Both polymers exhibit strong birefringent texture in selective solvents, further supporting the assignment that these are lyotropic liquid crystals (FIGS. 3(a)-3(d)). Lyotropic solutions also show a thermal transition upon heating in solution (FIGS. 4(a)-4(d)), whereas no thermal transition is observed for polymers in mutual solvents. This thermal transition coincides with an abrupt loss in birefringence, as well as a blue-shift in the optical spectra that loses its contributions from crystalline π-stacking (see Figure S4 in Appendix A of U.S. Provisional Patent Application No. 62/367,401), evidencing that the lyotropic mesophase consists of chain extended π-stacked polymers. Transmission wide angle X-ray scattering (WAXS) on these solutions supports this, as π-stacking is observed in solution which then disappears upon heating (see Figure S5 in Appendix A of the priority application[111]).

For the less soluble PCDTPT-EH, chloroform could be considered a somewhat selective solvent since it has a lower propensity to dissolve aromatic systems than aromatic solvents such as toluene or chlorobenzene.[43] The absorbance of PCDTPT-EH in a mutual solvent (chloroform) contains only a minor contribution from π-stacking, and as such exhibits much weaker birefringence. PCDTPT-EH exhibits a markedly weaker thermal transition upon heating, commensurate with its weaker birefringence and π-stacking in solution.

Combined, these results indicate that PCDTPT-EH, PCDTPT-HD, and PCDTPT-ODD form ordered lyotropic mesophases in selective solvents. In all cases the birefringent images display a threaded texture characteristic of a nematic lyotropic mesophase, expected for a mesophase consisting of a polydisperse polymer. Absorption spectroscopy, POM, and DSC indicate this mesophase consists of polymer chains extending and π-stacking in solution to reduce solvophobic interactions between hexanes and the aromatic backbone. For lyotropic solutions, the absorption red-shift may be used as a proxy to estimate chain extension in solution. In this case, it is observed that the order of chain extension in solution is as follows: PCDTPT-HD>PCDTPT-ODD>PCDTPT-EH. The observation of birefringence, absorbance due to π-stacking in solution, and thermal transitions measured via DSC are reversible upon heating and cooling, expected for liquid crystalline transitions. Differences in optical, birefringent, and thermal properties of PCDTPT-$C_{16}$ compared to the branched side chain analogues highlights the difference between disordered aggregation exhibited in poorly soluble polymers and an ordered lyotropic mesophase exhibited by an amphiphile in a selective solvent.

b. Solid State Properties

The inventors expect thin films of PCDTPT cast from a lyotropic solution to possess higher crystallinity as compared to those cast from an isotropic solution. The solid state packing of PCDTPT-$C_{16}$ has been previously studied, and shown to be a mostly amorphous polymer exhibiting reflections at low q (2-6 $A^{-1}$) corresponding to alkyl spacing (200) and at high q (1.2-1.8 $A^{-1}$) corresponding to π-stacking (010).[1,2,44,45,59] Qualitatively, similar behavior is seen for all PCDTPT copolymers studied herein, however the alkyl spacing peak shifts to larger domain spacing as the alkyl chain becomes larger and bulkier (q=0.61 for PCDTPT-EH to q=0.42 for PCDTPT-ODD). PCDTPT-EH, PCDTPT-HD, and PCDTPT-ODD exhibit improved crystallinity when cast from lyotropic solutions, indicating nascent crystallinity in solution is transferred to the solid state (FIGS. 5(a)-5(p)). In films cast from lyotropic solution, reflections corresponding to both the alkyl and π-stacking directions show heightened intensity, resolution, and crystallite size (determined using the Scherrer equation). In addition, the amorphous halo becomes less prominent and secondary (0n0) and (n00) reflections and off-axis peaks and appear, indicating increased crystalline texture. In the case of PCDTPT-ODD, crystalline correlation length (CCL) improves from 5.7 nm to 31 nm in the alkyl spacing direction (100), and from 2.5 to 9.0 nm in the direction of π-stacking (010) (Table 1). Similar behavior is seen for PCDTPT-EH and PCDTPT-HD. Additionally, π-stacking occurs with closer spacing in all lyotropic conjugated polymer films. The significant improvement of crystallinity in the π-stacking direction is particularly important in the context of carrier mobility. Intermolecular charge transport is especially reliant on high fidelity π-stacking in thin films, however this is typically the least ordered diffraction peak in semicrystalline conjugated polymers (highest degree of paracrystallinity).[54,60] Indeed, strongly crystalline π-stacking is rare in conjugated polymers, but especially in the donor-acceptor conjugated polymers, which typically are amorphous. By introducing large, branched alkyl chains, PCDTPT copolymers can be dissolved in selective solvents, allowing a lyotropic mesophase to form. This not only increases crystallinity in both the direction of alkyl spacing and π-stacking, it also reduces the π-stacking distance compared to polymer films cast from an isotropic solution. This is a counterintuitive result, as introducing large or branched side chains typically results in a more amorphous polymer. In this case, the amphiphilic nature of donor-acceptor copolymers with large and branched side chains can be harnessed, and proves to be an effective method to strongly increase crystallinity by forming lyotropic solutions.

TABLE 2

Full width half maximum (FWHM) and crystalline correlation lengths (CCL) for thin films of PCDTPT copolymers cast as isotropic and lyotropic solutions

| Polymer | Reflection | Peak ($A^{-1}$) | FWHM ($A^{-1}$) | CCL (nm)[b] |
|---|---|---|---|---|
| PCDTPT-$C_{16}$[a] | — | — | — | — |
| PCDTPT-EH | (200) | 0.572 | 0.12 | 5.3 |
| (toluene, isotropic)[a] | (010) | 1.52 | 0.16 | 3.9 |
| PCDTPT-EH | (200) | 0.604 | 0.13 | 4.8 |
| (chloroform, lyotropic) | (010) | 1.67 | 0.11 | 5.7 |
| PCDTPT-HD | (200) | 0.415 | 0.24 | 2.6 |
| (chloroform, isotropic) | (010) | 1.45 | 0.25 | 2.5 |
| PCDTPT-HD | (200) | 0.567 | 0.04 | 16 |
| (hexanes, lyotropic) | (010) | 1.66 | 0.11 | 5.7 |
| PCDTPT-ODD | (200) | 0.418 | 0.11 | 5.7 |
| (chloroform, isotropic) | (010) | 1.43 | 0.25 | 2.5 |
| PCDTPT-ODD | (200) | 0.404 | 0.02 | 31 |
| (hexanes, lyotropic) | (010) | 1.59 | 0.07 | 9.0 |

[a]No reflections prominent enough to calculate CCL.
[b]Calculated using the Scherrer equation;
CCL = 2π/FWHM.

As illustrated herein, the effect that forming LC mesophases has on solid state structure and solution structure is well established.

c. Electronic Properties

Improved thin film ordering and crystallinity in the π-stacking direction generally result in improved charge carrier mobility, thus the inventors expect transistors fabricated using a lyotropic solution to exhibit higher mobility values than those fabricated from isotropic solution. Hole mobility was measured using a top gate bottom contact geometry with a polymerized ionic liquid (PIL) dielectric containing a pendant imidazolium:bistrifluorosulfonimide ionic liquid moiety (see Figure S8 in Appendix A of the priority application[111]).[62] PILs have recently attracted attention for use as dielectrics due to their tunable mechanical properties and high specific capacitance, which allows device operation at low voltages.[61-63] The transistor performance of polymers that could be cast from both lyotropic and isotropic solutions are compared. Thin film transistors (TFT) fabricated using PCDTPT-EH, PCDTPT-HD, and PCDTPT-ODD all showed a threshold voltage of around −1.5 to −1.7 V and only operated in the linear (non-saturation) regime. Linear mobility was calculated from the slope of the I-V curve after the devices had turned on. Table 2 shows all transistors tested show a significant increase in mobility when the polymers (PCDTPT-EH, PCDTPT-HD, and PCDTPT-ODD) were cast from lyotropic solution, as compared to when the polymers were cast from an isotropic solution. In the case of transistors fabricated using lyotropic solutions, there is no increase in mobility upon annealing. This indicates that a favorable thin film morphology is achieved upon casting resulting from the nascent crystallinity in solution (see Table S1 in Appendix A of the priority application[111]). The best performing polymer, PCDTPT-HD, exhibits a mobility of $\mu=0.12$ cm$^2$V$^{-1}$s$^{-1}$ when cast as from lyotropic solution, compared to $\mu=0.044$ cm$^2$V$^{-1}$s$^{-1}$ when cast from an isotropic solution. Transistors were also fabricated using high molecular weight PCDTPT-HD (M$_n$=52.3 kDa, $Đ$=1.33) to demonstrate translation to other systems. These transistors showed similar threshold voltages (−1.7 V), transfer, and output characteristics as those cast from ~20 kDa polymers (FIG. 6). Higher molecular weight polymers resulted in higher overall mobilities: $\mu=0.26$ cm$^2$V$^{-1}$s$^{-1}$ and $\mu=0.61$ cm$^2$V$^{-1}$s$^{-1}$ were observed for transistors fabricated from isotropic and lyotropic solutions of PCDTPT-HD (52 kDa), respectively.

The transistor characteristics of PCDTPT-C$_{16}$ could not be evaluated using a PIL dielectric, possibly due to electrochemical doping or other interfacial effects, however it has been previously characterized with a comparable maximum mobility of 0.4 cm$^2$V$^{-1}$s$^{-1}$.[45]

Transistors were also fabricated using SiO$_2$ dielectrics in a bottom gate-top contact geometry. In this case, the same trends in mobility were observed for PCDTPT-EH, PCDTPT-HD, and PCDTPT-ODD: transistors fabricated using lyotropic solutions showed higher mobilities than those fabricated using isotropic solutions (see Table S1 in Appendix A of the priority application[111]). Together, these results indicate that lyotropic solutions of conjugated polymers are advantageous for device performance. Thin films cast from lyotropic solutions exhibit high crystalline order and closer π-stacking brought upon by solvent-polymer interactions. Ultimately this results in more facile charge transport and improved transistor performance. Recent studies have shown that mobilities in excess of 30 cm$^2$V$^{-1}$s$^{-1}$ can be achieved when similar donor-acceptor conjugated polymers are macroscopically aligned using nano-templated substrates.[1,2] Similar results can be achieved using facile director templating and propagation typical of liquid crystalline mesophases. Thus, as illustrated herein, the concept of processing highly amphiphilic conjugated polymers as lyotropic solutions is a general method to achieve highly ordered polymer films using equilibrium processing techniques.

TABLE 3

Summary of transistor performance for PCDTPT copolymers cast from isotropic (i) and lyotropic (l) solutions. All devices were annealed for 10 minutes at 50° C. No improvement was seen upon annealing at any temperature. Mobility was averaged over three devices.

| Polymer | Solvent | mobility (cm$^2$V$^{-1}$s$^{-1}$) | V$_{th}$ (V) |
|---|---|---|---|
| PCDTPT-EH | Toluene (isotropic) | 0.021 | −1.55 |
|  | Chloroform (lyotropic) | 0.033 | −1.60 |
| PCDTPT-HD (26 kDa) | Chloroform (isotropic) | 0.044 | −1.60 |
|  | Hexanes (lyotropic) | 0.12 | −1.55 |
| PCDTPT-ODD | Chloroform (isotropic) | 0.0061 | −1.75 |
|  | Hexanes (lyotropic) | 0.030 | −1.75 |
| PCDTPT-HD (52 kDa) | Chloroform (isotropic) | 0.26 | −1.68 |
|  | Hexanes (lyotropic) | 0.61 | −1.71 |

Illustrative embodiments of the present invention show that crystalline morphology and transistor performance can be improved using simple processing techniques. This approach of rational side chain design bridges the gap from solution structure to solid state structure, and is a promising and general approach to allow the expression of lyotropic mesophases in rigid conjugated polymers.

2. PCDTPT-ene Copolymer Examples

As described herein, the amhiphilic, rigid donor-acceptor conjugated polymers in selective solvents form lyotropic mesophases consisting of extended polymer chains exhibiting close and ordered π-stacking perpendicular to the direction of chain extension in solution.

Building on this result, the present disclosure further demonstrates using side chain engineering to control the intermolecular interactions of lyotropic liquid crystalline conjugated polymers and thereby vary steric repulsion between side chains and attractive aromatic interactions between the conjugated backbones. More specifically, steric repulsion is controlled by varying the size of side chain branching, and attractive aromatic backbone interactions are controlled by synthesizing polymers in which the chains are forced to extend either parallel or perpendicular to the π-stacking direction. In all cases, the amphiphilic conjugated polymers are used in selective non-polar solvents so that interaction strength can be studied in crystalline solids and in crystalline lyotropic solutions. The effects these structural changes have on intermolecular backbone attraction are estimated using dynamic scanning calorimetry (DSC) and grazing incidence wide-angle x-ray scattering (GIWAXS). For liquid crystals, the Maier-Saupe interaction parameter ($\mu$) describes how the entropic cost of short-range orientational order balances enthalpic gains due to anisotropic intermolecular attraction at the isotropic-nematic transition, and is used to compare intermolecular interactions in rod-like polymers.[85-91]

Figure 7:
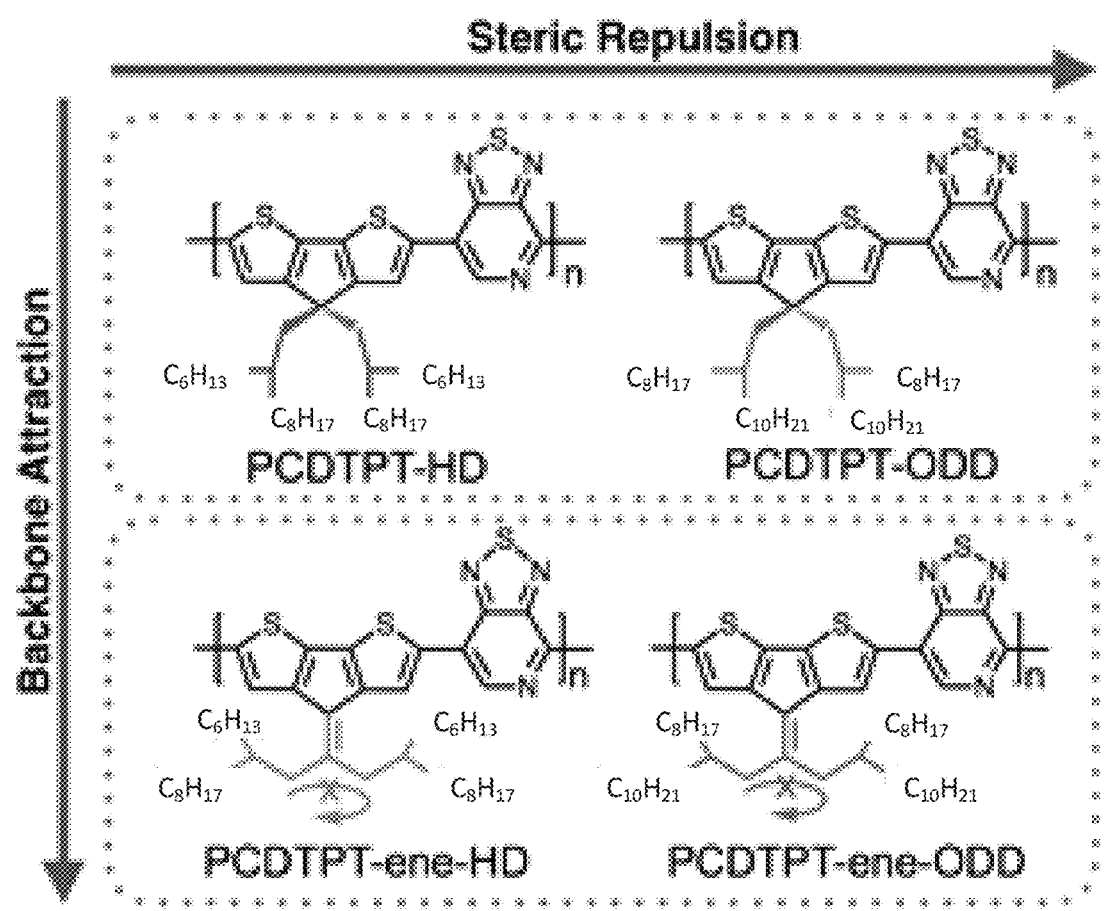
FIG. 7. Structure and shorthand name of lyotropic conjugated polymers used in this study. Polymers were designed to have variable intermolecular interactions in the lyotropic mesophase. Larger, more bulky side chains increase steric repulsion, while rotating the side chain orientation allows for closer π-stacking, increasing intermolecular aromatic attractions.
Figure 10A:
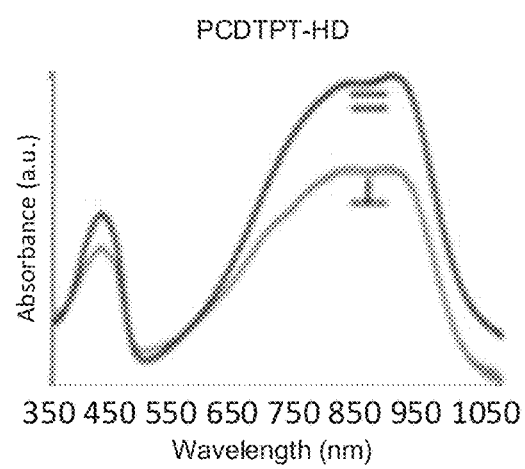
Figure 10B:
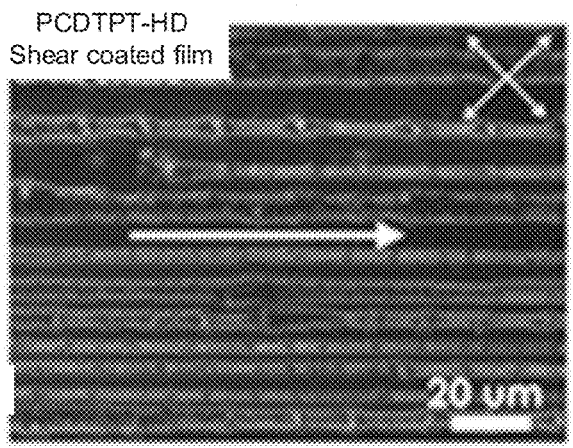
Figure 10C:
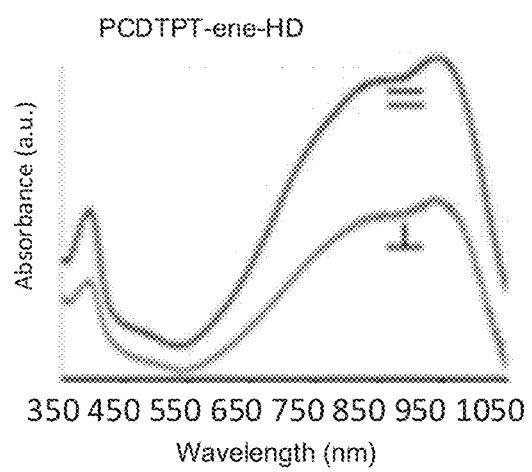
Figure 10D:
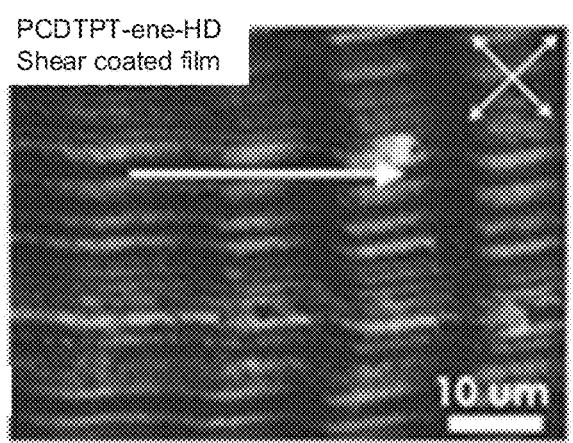
Figure 10I:
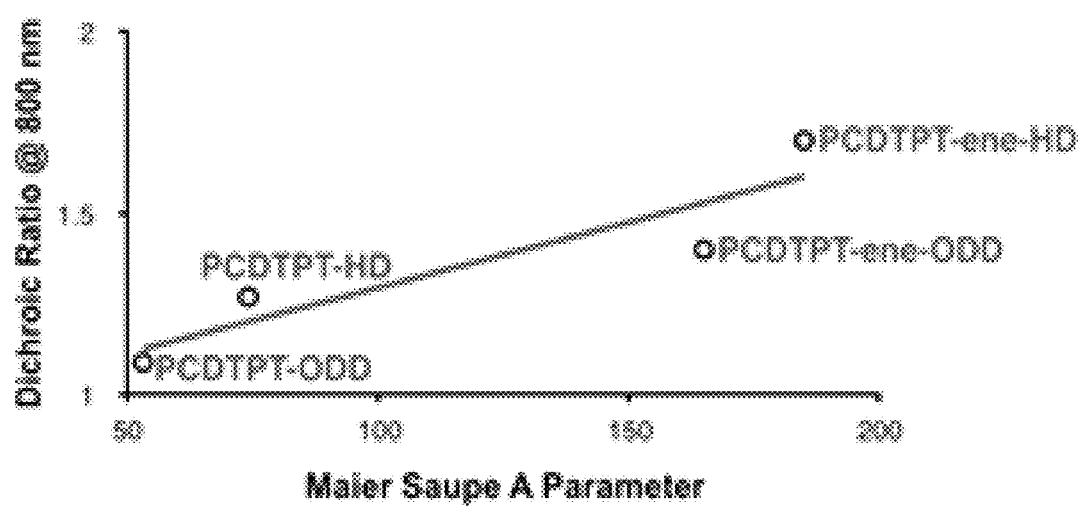

FIG. 7 illustrates four amphiphilic poly[4-(4,4-dialkyl-4H-cyclopenta[1,2-b:5,4-b']dithiophen-2-yl)-alt-[1,2,5]-thiadiazolo[3,4-c]pyridine] (PCDTPT) based conjugated polymers fabricated using side chains characterized by varying steric repulsion and backbone attraction: PCDTPT-HD, PCDTPT-ODD, PCDTPT-ene-HD, and PCDTPT-ene-ODD. Steric repulsion is varied by using either 2-hexyldecyl (HD) or 2-octyldodecyl (ODD) side chains. Attractive aromatic intermolecular interaction (π-stacking) is varied by changing side chain orientation. In PCDTPT-HD and PCDTPT-ODD, the side chains are directed perpendicular to the direction of π-stacking, disrupting favourable intermolecular aromatic interactions. In PCDTPT-ene-HD and PCDTPT-ene-ODD, the side chains are directed parallel to the polymer backbone, allowing for closer π-stacking and stronger intermolecular aromatic interactions. This series of polymers gives direct insight into how steric repulsion and backbone attraction control the structure and interaction parameters of lyotropic liquid crystalline polymers. To allow a direct comparison, polymers with a similar molecular weight distributions were used for all microscopy, alignment, spectroscopy and transistor measurements ($M_n$ ~25 kDa, $Đ$ ~2). These samples were fractionated to obtain different molecular weight polymers used to measure Maier-Saupe interaction parameters. PCDTPT-ene-HD and PCDTPT-ene-ODD were synthesized using adapted literature procedures[92] and as described in the methods section herein.

a. Solution Properties

Lyotropic conjugated polymers exhibit birefringence in solution, and due to the chain extension and highly crystalline π-stacking solution, the optical absorbance profile in solution is nearly identical to that of a semicrystalline thin film[94-97] as observed for the lyotropic solutions of PCDTPT-HD and PCDTPT-ODD described in section 1.

Since PCDTPT-ene-HD and PCDTPT-ene-ODD are structurally similar to PCDTPT-HD and PCDTPT-ODD, respectively, PCDTPT-ene-HD and PCDTPT-ene-ODD display the same solubility and amphiphilicity as PCDTPT-HD and PCDTPT-ODD, respectively. Specifically, when dissolved in a non-polar solvent selective to dissolving the side chains rather than the conjugated backbone (hexanes), PCDTPT-ene copolymers exhibit the same absorption onset, and a sharp, low energy transition as described for PCDTPT-HD and PCDTPT-ODD. This is evidence that crystalline π-stacking is similar for PCDTPT-ene copolymers, and that it occurs in both solution and thin film (FIGS. 8(a)-8(f)).

While the exact mesophase assignment is difficult in the case of polydisperse polymers, PCDTPT-ene-HD and PCDTPT-ene-ODD do however display the threaded birefringent texture typical of nematic lyotropic liquid crystalline mesophases which is often seen in such materials (and which is identical to the structure and formation of lyotropic liquid crystalline mesophases in donor-acceptor conjugated polymers described in section 1).

Confirming the PCDTPT-ene-HD, PCDTPT-ene-ODD, PCDTPT-HD, and PCDTPT-ODD materials all exhibit lyotropic liquid crystalline mesophases in hexanes allows comparison of the effect of structure on intermolecular interactions.

b. X-Ray Scattering and DSC

Side chains oriented along the polymer backbone as in PCDTPT-ene copolymers exhibit closer π-stacking, resulting in stronger intermolecular attraction in both crystalline solution and solid state. This is observed using wide angle X-ray scattering: qualitatively PCDTPT and PCDTPT-ene copolymers exhibit a similar packing motif, showing highly crystalline reflections due to alkyl spacing between 0.2 to 0.6 $A^{-1}$ and π-stacking from 1.5-1.7 $A^{-1}$.[97,98] The effect of changing the side chain orientation increases the distance of the alkyl chain spacing, but most strikingly significantly decreases the π-stacking distance from 3.78 A to 3.69 A in PCDTPT-HD/PCDTPT-ene-HD and from 3.95 A to 3.72 A in PCDTPT-ODD/PCDTPT-ene-ODD. Shorter π-stacking distances increase favourable aromatic interactions between polymer backbones, thus strengthening intermolecular interactions. This is supported using DSC, whereby PCDTPT-HD and PCDTPT-ODD melt at 220° C. and 170° C., respectively, whereas neither PCDTPT-ene-HD nor PCDTPT-ene-ODD show a melting temperature below 300° C. in spite of their similar structure (see the Supporting Information). In lyotropic mesophases, liquid crystallinity emerges from solvent interactions, thus the increased intermolecular interactions measured in the solid state using GIWAXS and DSC are also present in solution.

c. Maier-Saupe

PCDTPT-ene copolymers with closer π-stacking and stronger backbone interactions also exhibit stronger Maier-Saupe interaction parameters (FIGS. 9(a)-9(d)). These lyotropic mesophases consist of extended polymer chains partaking in crystalline π-stacking in solution, and form elongated crystallites typical of nematic mesophases due to the highly anisotropic nature of the π-π interactions on rigid conjugated polymers. At the transition from isotropic to nematic solution, Maier-Saupe theory describes how the entropic loss due to short range orientational ordering is countered by anisotropic attractive interactions.[84-90] These interactions are analogous to the Flory-Huggins interaction parameter, having the form $\mu N \sim A/T + B$ where A is the interaction parameter, T is the nematic-isotropic clearing temperature, and B captures disagreements between the small molecule and polymeric forms of the Maier-Saupe interaction parameters, possibly due to entropic effects.[85] The Maier-Saupe parameter can be quantified in polymeric systems by measuring the nematic-isotropic clearing temperature and the molecular weight (N). Plotting $N^{-1}$ versus Temperature$^{-1}$ (K) results in a line where the slope is the Maier-Saupe interaction parameter A.[85, 86] The inventors attribute the anisotropic enthalpic gain to intermolecular π-stacking in solution, behavior line which can be observed in lyotropic conjugated polymers. In this case, the anisotropic interactions used to describe Maier-Saupe theory are reminiscent of the anisotropic nature of π-π interactions in conjugated polymers. Consequently, interaction strength and π-stacking distance can be correlated with the Maier-Saupe interaction parameter.

d. Alignment

Stronger intermolecular interactions and Maier-Saupe interaction strength result in a higher degree of macroscopic alignment when these solutions are cast from lyotropic solution using equilibrium coating methods such as blade coating. Thin films of each polymer were deposited from lyotropic solution using a shallow angle blade coating procedure called shear coating, previously described by Bao and co-workers[100-102]. Since these are liquid crystalline mesophases, alignment is facile and propagates throughout the film, rather than existing solely at the alignment layer. This effect can clearly be seen in the POM images of a shear aligned film of PCDTPT-HD on glass: both the top and bottoms of the film show distinctly aligned liquid crystalline textures. Similar aligned liquid crystalline textures are observed for all lyotropic PCDTPT and PCDTPT-ene copolymers, and the effect intermolecular interactions have on the degree of macroscopic alignment during coating can be quantified by comparing the resulting absorbance dichroism. FIGS. 10(a)-10(i) show a correlation between intermolecular interactions, interaction parameter, and dichroism. More strongly interacting PCDTPT-ene copolymers exhibit a higher degree of macroscopic alignment than their respective PCDTPT analogues. This can be attributed to the stronger π-π interactions resulting from changing the side chain orientation, and demonstrates a new molecular design principle for polymer electronics: stronger intermolecular interactions are favourable when macroscopic alignment is desired.

e. Transistor Devices

Macroscopically aligned conjugated polymers provide direct pathways for charge carriers in organic electronic devices, and exhibit higher mobilities depending on their degree of alignment. Transistors comprising each polymer deposited from lyotropic solution were fabricated using modified blade coating, a bottom-gate bottom contact device architecture, and an $SiO_2$ dielectric. In transistors comprising PCDTPT-HD copolymers prepared using modified blade coating parallel to the source-drain direction, the mobility of PCDTPT-HD ($\mu_h$=0.00552 $cm^2V^{-1}s^{-1}$) is enhanced by a factor of ~3 as compared to the mobility of PCDTPT-HD ($\mu_h$=0.00197 $cm^2V^{-1}s^{-1}$) in a transistor where the PCDTPT-HD is prepared using spin coating ($\mu_h$=0.00197 $cm^2V^{-1}s^{-1}$). PCDTPT-ODD, on the other hand, exhibits weaker interactions and much weaker alignment as measured by the dichroism, and thus does not exhibit a notable change in mobility when comparing spin coated ($\mu_h$=0.00017 $cm^2V^{-1}s^{-1}$) and shear coated ($\mu_h$=0.00019 $cm^2V^{-1}s^{-1}$) devices. While strongly interacting PCDTPT-ene copolymers exhibit improved alignment, transistors comprising PCDTPT-ene copolymers could not be evaluated, possibly due to the formation of localized polarons on the fulvene subunit. As PCDTPT copolymers are doped, they exhibit classic optical properties of doped conjugated polymers: a low energy absorbance emerges due to delocalized polarons.[104-106] Upon doping PCDTPT-ene copolymers, a significant high energy absorbance emerges due to localized polarons.[35, 36] Formation of structurally localized charge carriers in PCDTPT-ene copolymers could explain their poor mobility.[75,105, 108]

3. Methods for Fabrication of the Devices and Compositions Characterized in FIGS. 1-9

Materials 4H-cyclopenta[1,2-b:5,4-b']dithiophene was synthesized from 4H-cyclopenta[1,2-b:5,4-b']dithiophen-4-one (purchased from Ark Pharm Inc.) according to literature procedures.[63] 4,7-dibromo-[1,2,5]thiadiazolo[3,4-c]pyridine was synthesized from pyridine-3,4-diamine according to literature procedures.[65] 2-ethylhexylbromide, 2-hexyldecylbromide, and 2-octyldodecylbromide were prepared from 2-ethylhexanol, 2-hexyldecanol, and 2-octyldodecanol, respectively, according to literature procedures.[66] Zinc (II) Chloride was dried by heating to 250° C. under nitrogen atmosphere and stored in a glove box before use. n-Butyllithium was titrated with salicylaldehyde-phenylhydrazone immediately before use.[67] All other reagents were purchased from Sigma Aldrich and used as received. All solvents were purchased from Sigma Aldrich, dried, degassed, and stored over molecular sieves under nitrogen atmosphere prior to use. PCDTPT-$C_{16}$ was synthesized from 4H-cyclopenta[1, 2-b:5,4-b']dithiophene and 4,7-dibromo-[1,2,5]thiadiazolo [3,4-c]pyridine using literature procedures.[44] PCDTPT-EH, PCDTPT-HD, and PCDTPT-ODD were synthesized using analogous adapted literature procedures,[45] described in detail herein.

a. Synthesis of Alkylated Cyclopentadithiophenes

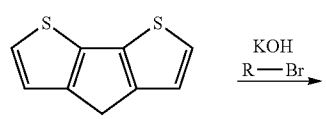

-continued

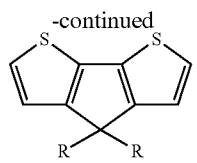

1a) R = 2-ethylhexyl
1b) R = 2-hexyldecyl
1c) R = 2-octyldodecyl 4,4-Di(2-ethylhexyl)-4H-cyclopenta[2,1-b:3,4-b] dithiophene To a 50 mL roundbottom flask containing 4H-Cyclopenta [2,1-b:3,4-b(]dithiophene (0.479 g, 2.70 mmol), potassium hydroxide (0.581 g, 10.35 mmol), potassium iodide (0.016 g, 0.1 mmol) was added 25 mL DMSO. The reaction vessel was sealed and stirred at 20° C. for 30 minutes under nitrogen atmosphere. 2-ethylhexylbromide (1.57 g, 8.1 mmol) was added all at once via syringe. The reaction was stirred at 20° C. under nitrogen atmosphere for 12 hours, then poured into 200 mL water. The aqueous layer was washed with 75 mL portions of hexanes three times. The organic portions were combined and washed with 200 mL water twice, then saturated aqueous sodium chloride. The organic layer was dried over magnesium sulfate, filtered, concentrated, and purified via column chromatography on silica gel using 100% hexanes as eluant to yield 1.33 g of 4,4-Di(2-ethylhexyl)-4H-cyclopenta[2,1-b:3,4-b]dithiophene as a pale yellow oil (1.75 mmol, 75%). Spectroscopy matched previously reported data.

4,4-Di(2-hexyldecyl)-4H-cyclopenta[2,1-b:3,4-b] dithiophene

To a 50 mL roundbottom flask containing 4H-Cyclopenta [2,1-b:3,4-b(]dithiophene (0.400 g, 2.30 mmol), potassium hydroxide (0.640 g, 11.50 mmol), potassium iodide (0.016 g, 0.1 mmol) was added 25 mL DMSO. The reaction vessel was sealed and stirred at 20° C. for 30 minutes under nitrogen atmosphere. 2-octyldodecylbromide (2.10 g, 6.90 mmol) was added all at once via syringe. The reaction was stirred at 20° C. under nitrogen atmosphere for 12 hours, then poured into 200 mL water. The aqueous layer was washed with 75 mL portions of hexanes three times. The organic portions were combined and washed with 200 mL water twice, then saturated aqueous sodium chloride. The organic layer was dried over magnesium sulfate, filtered, concentrated, and purified via column chromatography on silica gel using 100% hexanes as eluant to yield 0.850 g of 4,4-Di(2-hexyldecyl)-4H-cyclopenta[2,1-b:3,4-b]dithiophene as a pale yellow oil (1.15 mmol, 50%). $^1$H-NMR (CDCl$_3$, 600 MHz): δ 7.10 (d, J=6 Hz, 2H), δ 6.91 (d, J=6 Hz, 2H), δ 1.88 (d, J=6 Hz, 4H), δ 1.45-1.1 (m, 48H), δ 0.80 (m, 12H) $^{13}$C-NMR (CDCl$_3$, 600 MHz) δ 157.53, 136.79, 123.87, 122.29, 53.24, 43.85, 39.63, 36.43, 35.02, 33.50, 32.45, 31.89, 31.82, 29.70, 29.54, 29.37, 29.30, 26.31, 22.67, 22.64, 14.10, 14.08. HRMS-ESI: calc. 626.4899, found 626.4919, Δ=−3.2 ppm.

4,4-Di(2-octyldodecyl)-4H-cyclopenta[2,1-b:3,4-b] dithiophene

To a 50 mL roundbottom flask containing 4H-Cyclopenta [2,1-b:3,4-b(]dithiophene (0.328 g, 1.86 mmol), potassium hydroxide (0.520 g, 9.31 mmol), potassium iodide (0.016 g, 0.1 mmol) was added 20 mL DMSO. The reaction vessel was sealed and stirred at 20° C. for 30 minutes under nitrogen atmosphere. 2-octyldodecylbromide (1.68 g, 4.65 mmol) was added all at once via syringe. The reaction was stirred at 20° C. under nitrogen atmosphere for 12 hours, then poured into 200 mL water. The aqueous layer was washed with 75 mL portions of hexanes three times. The organic portions were combined and washed with 200 mL water twice, then saturated aqueous sodium chloride. The organic layer was dried over magnesium sulfate, filtered, concentrated, and purified via column chromatography on silica gel using 100% hexanes as eluant to yield 0.650 g of 4,4-Di(2-octyldodecyl)-4H-cyclopenta[2,1-b:3,4-b]dithiophene as a pale yellow oil (1.04 mmol, 60%). $^1$H-NMR (CDCl$_3$, 600 MHz): δ 7.08 (d, J=6 Hz, 2H), δ 6.89 (d, J=6 Hz, 2H), δ 1.86 (d, J=6 Hz, 4H), δ 1.4-1.1 (m, 66H), δ 0.80 (m, 12H) $^{13}$C-NMR (CDCl$_3$, 600 MHz) δ 157.53, 136.79, 123.86, 122.30, 53.25, 43.84, 36.50, 35.01, 32.62, 31.89, 29.70, 29.68, 29.64, 29.62, 29.55, 29.44, 29.35, 27.82, 22.66, 14.10. HRMS-ESI: calc. 738.6161, found 738.6171 Δ=−1.4 ppm.

b. Synthesis of Cyclopentadithiphene-Pyridylthiadiazole Units

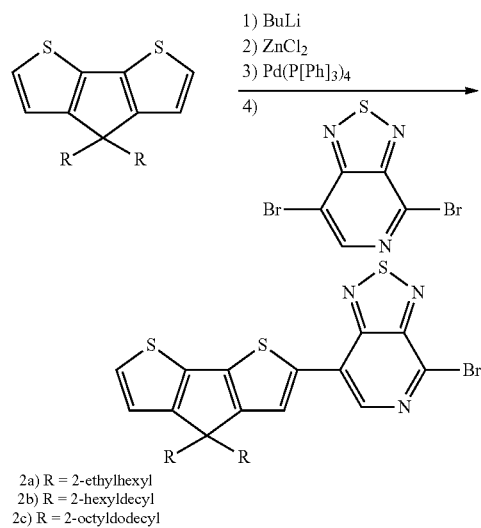

2a) R = 2-ethylhexyl
2b) R = 2-hexyldecyl
2c) R = 2-octyldodecyl

7-Bromo-4-(4,4-di(2-ethylhexyl)-4H-cyclopenta[1,2-b:5,4-b']dithiophen-2-yl)-[1,2,5]thiad iazolo[3,4-c]pyridine A flame dried 25 mL schlenk flask is charged with 4,4-di(2-ethylhexyl)-4H-cyclopenta[2,1-b:3,4-b]dithiophene (0.7900 g, 1.97 mmol), placed under vacuum and refilled with nitrogen three times. 15 mL dry, degassed THF is added, and the solution is cooled to −78° C. Freshly titrated n-Butyllithium (1.22 mL, 1.95 mmol) was added dropwise via syringe and the solution was stirred for 20 minutes at −78° C. A 0.2M solution of zinc(II) chloride (0.277 g, 2.03 mmol) in dry, degassed THF was added to the reaction flask at −78° C. and was stirred for 20 minutes before warming to room temperature. A separate schlenk flask is charged with palladium(0)tetrakistriphenylphosphine (23 mg, 0.020 mmol) and 4,7-dibromo-[1,2,5]thiadiazolo[3,4-c]pyridine (0.575 g, 1.97 mmol), and dissolved in 4 mL dry, degassed THF. The solution containing catalyst was then added all at once to the reaction flask, and stirred for 8 hours at room temperature. The reaction was then concentrated under vacuum and purified using column chromatography (gradient 20% chloroform 80% hexanes to 50% chloroform 50% hexanes) to yield 7-Bromo-4-(4,4-di(2-ethylhexyl)-4H-cyclopenta[1,2-b:5,4-b']dithiophen-2-yl)-[1,2,5]thiadiazolo[3,4-c]pyridine as a purple oil (0.851 g, 71%). $^1$H-NMR (CDCl$_3$, 600 MHz): δ 8.59 (m, 2H), δ 7.32 (d, J=3 Hz, 1H), δ 7.00 (d, J=3 Hz, 1H), δ 1.97 (m, 4H), δ 1.1-0.8 (m, 18H), δ 0.76 (m, 6H), δ 0.60 (m, 6H) $^{13}$C-NMR (CDCl$_3$, 600 MHz) δ 160.42, 159.53, 156.34, 148.11, 147.90, 145.94, 144.07, 136.73, 128.22, 127.49, 122.49, 106.47, 53.85, 43.26, 43.22, 43.09, 43.05, 35.22, 35.19, 34.17, 28.61, 28.46, 27.34, 27.33, 22.73, 14.03, 13.97, 10.74, 10.58. HRMS-ESI: calc. 615.1417, found 615.1411 Δ=1.0 ppm.

7-Bromo-4-(4,4-di(2-hexyldecyl)-4H-cyclopenta[1,2-b:5,4-b']dithiophen-2-yl)-[1,2,5]thiad iazolo[3,4-c]pyridine A flame dried 25 mL schlenk flask is charged with 4,4-di(2-hexyldecyl)-4H-cyclopenta[2,1-b:3,4-b]dithiophene (0.5595 g, 0.897 mmol), placed under vacuum and refilled with nitrogen three times. 8 mL dry, degassed THF is added, and the solution is cooled to −78° C. Freshly titrated n-Butyllithium (0.62 mL, 0.90 mmol) was added dropwise via syringe and the solution was stirred for 20 minutes at −78° C. A 0.2M solution of zinc(II) chloride (0.128 g, 0.940 mmol) in dry, degassed THF was added to the reaction flask at −78° C. and was stirred for 20 minutes before warming to room temperature. A separate schlenk flask is charged with palladium(0)tetrakistriphenylphosphine (57 mg, 0.049 mmol) and 4,7-dibromo-[1,2,5]thiadiazolo[3,4-c]pyridine (0.2613 g, 0.895 mmol), and dissolved in 4 mL dry, degassed THF. The solution containing catalyst was then added all at once to the reaction flask, and stirred for 8 hours at room temperature. The reaction was then concentrated under vacuum and purified using column chromatography (gradient 20% chloroform 80% hexanes to 50% chloroform 50% hexanes) to yield 7-Bromo-4-(4,4-di(2-hexyldecyl)-4H-cyclopenta[1,2-b:5,4-b']dithiophen-2-yl)-[1,2,5]thiadiazolo[3,4-c]pyridine as a purple oil (0.407 g, 54%). $^1$H-NMR (CDCl$_3$, 600 MHz): δ 8.61 (s, 1H), δ 8.59 (s, 1H), δ 7.31 (d, J=3 Hz, 1H), δ 6.99 (d, J=3 Hz, 1H), δ 1.97 (m, 4H), δ 1.1-0.8 (m, 56H), δ 0.60 (m, 6H) $^{13}$C-NMR (CDCl$_3$, 600 MHz) δ 160.38, 159.49, 156.34, 148.04, 147.86, 145.99, 144.20, 136.80, 128.30, 127.47, 122.55, 106.37, 53.93, 43.68, 35.19, 34.88, 34.02, 32.24, 32.01, 31.87, 31.81, 31.79, 31.76, 29.67, 29.60, 29.53, 29.45, 29.33, 29.29, 22.65, 22.61, 22.58, 14.10, 14.08, 14.04, 13.87. HRMS-ESI: calc. 839.3900, found 839.3915 Δ=−1.8 ppm.

7-Bromo-4-(4,4-di(2-octyldodecyl)-4H-cyclopenta[1,2-b:5,4-b']dithiophen-2-yl)-[1,2,5]thiad iazolo[3,4-c]pyridine A flame dried 25 mL schlenk flask is charged with 4,4-di(2-ethylhexyl)-4H-cyclopenta[2,1-b:3,4-b]dithiophene (0.6404 g, 0.868 mmol), placed under vacuum and refilled with nitrogen three times. 8 mL dry, degassed THF is added, and the solution is cooled to −78° C. Freshly titrated n-Butyllithium (0.60 mL, 0.87 mmol) was added dropwise via syringe and the solution was stirred for 20 minutes at −78° C. A 0.2M solution of zinc(II) chloride (0.1243 g, 0.912 mmol) in dry, degassed THF was added to the reaction flask at −78° C. and was stirred for 20 minutes before warming to room temperature. A separate schlenk flask is charged with palladium(0)tetrakistriphenylphosphine (53 mg, 0.05 mmol) and 4,7-dibromo-[1,2,5]thiadiazolo[3,4-c]pyridine (0.2535 g, 0.868 mmol), and dissolved in 4 mL dry, degassed THF. The solution containing catalyst was then added all at once to the reaction flask, and stirred for 8 hours at room temperature. The reaction was then concentrated under vacuum and purified using column chromatography (gradient 20% chloroform 80% hexanes to 50% chloroform 50% hexanes) to yield 7-Bromo-4-(4,4-di(2-ethylhexyl)-4H-cyclopenta[1,2-b:5,4-b']dithiophen-2-yl)-[1,2,5]thiadiazolo[3,4-c]pyridine as a purple oil (0.480 g, 58%). $^1$H-NMR (CDCl$_3$, 600 MHz): δ 8.62 (s, 1H), δ 8.59 (s, 1H), δ 7.32 (d, J=3 Hz, 1H), δ 7.00 (d, J=3 Hz, 1H), δ 1.97 (m, 4H), δ 1.1-0.8 (m, 72H), δ 0.60 (m, 6H) $^{13}$C-NMR (CDCl$_3$, 600 MHz) δ 160.77, 159.85, 156.69, 148.29, 148.29, 146.21, 144.79, 137.16, 128.71, 127.87, 122.89, 106.70, 54.27, 44.01, 35.79, 35.68, 34.02, 32.24, 32.21, 32.10, 32.01, 29.99, 29.97, 29.94, 29.86, 29.67, 29.63, 29.62, 27.05, 26.89, 22.99, 14.43, 14.37. LRMS-ESI: calc. 951.52, found 951.47.

c. Synthesis of Monomer Units

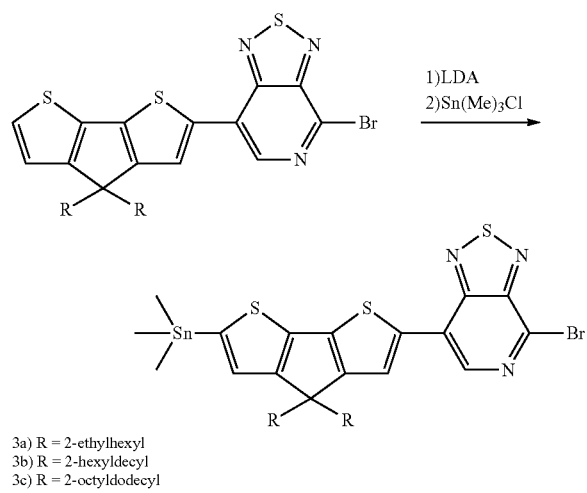

3a) R = 2-ethylhexyl
3b) R = 2-hexyldecyl
3c) R = 2-octyldodecyl

7-Bromo-4-(4,4-(2-ethylhexyl)-6-(trimethylstannyl)-4H-cyclopenta[1,2-b:5,4-b']dithioph en-2-yl)-[1,2,5]thiadiazolo[3,4-c]pyridine A flame dried 10 mL schlenk flask is charged with 7-Bromo-4-(4,4-di(2-ethylhexyl)-4H-cyclopenta[1,2-b:5,4-b']dithiophen-2-yl)-[1,2,5]thiadiazolo[3,4-c]pyridine (0.154 g, 0.252 mmol), placed under vacuum and refilled with nitrogen three times. 3 mL of dry, degassed THF is added via syringe and the solution is cooled to −78° C. Lithium diisopropylamide (0.45 mL, 0.45 mmol) is added dropwise and stirred at −78° C. for 20 minutes. Trimethyltin chloride (0.45 mL, 0.45 mmol) is added all at once and stirred at −78° C. for 10 minutes before warming to room temperature. The reaction is stirred for 1 hour at room temperature and the solvent is removed under vacuum. 10 mL of hexanes is added, and the organic layer was washed with 10 mL of water three times. The organic layer is dried over magnesium sulfate, filtered, and concentrated to yield 7-Bromo-4-(4,4-(2-ethylhexyl)-6-(trimethylstannyl)-4H-cyclopenta[1,2-b:5,4-b']dithiophen-2-yl)[1,2,5]thiadiazolo[3,4-c]pyridine (0.190 g, 0.248 mmol, 98%) as a purple oil. The product was used without further purification. $^1$H-NMR (Tetrahydrofuran d$_8$, 600 MHz): δ 8.69 (s, 1H), δ 8.55 (s, 1H), δ 7.18 (s, J$_{H-Sn}$=12 Hz, 1H), δ 2.03 (m, 4H), δ 1.1-0.8 (m, 18H), δ 0.76 (m, 6H), δ 0.62 (m, 6H), δ 0.40 (s, J$_{H-Sn}$=24 Hz, 9H). $^{13}$C-NMR (Tetrahydrofuran d$_8$, 600 MHz) δ 162.18, 159.14, 156.26, 147.82, 145.71, 145.70, 143.96, 142.47, 141.98, 140.60, 130.39, 128.24, 106.32, 53.26, 43.57, 43.22, 43.09, 43.05, 35.22, 35.19, 34.17, 28.61, 28.46, 27.34, 27.33, 22.73, 14.03, 13.97, 0.45, −9.60.

7-Bromo-4-(4,4-(2-hexadecyl)-6-(trimethylstannyl)-4H-cyclopenta[1,2-b:5,4-b']dithioph en-2-yl)-[1,2,5]thiadiazolo[3,4-c]pyridine A flame dried 10 mL schlenk flask is charged with 7-Bromo-4-(4,4-di(2-hexyldecyl)-4H-cyclopenta[1,2-b:5,4-b']dithiophen-2-yl)-[1,2,5]thiadiazolo[3,4-c]pyridine (0.1370 g, 0.163 mmol), placed under vacuum and refilled with nitrogen three times. 2 mL of dry, degassed THF is added via syringe and the solution is cooled to −78° C. Lithium diisopropylamide (0.35 mL, 0.35 mmol) is added dropwise and stirred at −78° C. for 20 minutes. Trimethyltin chloride (0.35 mL, 0.35 mmol) is added all at once and stirred at −78° C. for 10 minutes before warming to room temperature. The reaction is stirred for 1 hour at room temperature and the solvent is removed under vacuum. 10 mL of hexanes is added, and the organic layer was washed with 10 mL of water three times. The organic layer is dried over magnesium sulfate, filtered, and concentrated to yield 7-Bromo-4-(4,4-(2-hexyldecyl)-6-(trimethylstannyl)-4H-cyclopenta[1,2-b:5,4-b']dithiophen-2-yl)[1,2,5]thiadiazolo[3,4-c]pyridine (0.163 g, 0.163 mmol, quantitative) as a purple oil. The product was used without further purification. $^1$H-NMR (Tetrahydrofuran d$_8$, 600 MHz): δ 8.69 (s, 1H), δ 8.56 (s, 1H), δ 7.15 (d, J$_{H-Sn}$=12 Hz, 1H), δ 2.04 (m, 4H), δ 1.1-0.8 (m, 56H), δ 0.60 (m, 6H), δ 0.40 (s, J$_{H-Sn}$=24 Hz, 9H) $^{13}$C-NMR (Tetrahydrofuran d$_8$, 600 MHz) δ 162.17, 159.14, 156.26, 147.82, 145.71, 143.98, 142.48, 141.96, 140.60, 130.37, 128.23, 124.87, 106.32, 53.26, 43.59, 35.43, 35.05, 34.43, 34.23, 33.95, 31.84, 31.80, 29.77, 29.75, 29.58, 29.56, 29.42, 29.32, 29.29, 26.54, 22.56, 22.48, 22.43, 13.47, 13.25, 0.36, −9.18

7-Bromo-4-(4,4-(2-octyldodecyl)-6-(trimethylstannyl)-4H-cyclopenta[1,2-b:5,4-b']dithioph en-2-yl)-[1,2,5]thiadiazolo[3,4-c]pyridine A flame dried 10 mL schlenk flask is charged with 7-Bromo-4-(4,4-di(2-octyldodecyl)-4H-cyclopenta[1,2-b:5,4-b']dithiophen-2-yl)-[1,2,5]thiadiazolo[3,4-c]pyridine (0.178 g, 0.187 mmol), placed under vacuum and refilled with nitrogen three times. 3 mL of dry, degassed THF is added via syringe and the solution is cooled to −78° C. Lithium diisopropylamide (0.37 mL, 0.37 mmol) is added dropwise and stirred at −78° C. for 20 minutes. Trimethyltin chloride (0.37 mL, 0.37 mmol) is added all at once and stirred at −78° C. for 10 minutes before warming to room temperature. The reaction is stirred for 1 hour at room temperature and the solvent is removed under vacuum. 10 mL of hexanes is added, and the organic layer was washed with 10 mL of water three times. The organic layer is dried over magnesium sulfate, filtered, and concentrated to yield 7-Bromo-4-(4,4-(2-octyldodecyl)-6-(trimethylstannyl)-4H- cyclopenta[1,2-b:5,4-b']dithiophen-2-yl)[1,2,5]thiadiazolo[3,4-c]pyridine (0.208 g, 0.187 mmol, quantitative) as a purple oil. The product was used without further purification. $^{1}$H-NMR (Tetrahydrofuran d$_{8}$, 600 MHz): δ 8.68 (s, 1H), δ 8.55 (s, 1H), δ 7.32 (s, J$_{H-Sn}$=12 Hz, 1H), δ 2.04 (m, 4H), δ 1.1-0.8 (m, 72H), δ 0.60 (m, 6H), δ 0.40 (s, J$_{H-Sn}$=24 Hz, 9H) $^{13}$C-NMR (Tetrahydrofuran d$_{8}$, 600 MHz) δ 162.18, 159.14, 156.26, 147.82, 145.71, 145.70, 143.96, 142.47, 141.98, 140.60, 130.39, 128.24, 106.32, 53.26, 43.57, 35.05, 35.01, 33.67, 31.83, 31.79, 31.78, 31.71, 29.55, 29.41, 26.53, 22.54, 22.41, 13.43, 13.21, 0.45, −9.70.

d. Polymerization

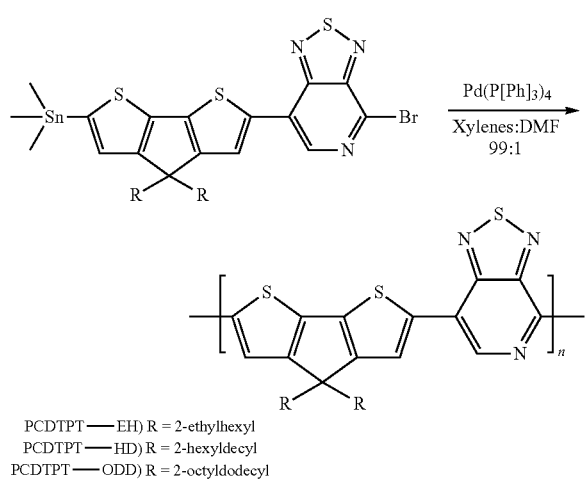

PCDTPT——EH) R = 2-ethylhexyl
PCDTPT——HD) R = 2-hexyldecyl
PCDTPT——ODD) R = 2-octyldodecyl

PCDTPT-EH

Under inert atmosphere, palladium (0) tetrakistriphenylphosphine (14 mg, 0.0012 mmol) and 7-Bromo-4-(4,4-(2-ethylhexyl)-6-(trimethylstannyl)-4H-cyclopenta[1,2-b:5,4-b']dithiophen-2-yl)[1,2,5]thiadiazolo[3,4-c]pyridine (0.190 g, 0.245 mmol) were added to a 2 mL microwave vial. The vial was sealed and dry, degassed xylenes (2.5 mL) and dry, degassed DMF (0.2 mL) were added via syringe. The microwave vial was loaded into a microwave reactor and subjected to the following reaction conditions: 80° C. for 2 min, 130° C. for 2 min, 170° C. for 2 min and 200° C. for 40 min. The reaction was cooled to room temperature, then tributyl(thiophen-2-yl) stannane (20 µl) was added. The reaction was then subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 µl) was added and the reaction was subjected to the following reaction conditions in a microwave reactor: 80° C. for 2 min, 130° C. for 2 min, 170° C. for 2 min and 200° C. for 20 min. The polymer solution was precipitated into methanol, filtered into a soxhlex thimble and washed in a soxhlet extractor with methanol (12 hours), hexanes (4 hours) and the polymer was extracted with chloroform. The polymer was then purified on a silica gel column using toluene as eluant. After concentration, 101.7 mg of polymer was recovered (75%) as a green solid. $^{1}$H-NMR (CDCl$_{3}$, 600 MHz): δ 8.86 (s, 1H), δ 8.64 (s, 1H), δ 8.10 (s, 1H), δ 2.08 (m, 4H), δ 1.25-0.9 (m, 18H), δ 0.85-0.60 (m, 12H). M$_{n}$=19.0 kDa, Đ =1.60.

PCDTPT-HD

Under inert atmosphere, palladium (0) tetrakistriphenylphosphine (9.0 mg, 0.00086 mmol) and 7-Bromo-4-(4,4-(2-hexyldecyl)-6-(trimethylstannyl)-4H-cyclopenta[1,2-b:5,4-b']dithiophen-2-yl)[1,2,5]thiadiazolo[3,4-c]pyridine (0.172 g, 0.171 mmol) were added to a 2 mL microwave vial. The vial was sealed and dry, degassed xylenes (2.5 mL) and dry, degassed DMF (0.2 mL) were added via syringe. The microwave vial was loaded into a microwave reactor and subjected to the following reaction conditions: 80° C. for 2 min, 130° C. for 2 min, 170° C. for 2 min and 200° C. for 40 min. The reaction was cooled to room temperature, then tributyl(thiophen-2-yl) stannane (20 µl) was added. The reaction was then subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 µl) was added and the reaction was subjected to the following reaction conditions in a microwave reactor: 80° C. for 2 min, 130° C. for 2 min, 170° C. for 2 min and 200° C. for 20 min. The polymer solution was precipitated into methanol, filtered into a soxhlex thimble and washed in a soxhlet extractor with methanol (12 hours), ethyl acetate (4 hours) and the polymer was extracted with hexanes. The polymer was then purified on a silica gel column using chloroform as eluant. After concentration, 92.5 mg of polymer was recovered (71%) as a green solid. $^{1}$H-NMR (CDCl$_{3}$, 600 MHz): δ 8.84 (s, 1H), δ 8.64 (s, 1H), δ 8.10 (s, 1H), δ 2.08 (m, 4H), δ 1.55 (m, 2H) δ 1.25-0.9 (m, 48H), δ 0.85-0.60 (m, 12H). M$_{n}$=26.8 kDa, Đ =1.75. PCDTPT-HD was fractionated by precipitating in methanol, filtering, then washing the polymer with a mixture of 40% cyclohexane 60% ethyl acetate until the filtrate ran clear. M$_{n}$=52.3 kDa, Đ =1.33

PCDTPT-ODD

Under inert atmosphere, palladium (0) tetrakistriphenylphosphine (5.5 mg, 0.045 mmol) and 7-Bromo-4-(4,4-(2-octyldodecyl)-6-(trimethylstannyl)-4H-cyclopenta[1,2-b:5,4-b']dithiophen-2-yl)[1,2,5]thiadiazolo[3,4-c]pyridine (0.104 g, 0.093 mmol) were added to a 2 mL microwave vial. The vial was sealed and dry, degassed xylenes (2.5 mL) and dry, degassed DMF (0.2 mL) were added via syringe. The microwave vial was loaded into a microwave reactor and subjected to the following reaction conditions: 80° C. for 2 min, 130° C. for 2 min, 170° C. for 2 min and 200° C. for 40 min. The reaction was cooled to room temperature, then tributyl(thiophen-2-yl) stannane (20 µl) was added. The reaction was then subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 µl) was added and the reaction was subjected to the following reaction conditions in a microwave reactor: 80° C. for 2 min, 130° C. for 2 min, 170° C. for 2 min and 200° C. for 20 min. The polymer solution was precipitated into methanol, filtered into a soxhlex thimble and washed in a soxhlet extractor with methanol (12 hours), ethyl acetate (4 hours) and the polymer was extracted with hexanes. The polymer was then purified on a silica gel column using chloroform as eluant. After concentration, 52.2 mg of polymer was recovered (65%) as a green solid. $^{1}$H-NMR (CDCl$_{3}$, 600 MHz): δ 8.86 (s, 1H), δ 8.64 (s, 1H), δ 8.10 (s, 1H), δ 2.08 (m, 4H), δ 1.55 (m, 2H) δ 1.25-0.9 (m, 64H), δ 0.85-0.60 (m, 12H). M$_{n}$=22.9 kDa, Đ =1.82.

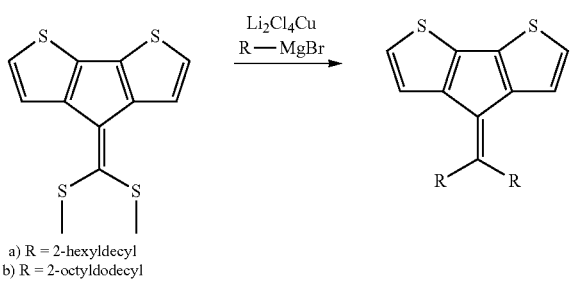

a) R = 2-hexyldecyl
b) R = 2-octyldodecyl d. Synthesis of Cyclopentadithiophene-Alkylidenes 4-(7,11-dihexylheptadecan-9-ylidene)-4H-cyclopenta[2,1-b:3,4-b']dithiophene A 50 mL round bottom flask was charged with a stir bar, freshly sanded magnesium (0.360 g, 15 mmol), and iodine (100 mg) in a glove box. The flask was removed and kept under nitrogen while adding 20 mL of dry diethyl ether 2-hexyldecylbromide (3.0 g, 10 mmol) via syringe. The solution was sonicated and self refluxed for 1 hour then stored until use, resulting in a 0.35 M solution of 2-hexyldecylmagnesium bromide as determined by titration with salicylaldehyde-phenylhydrazone. To a 25 mL flame dried Schlenk flask containing a stir bar and 4-(bis(methylthio)methylene)-4H-cyclopenta[2,1-b:3,4-b']dithiophene (0.089 g, 0.32 mmol) was added dry, degassed THF (3 mL) and dilithium tetrachlorocuprate (0.1 M in THF, 0.32 mL, 0.032 mmol). 2-hexyldecylmagnesium bromide (2.5 mL, 0.875 mmol) was added dropwise while sonicating. The reaction vessel was stirred while sonicating at 20° C. for 3 hours under nitrogen atmosphere, then poured into 50 mL water. The aqueous layer was washed with 25 mL portions of hexanes three times. The organic portions were combined and washed with 100 mL of saturated aqueous ammonium chloride twice. The organic layer was dried over magnesium sulfate, filtered, concentrated, and purified via column chromatography on silica gel using 100% hexanes as eluant to yield 0.093 g of 4-(7,11-dihexylheptadecan-9-ylidene)-4H-cyclopenta[2,1-b:3,4-b']dithiophene as a yellow oil (0.144 mmol, 45%). $^1$H-NMR (CDCl$_3$, 600 MHz): δ 7.27 (d, J=6 Hz, 2H), δ 7.07 (d, J=6 Hz, 2H), δ 2.65 (d, J=6 Hz, 4H), δ 1.78 (m, 2H) δ 1.4-1.1 (m, 48H), δ 0.80 (m, 12H) $^{13}$C-NMR (CDCl$_3$, 600 MHz) δ 149.03, 143.80, 136.88, 130.07, 123.84, 123.14, 40.08, 39.58, 37.60, 37.08, 33.70, 33.68, 31.95, 31.87, 30.14, 29.97, 29.67, 29.30, 26.55, 22.264, 14.08. HRMS: calc. 638.4919, found 638.4915, Δ=0.6 ppm.

4-(9,13-dioctylhenicosan-11-ylidene)-4H-cyclopenta[2,1-b:3,4-b']dithiophene

A 50 mL round bottom flask was charged with a stir bar, freshly sanded magnesium (0.360 g, 15 mmol), and iodine (100 mg) in a glove box. The flask was removed and kept under nitrogen while adding 20 mL of dry diethyl ether 2-hexyldecylbromide (3.6 g, 10 mmol) via syringe. The solution was sonicated and self refluxed for 1 hour then stored until use, resulting in a 0.30 M solution of 2-hexyldecylmagnesium bromide as determined by titration with salicylaldehyde-phenylhydrazone. To a 25 mL flame dried Schlenk flask containing a stir bar and 4-(bis(methylthio)methylene)-4H-cyclopenta[2,1-b:3,4-b']dithiophene (0.060 g, 0.20 mmol) was added dry, degassed THF (2 mL) and dilithium tetrachlorocuprate (0.1 M in THF, 0.2 mL, 0.02 mmol). 2-hexyldecylmagnesium bromide (1.4 mL, 0.50 mmol) was added dropwise while sonicating. The reaction vessel was stirred while sonicating at 20° C. for 3 hours under nitrogen atmosphere, then poured into 50 mL water. The aqueous layer was washed with 25 mL portions of hexanes three times. The organic portions were combined and washed with 100 mL of saturated aqueous ammonium chloride twice. The organic layer was dried over magnesium sulfate, filtered, concentrated, and purified via column chromatography on silica gel using 100% hexanes as eluant to yield 0.035 g of 4-(9,13-dioctylhenicosan-11-ylidene)-4H-cyclopenta[2,1-b:3,4-b']dithiophene as a pale yellow oil (1.04 mmol, 23%) Major reasons for yield losses include the presence of the product containing only a single alkyl chain (32 mg, 30%). $^1$H-NMR (CDCl$_3$, 600 MHz): δ 7.27 (d, J=6 Hz, 2H), δ 7.07 (d, J=6 Hz, 2H), δ 2.65 (d, J=6 Hz, 4H), δ 1.78 (m, 2H) δ 1.4-1.1 (m, 66H), δ 0.80 (m, 12H) $^{13}$C-NMR (CDCl$_3$, 600 MHz) δ 149.04, 143.80, 136.87, 130.07, 123.84, 123.14, 39.57, 37.58, 33.50, 31.90, 29.98, 29.66, 29.63, 29.60, 29.33, 29.31, 26.57, 22.65, 22.67. HRMS: calc. 750.6171, LRMS-FD+ found 750.63 Δ=3.6 ppm.

e. Synthesis of Cyclopentadithiphene-Pyridylthiadiazole Units

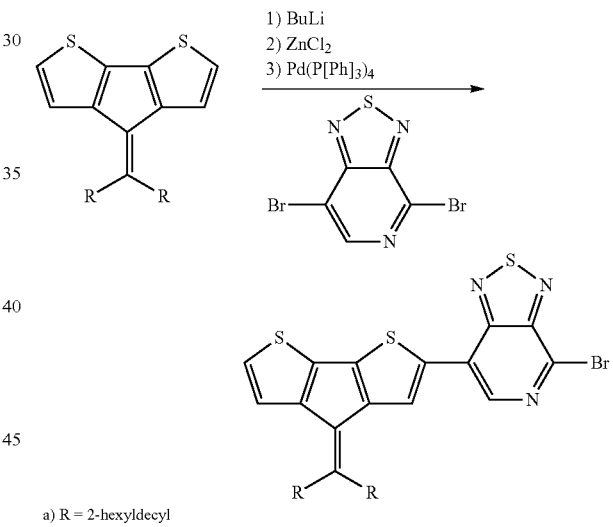

a) R = 2-hexyldecyl
b) R = 2-octyldodecyl 4-bromo-7-(4-(7,11-dihexylheptadecan-9-ylidene)-4H-cyclopenta[2,1-b:3,4-b']dithiophen-2-yl)-[1,2,5]thiadiazolo[3,4-c]pyridine A flame dried 25 mL schlenk flask is charged with 4-(7,11-dihexylheptadecan-9-ylidene)-4H-cyclopenta[2,1-b:3,4-b']dithiophene (0.060 g, 0.095 mmol), placed under vacuum and refilled with nitrogen three times. 1 mL dry, degassed THF is added, and the solution is cooled to −78° C. Freshly titrated n-Butyllithium (0.072 mL, 0.10 mmol) was added dropwise via syringe and the solution was stirred for 20 minutes at −78° C. A 0.2M solution of zinc(II) chloride (14 mg, 0.1 mmol) in dry, degassed THF was added to the reaction flask at −78° C. and was stirred for 20 minutes before warming to room temperature. A separate schlenk flask is charged with palladium(0)tetrakistriphenylphosphine (11 mg, 0.0095 mmol) and 4,7-dibromo-[1,2,5]thiadiazolo[3,4-c]pyridine (32 mg, 0.11 mmol), and dissolved in 1 mL dry, degassed THF. The solution containing catalyst was then added all at once to the reaction flask, and stirred for 8 hours at room temperature. The reaction was then concentrated under vacuum and purified using column chromatography (gradient 20% chloroform 80% hexanes to 50% chloroform 50% hexanes) to yield 4-bromo-7-(4-(7,11-dihexylheptadecan-9-ylidene)-4H-cyclopenta[2,1-b:3,4-b']dithiophen-2-yl)-[1,2,5]thiadiazolo[3,4-c]pyridine as a purple oil (0.037 g, 70%). $^1$H-NMR (CDCl$_3$, 600 MHz): δ 8.99 (s, 1H), δ 8.57 (s, 1H), δ 7.33 (d, J=3 Hz, 1H), δ 7.27 (d, J=3 Hz, 1H), δ 2.81 (m, 2H, J=6 Hz), δ 2.69 (m, 2H, J=6 Hz), δ 1.89 (m, 1H) δ 1.84 (m, 1H) δ 1.3-1.1 (m, 48H), δ 0.85 (m, 12H) $^{13}$C-NMR (CDCl$_3$, 600 MHz) δ 156.36, 153.40, 151.47, 140.08, 147.91, 146.51, 145.97, 145.62, 139.47, 139.25, 136.79, 129.79, 126.91, 123.87, 106.35, 40.28, 40.06, 38.29, 37.81, 33.59, 33.55, 33.29, 33.25, 31.94, 31.91, 31.90, 31.87, 30.15, 29.97, 29.83, 29.66, 29.59, 29.34, 29.29, 26.58, 26.55, 26.32, 26.30, 22.67, 22.63, 14.0911. HRMS: calc. 851.3195, LRMS-FD+ found 851.36. Δ=4.9 ppm.

4-bromo-7-(4-(9,13-dioctylhenicosan-11-ylidene)-4H-cyclopenta[2,1-b:3,4-b']dithiophen-2-yl)-[1,2,5]thiadiazolo[3,4-c]pyridine A flame dried 25 mL schlenk flask is charged with 4-(9,13-dioctylhenicosan-11-ylidene)-4H-cyclopenta[2,1-b:3,4-b']dithiophene (0.090 g, 0.12 mmol), placed under vacuum and refilled with nitrogen three times. 3 mL dry, degassed THF is added, and the solution is cooled to −78° C. Freshly titrated n-Butyllithium (0.051 mL, 0.12 mmol) was added dropwise via syringe and the solution was stirred for 20 minutes at −78° C. A 0.2M solution of zinc(II) chloride (17 mg, 0.13 mmol) in dry, degassed THF was added to the reaction flask at −78° C. and was stirred for 20 minutes before warming to room temperature. A separate schlenk flask is charged with palladium(0)tetrakistriphenylphosphine (7 mg, 0.006 mmol) and 4,7-dibromo-[1,2,5]thiadiazolo[3,4-c]pyridine (35 mg, 0.12 mmol), and dissolved in 4 mL dry, degassed THF. The solution containing catalyst was then added all at once to the reaction flask, and stirred for 8 hours at room temperature. The reaction was then concentrated under vacuum and purified using column chromatography (gradient 20% chloroform 80% hexanes to 50% chloroform 50% hexanes) to yield 4-bromo-7-(4-(9,13-dioctylhenicosan-11-ylidene)-4H-cyclopenta[2,1-b:3,4-b']dithiophen-2-yl)-[1,2,5]thiadiazolo[3,4-c]pyridine as a purple oil (0.066 g, 57%). $^1$H-NMR (CDCl$_3$, 600 MHz): δ 8.99 (s, 1H), δ 8.57 (s, 1H), δ 7.33 (d, J=3 Hz, 1H), δ 7.27 (d, J=3 Hz, 1H), δ 2.81 (m, 2H, J=6 Hz), δ 2.69 (m, 2H, J=6 Hz), δ 1.89 (m, 1H) δ 1.84 (m, 1H) δ 1.3-1.1 (m, 64H), δ 0.85 (m, 12H). $^{13}$C-NMR (CDCl$_3$, 600 MHz) δ 156.37, 153.79, 151.47, 148.00, 147.90, 146.54, 145.96, 145.62, 139.40, 129.80, 129.65, 126.69, 123.86, 106.33, 40.28, 40.06, 38.29, 37.83, 33.60, 33.55, 33.31, 33.26, 31.95, 31.87, 30.15, 29.97, 29.83, 29.68, 29.66, 29.59, 29.34, 29.29, 26.58, 26.57, 26.33, 26.31, 22.67, 22.63, 14.07. HRMS: calc. 963.5167, found LRMS-FD+ 963.46 Δ=−5.9 ppm.

f. Synthesis of Stannylated Monomer Units

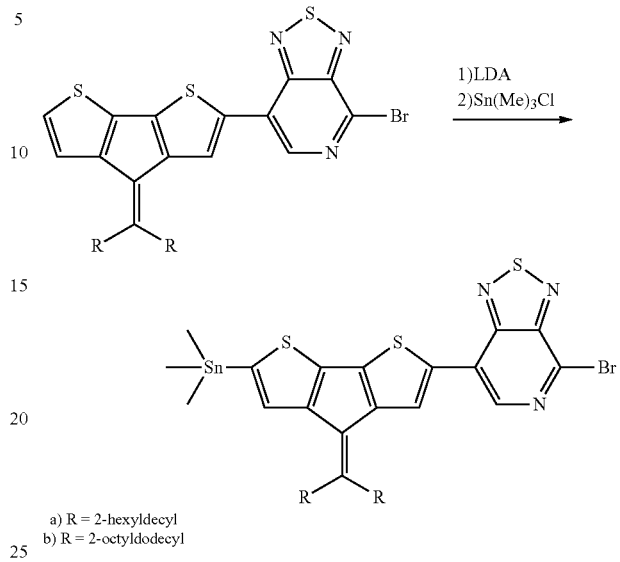

a) R = 2-hexyldecyl
b) R = 2-octyldodecyl 4-bromo-7-(4-(7,11-dihexylheptadecan-9-ylidene)-6-(trimethylstannyl)-4H-cyclopenta[2,1-b:3,4-b']dithiophen-2-yl)-[1,2,5]thiadiazolo[3,4-c]pyridine A flame dried 10 mL schlenk flask is charged with 4-bromo-7-(4-(7,11-dihexylheptadecan-9-ylidene)-4H-cyclopenta[2,1-b:3,4-b']dithiophen-2-yl)-[1,2,5]thiadiazolo[3,4-c]pyridine (0.037 g, 0.043 mmol), placed under vacuum and refilled with nitrogen three times. 1 mL of dry, degassed THF is added via syringe and the solution is cooled to −78° C. Lithium diisopropylamide (0.058 mL, 0.052 mmol) is added dropwise and stirred at −78° C. for 20 minutes. Trimethyltin chloride (0.058 mL, 0.058 mmol) is added all at once and stirred at −78° C. for 10 minutes before warming to room temperature. The reaction is stirred for 1 hour at room temperature and the solvent is removed under vacuum. 10 mL of hexanes is added, and the organic layer was washed with 10 mL of water three times. The organic layer is dried over magnesium sulfate, filtered, and concentrated to yield 4-bromo-7-(4-(7,11-dihexylheptadecan-9-ylidene)-6-(trimethylstannyl)-4H-cyclopenta[2,1-b:3,4-b']dithiophen-2-yl)-[1,2,5]thiadiazolo[3,4-c]pyridine (0.041 g, 0.042 mmol, 95%) as a purple oil. The product was used without further purification. $^1$H-NMR (Tetrahydrofuran d$_8$, 600 MHz): δ 9.04 (s, 1H), δ 8.54 (s, 1H), δ 7.42 (d, J$_{H-Sn}$=12 Hz, 1H), δ 2.89 (m, 2H, J=6 Hz), δ 2.81 (m, 2H, J=6 Hz), δ 1.99 (m, 1H) δ 1.94 (m, 1H) δ 1.3-1.1 (m, 48H), δ 0.85 (m, 12H) δ 0.40 (s, J$_{H-Sn}$=24 Hz, 9H) $^{13}$C-NMR (Tetrahydrofuran d$_8$, 600 MHz) δ 156.20, 149.83, 148.23, 147.84, 147.70, 145.66, 145.39, 143.02, 142.52, 141.89, 139.74, 131.09, 129.55, 129.44, 106.29, 40.30, 38.35, 35.16, 33.51, 33.46, 33.25, 33.18, 31.89, 31.85, 31.84, 30.09, 30.05, 29.80, 29.73, 29.62, 29.30, 26.50, 26.47, 26.29, 24.50, 22.55, 22.53, 22.52, 13.44, −9.23.

4-bromo-7-(4-(9,13-dioctylhenicosan-11-ylidene)-6-(trimethylstannyl)-4H-cyclopenta[2,1-b:3,4-b']dithiophen-2-yl)-[1,2,5]thiadiazolo[3,4-c]pyridine A flame dried 10 mL schlenk flask is charged with 4-bromo-7-(4-(9,13-dioctylhenicosan-11-ylidene)-4H-cyclopenta[2,1-b:3,4-b']dithiophen-2-yl)-[1,2,5]thiadiazolo[3,4-c]pyridine (0.066 g, 0.068 mmol), placed under vacuum and refilled with nitrogen three times. 1 mL of dry, degassed THF is added via syringe and the solution is cooled to −78° C. Lithium diisopropylamide (0.15 mL, 0.14 mmol) is added dropwise and stirred at −78° C. for 20 minutes. Trimethyltin chloride (0.15 mL, 0.15 mmol) is added all at once and stirred at −78° C. for 10 minutes before warming to room temperature. The reaction is stirred for 1 hour at room temperature and the solvent is removed under vacuum. 10 mL of hexanes is added, and the organic layer was washed with 10 mL of water three times. The organic layer is dried over magnesium sulfate, filtered, and concentrated to yield 4-bromo-7-(4-(9,13-dioctylhenicosan-11-ylidene)-6-(trimethylstannyl)-4H-cyclopenta[2,1-b:3,4-b']dithiophen-2-yl)-[1,2,5]thiadiazolo[3,4-c]pyridine (0.073 g, 0.068 mmol, 96%) as a purple oil. The product was used without further purification. $^1$H-NMR (Tetrahydrofuran d$_8$, 600 MHz): δ 9.05 (s, 1H), δ 8.55 (s, 1H), δ 7.41 (d, J$_{H-Sn}$=12 Hz, 1H), δ 2.89 (m, 2H, J=6 Hz), δ 2.79 (m, 2H, J=6 Hz), δ 1.99 (m, 1H) δ 1.94 (m, 1H) δ 1.3-1.1 (m, 56H), δ 0.85 (m, 12H) δ 0.40 (s, J$_{H-Sn}$=24 Hz, 9H) $^{13}$C-NMR (Tetrahydrofuran d$_8$, 600 MHz) δ 156.22, 149.83, 148.55, 147.84, 147.85, 147.72, 145.67, 145.39, 142.61, 142.32, 141.20, 139.74, 131.10, 129.55, 129.45, 106.29, 40.30, 38.35, 35.16, 33.51, 33.46, 33.25, 33.18, 31.86, 31.84, 30.09, 30.05, 29.65, 29.61, 29.32, 29.29, 26.50, 26.47, 26.29, 24.50, 22.55, 22.54, 13.44, −9.23.

g. Polymerization to Fabricate PCDTPT-ene

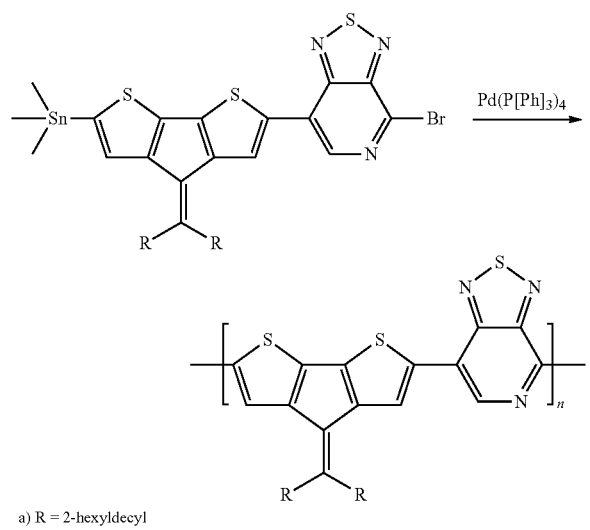

a) R = 2-hexyldecyl
b) R = 2-octyldodecyl

PCDTPT-ene-HD

Under inert atmosphere, palladium (0) tetrakistriphenylphosphine (2.0 mg, 0.0017 mmol) and 4-bromo-7-(4-(7,11-dihexylheptadecan-9-ylidene)-6-(trimethylstannyl)-4H-cyclopenta[2, 1-b:3,4-b']dithiophen-2-yl)-[1,2,5]thiadiazolo[3,4-c]pyridine (0.026 g, 0.022 mmol) were added to a 2 mL microwave vial. The vial was sealed and dry, degassed xylenes (0.5 mL) and dry, degassed DMF (0.05 mL) were added via syringe. The microwave vial was loaded into a microwave reactor and subjected to the following reaction conditions: 80° C. for 2 min, 130° C. for 2 min, 170° C. for 2 min and 200° C. for 40 min. The reaction was cooled to room temperature, then tributyl(thiophen-2-yl) stannane (20 μl) was added. The reaction was then subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 μl) was added and the reaction was subjected to the following reaction conditions in a microwave reactor: 80° C. for 2 min, 130° C. for 2 min, 170° C. for 2 min and 200° C. for 20 min. The polymer solution was precipitated into methanol, filtered into a soxhlex thimble and washed in a soxhlet extractor with methanol (12 hours), ethyl acetate (4 hours) and the polymer was extracted with hexanes. The polymer was then purified on a silica gel column using chloroform as eluent. After concentration, 16.0 mg of polymer was recovered (76%) as a green solid. M$_n$=22.9 kDa, Đ=2.0. $^1$H-NMR (CDCl$_3$, 600 MHz): δ 8.93 (s, 1H), δ 8.66 (s, 1H), δ 8.05 (s, 1H), δ 2.91 (m, 2H), δ 2.69 (m, 2H), δ 1.99 (m, 1H) δ 2.17 (m, 1H) δ 1.3-1.1 (m, 56H), δ 0.85 (m, 12H). This polymer was further fractionated into higher molecular weights by precipitating into MeOH, filtering into a soxhlet thimble and washing with mixtures of ethyl acetate:hexanes ranging from 85:15 to 15:85, then separating and combining the desired fractions. Three separate fractions were then used for measuring MS parameters: M$_n$ 8.7 kDa, Đ=1.35, M$_n$=13.0 kDa, Đ=1.66, M$_n$=26.4 kDa, Đ=2.0. The unfractionated sample (M$_n$=22.9 kDa, Đ=2.0.) was used to fabricate transistors.

PCDTPT-ene-ODD

Under inert atmosphere, palladium (0) tetrakistriphenylphosphine (5.5 mg, 0.045 mmol) and 4-bromo-7-(4-(9,13-dioctylhenicosan-11-ylidene)-6-(trimethylstannyl)-4H-cyclopenta[2,1-b:3,4-b']dithiophen-2-yl)-[1,2,5]thiadiazolo[3,4-c]pyridine (0.073 g, 0.068 mmol) were added to a 2 mL microwave vial. The vial was sealed and dry, degassed xylenes (2.5 mL) and dry, degassed DMF (0.2 mL) were added via syringe. The microwave vial was loaded into a microwave reactor and subjected to the following reaction conditions: 80° C. for 2 min, 130° C. for 2 min, 170° C. for 2 min and 200° C. for 40 min. The reaction was cooled to room temperature, then tributyl(thiophen-2-yl) stannane (20 μl) was added. The reaction was then subjected to the following reaction conditions in a microwave reactor: 80° C. for 2 min, 130° C. for 2 min, 170° C. for 2 min and 200° C. for 20 min. After the reaction was cooled to room temperature, 2-bromothiophene (20 μl) was added and the reaction was subjected to the following reaction conditions in a microwave reactor: 80° C. for 2 min, 130° C. for 2 min, 170° C. for 2 min and 200° C. for 20 min. The polymer solution was precipitated into methanol, filtered into a soxhlex thimble and washed in a soxhlet extractor with methanol (12 hours), ethyl acetate (4 hours) and the polymer was extracted with hexanes. The polymer was then purified on a silica gel column using chloroform as eluent. After concentration, 26.0 mg of polymer was recovered (45%) as a green solid. M$_n$=14.9 kDa, Đ=1.95. $^1$H-NMR (CDCl$_3$, 600 MHz): δ 8.93 (s, 1H), δ 8.66 (s, 1H), δ 8.05 (s, 1H), δ 2.91 (m, 2H), δ 2.69 (m, 2H), δ 1.99 (m, 1H) δ 2.17 (m, 1H) δ 1.3-1.1 (m, 64H), δ 0.85 (m, 12H). This polymer was further fractionated into higher molecular weights by precipitating into MeOH, filtering into a soxhlet thimble and washing with mixtures of ethyl acetate:hexanes ranging from 85:15 to 15:85, then separating and combining the desired fractions. Three separate fractions were then used for measuring MS parameters: $M_n$=7.9 kDa, $Đ$=1.25, $M_n$=12.6 kDa, $Đ$=1.58, $M_n$=22.9 kDa, $Đ$=1.83. The highest molecular weight fraction was used to fabricate transistors.

h. Instrumentation Methods

Microwave reactions were performed using a Biotage microwave reactor in a mixture of dry, degassed xylenes and dimethylformamide using procedures outlined in Appendix A of the priority application[111]. Nuclear magnetic resonance (NMR) spectra were obtained on Varian 600 MHz spectrometer. Gel permeation chromatography (GPC) was performed in chloroform ($CHCl_3$) on a Waters 2690 Separation Module equipped with a Waters 2414 Refractive Index Detector. Molecular weights were calculated relative to narrow PS standards. DSC was conducted on a Perkin Elmer DSC 8000 outfitted with a liquid nitrogen cooling module. 20 mg of the polymer solutions were transferred into a DSC pan and hermetically sealed, and scanned through the desired temperature range twice. The mass of the DSC pan was recorded before and after scanning to ensure no solvent loss. Polarized optical microscopy was conducted with an Olympus BX51 microscope outfitted with a Linkam THMS600 temperature controlled stage. All polymer films and solutions were imaged while sandwiched between glass microscope slides. UV-vis spectra were collected at a concentration of 0.2 mg/mL using a Shimadzu 3600 UV-vis-NIR spectrometer outfitted with a heated sample stage. Dynamic Light Scattering was performed using a Viscotek 802 DLS with a 60 mW, 825 nm laser light source at a concentration of 0.5 mg/mL. Grazing Incidence Wide Angle X-ray Scattering (GIWAXS) and Wide Angle X-ray Scattering measurements were performed at beamline 11-3 at the Stanford Synchrotron Radiation Lightsource (SSRL) with an X-ray wavelength of 0.9752 Å. Thin films for GIWAXS were spin coated onto silicon wafers from a 10 mg/mL solution of the indicated solvent for 60 seconds at 1500 RPM. Transmission WAXS was conducted on 20 mg/mL solutions sealed inside an aluminum cell with kapton windows, and heated using a custom built heated cell provided by SSRL.

i. Transistor Fabrication and Testing

Source and drain contacts (5 nm Cr/30 nm Au) were deposited onto glass using an evaporation mask. Before electrode deposition, the substrates were cleaned by sonication in acetone and isopropanol for 3 minutes each, and substrates were treated with UV-O3 for 10 minutes. PCDTPT solutions were spin coated on the substrates at a concentration of 10 mg/mL using the indicated solvent at 1000 RPM for 60 seconds in a glove box. Devices were annealed at the indicated temperature for 8 minutes. The final device architecture (from bottom to top) for these top gate, bottom contact field-effect transistors was Glass (1 mm)/Cr (5 nm)/Au (30 nm)/Polymer (100 nm)/PIL (1 um)/Au (100 um).

The mobility was measured in the linear regime by fitting the following equation to the transfer characteristics: $\mu_{linear}=(dI_{DS}/dV_G)(L/W)(V_{DS})^{-1}(Ci)^{-1}$, where $dI_{DS}/dV_G$ is the slope of the transfer curve after turn-on (between −1.7 V and −2.0V), W is the channel width (2 mm), L is the channel length (~100 μm), Ci is the gate dielectric layer capacitance per unit area (1 $\mu F/cm^2$), $V_{DS}$ is the source-drain voltage (−0.5 V), $V_{th}$ is the threshold voltage, and IDS is the source-drain voltage. Devices were measured under nitrogen in a glovebox using a Keithley 2400 source meter. Transfer curves were generated measuring IDS after charging at each $V_G$ for 100 seconds at a $V_{DS}$ of −0.5 V. Output curves were generated by sweeping current at the indicated gate voltage at a rate of 50 mv/s. Mobility values were calculated from a gate voltage range of −1.7 to −2.0 V at a source-drain voltage of −0.5 V.

Process Steps

Figure 11:
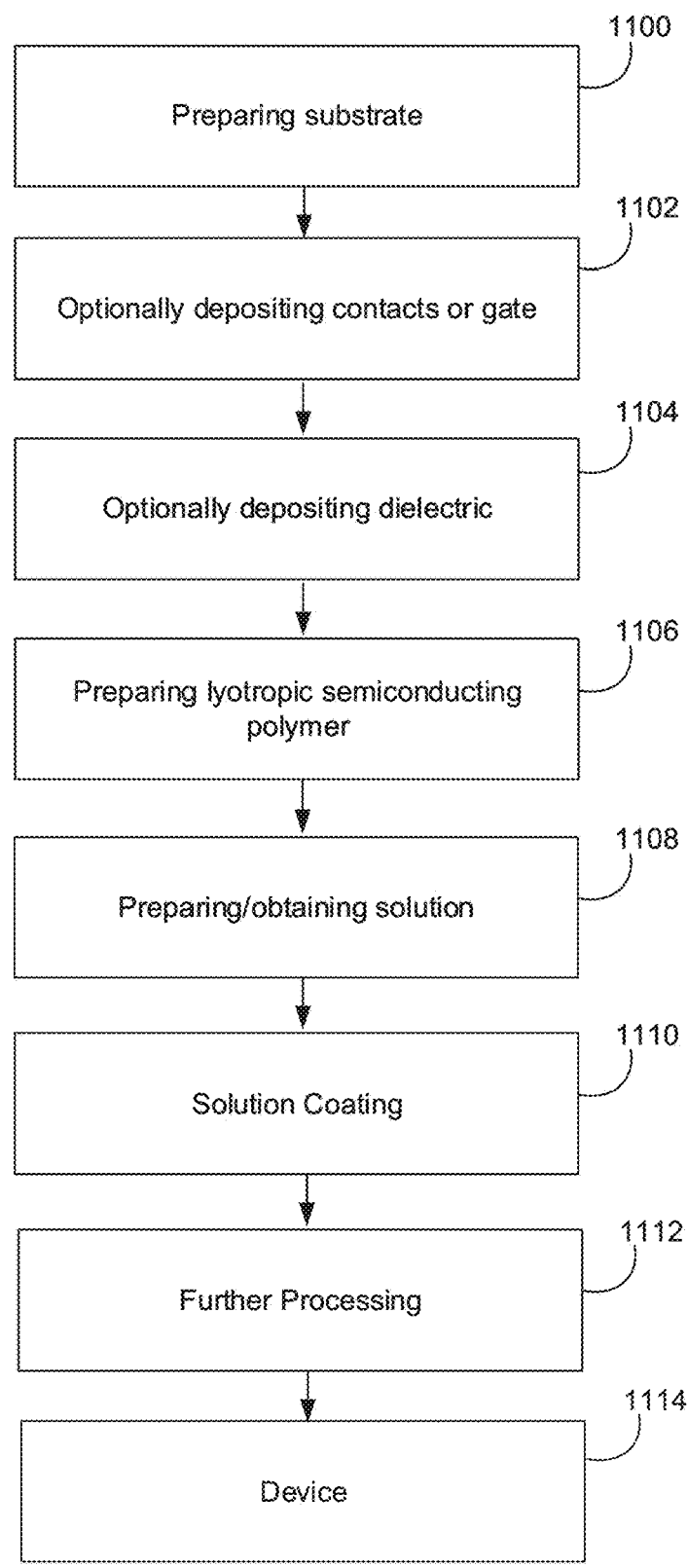
FIG. 11. Flowchart illustrating a method of fabricating an organic device (e.g., OFET) according to one or more embodiments.

FIG. 11 is a flowchart illustrating a method for fabricating a film or device such as an OFET. The method leverages selective solubility of polymers (e.g., that are typically amorphous) to access lyotropic liquid crystalline mesophases and make highly crystalline films of donor-acceptor conjugated polymers.

The method can comprise the following steps.

Block 1100 represents obtaining/providing and/or preparing a substrate. In one or more embodiments, the substrate comprises a flexible substrate. Examples of a flexible substrate include, but are not limited to, a plastic substrate, a polymer substrate, a metal substrate, or a glass substrate. In one or more embodiments, the flexible substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film. In one or more embodiments, the substrate is a swellable substrate.

Block 1102 represents optionally forming/depositing contacts or electrodes (e.g., p-type, n-type contacts, a gate, a source, and/or drain contacts) on or above (or as part of) the substrate.

In an OFET embodiment comprising a top gate & bottom contact geometry, source and drain contacts are deposited on the substrate. Examples of materials for the source and drain contacts include, but are not limited to, gold, silver, silver oxide, nickel, nickel oxide (NiOx), molybdenum, and/or molybdenum oxide. In one or more embodiments, the source and drain contacts of the OFET further comprise a metal oxide electron blocking layer, wherein the metal in the metal oxide includes, but is not limited to, nickel, silver, or molybdenum.

In an OFET embodiment comprising a bottom gate geometry, a gate electrode is deposited on the substrate. In one or more embodiments, the gate contact (gate electrode) is a thin metal layer. Examples of the metal layer for the gate include, but are not limited to, an aluminum layer, a copper layer, a silver layer, a silver paste layer, a gold layer or a Ni/Au bilayer. Examples of the gate contact further include, but are not limited to, a thin Indium Tin Oxide (ITO) layer, a thin fluorine doped tin oxide (FTO) layer, a thin graphene layer, a thin graphite layer, or a thin PEDOT:PSS layer. In one or more embodiments, the thickness of the gate electrode is adjusted (e.g., made sufficiently thin) depending on the flexibility requirement.

The gate, source, and drain contacts can be printed, thermally evaporated, or sputtered, for example.

Block 1104 represents optionally depositing a dielectric on the gate electrode, e.g., when fabricating an OFET in a bottom gate configuration. In this example, the dielectric is deposited on the gate contact's surface to form a gate dielectric.

Examples of depositing the dielectric include forming a coating including one or one or more dielectric layers on the substrate (and selecting a thickness of the dielectric layers or coating). In one or more examples, the dielectric is structured or patterned, e.g., to form nanogrooves or nanostructures in the dielectric. Examples of dimensions for the nanogrooves include, but are not limited to, a nanogroove depth of 6 nanometers or less and/or a nanogroove width of 100 nm or less.

Examples of dielectric layers include, but are not limited to, a single polymer (e.g., PVP) dielectric layer or multiple dielectric layers (e.g., bilayer dielectric). A single polymer dielectric layer may be preferred in some embodiments (for easier processing, or for more flexibility). In one embodiment, the dielectric layer comprises silicon dioxide ($SiO_2$). In another embodiment, the dielectric layers form a polymer/$SiO_2$ bilayer. In yet another embodiment, the dielectric layers form a polymer dielectric/$SiO_2$/SAM multilayer with the $SiO_2$ on the polymer and the alkylsilane or arylsilane Self Assembled Monolayer (SAM) layer on $SiO_2$. In yet a further embodiment, the dielectric layers form a $SiO_2$/SAM bilayer with the alkylsilane or arylsilane SAM layer on the $SiO_2$. Various functional groups may be attached to the end of the alkyl groups to modify the surface property of the SAM layer.

The thickness of the $SiO_2$ may be adjusted (e.g., made sufficiently thin) depending on the composition of the dielectric layers and the flexibility requirement. For example, in one embodiment, the dielectric layer might not include a polymer dielectric layer and still be flexible.

In one or more embodiments, the nanogrooves/nanostructures are formed/patterned using nano imprint lithography. In one example, patterning the dielectric layers comprises nano-imprinting a first dielectric layer (e.g., PVP) deposited on a gate metal surface of the substrate; and depositing a second dielectric layer on the nanoimprinted first dielectric layer, wherein a thickness of the second dielectric layer (e.g., comprising $SiO_2$) is adjusted.

Figure 12A:
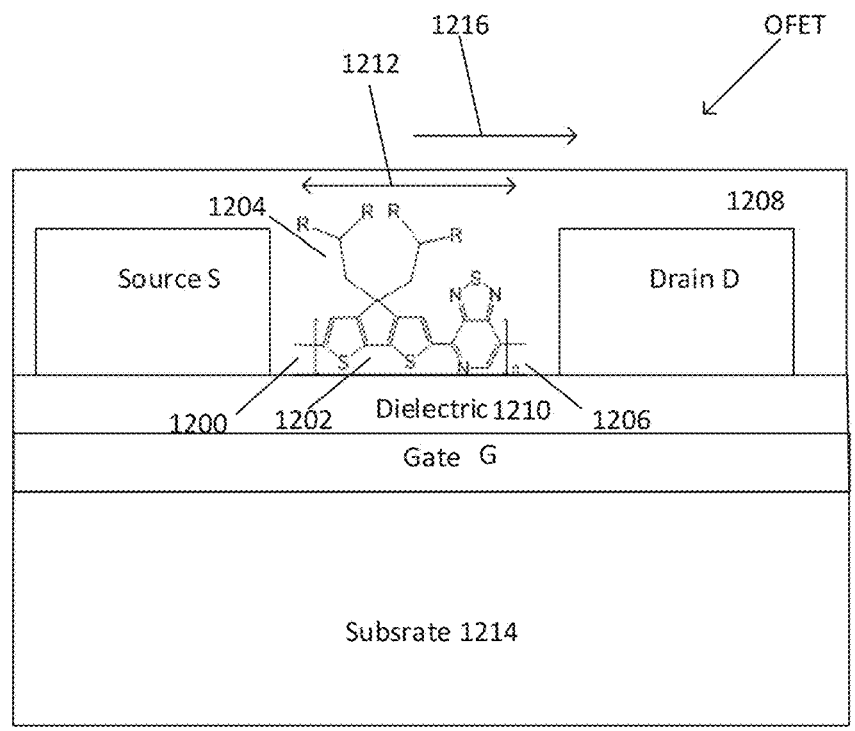
FIGS. 12(a)-(b) are cross-sectional schematics of OFETs according to one or more embodiments of the invention (FIG. 12(a) shows a bottom gate OFET and FIG. 12(b) shows a top gate OFET).
Figure 12B:
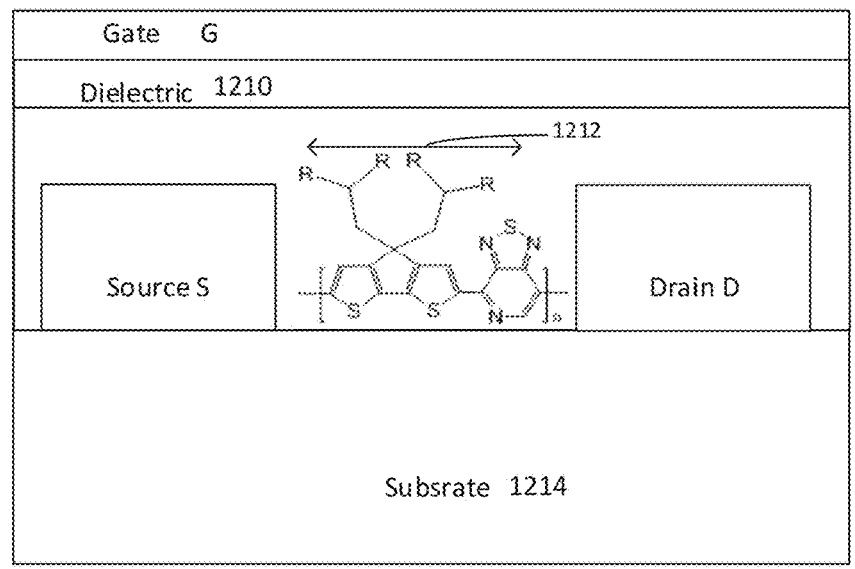

Block 1106 (referring also to FIG. 12(*a*)-12(*b*)) represents preparing/obtaining a composition of matter comprising lyotropic semiconducting polymers 1200 each having a donor-acceptor copolymer backbone 1202 and a side chain 1204 attached to the backbone 1202, wherein the donor-acceptor copolymer backbone 1202 comprises fused aromatic rings.

In one or more embodiments, the backbone 1202 is selected to be sufficiently rigid to form a crystalline structure in solution. In one or more examples, the backbone does not include an aliphatic ring fused to an aromatic ring and/or the backbone does not comprise a fluorine-sulfur bond.

In one or more embodiments, the semiconducting polymer has the repeating unit structure $[D-A]_n$ or $[D-A-D-A]_n$ wherein D comprises the donor, A comprises the acceptor, and n is an integer representing the number of repeating units. In one or more embodiments, the structure has a regioregular conjugated main chain section having n=5-150, or more, contiguous repeat units. In some embodiments, the number of repeat units n is in the range of 10-40 repeats. The regioregularity of the conjugated main chain section can be 95% or greater, for example.

The step further comprises selecting side chains 1204, R for the semiconducting polymers 1200, e.g., side chains 1204 that dissolve in a solvent more effectively than the backbone 1202. Examples include branched side-chains having a size sufficiently large to form a lyotropic mesophase in a solvent, e.g., a branched side-chain comprising a $C_3$-$C_{50}$, $C_8$-$C_{50}$, or $C_9$-$C_{50}$ substituted or non-substituted alkyl chain.

Examples of branched alkyl chains include isopropyl, sec-butyl, t-butyl, 1,2-dimethylpropyl, 1,1-dimethyl-propyl, 4-methylpentyl, 1-methylpentyl, 2-methylpentyl, 3-methyl-pentyl, 1,1-dimethylbutyl, 2,2-dimethylbutyl, 3,3-dimethyl-butyl, 1,2-dimethylbutyl, 1,3-dimethylbutyl, 1,2,2-trimeth-ylpropyl, 1,1,2-trimethylpropyl, 5-methylhexyl, 1-methylhexyl, 2,2-dimethylpentyl, 3,3-dimethylpentyl, 4,4-dimethylpentyl, 1,2-dimethylpentyl, 1,3-dimethylpen-tyl, 1,4-dimethylpentyl, 1,2,3-trimethylbutyl, 1,1,2-trimeth-ylbutyl, 1,1,3-trimethylbutyl, 6-methylheptyl, 1-methylhep-tyl, 1,1,3,3-tetramethylbutyl, 1-, 2-, 3-, 4-, 5-, 6- or 7-methyloctyl, 1-, 2-, 3-, 4- or 5-ethylheptyl, 1-, 2- or 3-propylhexyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, dimethyloctyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3-, 4- or 5-propyloctyl, 1-, 2- or 3-butylheptyl, 1-pentylhexyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-, 2-pentylheptyl, branched decyl, undecyl, dodecyl, tridecyl, tetradecyl, pentadecyl, hexadecyl, heptadecyl, octadecyl, nonoadecyl, eicosyl such as 2-hexyldecyl, 2-octyldodecyl and the like.

The branched alkyl chain may optionally include a carbon chiral center, and the branched alkyl chain is enantiopure or enantioenriched.

In one or more examples, the side chains have a structure/composition selected to reduce steric repulsion between side chains and increase attraction between the backbones in adjacent semiconducting polymers.

In one or more further examples, the side chains have a structure/composition such that the side chains extend more towards a direction parallel to the backbone than towards a direction perpendicular to the backbone. For example, the side chains may be in plane with the backbone to increase intermolecular interactions and pi-pi stacking between the semiconducting polymers and increase alignment of the semiconducting polymers, as compared to side chains that are out of plane with the backbone that reduce the intermolecular interactions and do not align the semiconducting polymers as well).

In one or more examples, the side chains are connected to the backbone via a double bond that is incapable of rotating about an axis connecting the side chain to the backbone.

Examples of the donor in the repeat unit 1206 include dithiophenes having the structure:

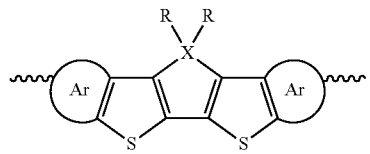

wherein each Ar is independently a substituted or non-substituted aromatic functional group (or each Ar is independently nothing and the valence of its respective thiophene ring is completed with hydrogen), each R is independently hydrogen or a substituted or non-substituted alkyl, aryl, or alkoxy chain (having the branched structure and composition described herein to achieve a lyotropic mesophase), and X is C, C=C, Si, Ge, N or P. The R groups can be the same or different. In the dithiophene, the R comprising the substituted or non-substituted alkyl, aryl or alkoxy chain can be a branched $C_3$-$C_{50}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, 2-hexyldecyl, 2-octyldodecyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(C_mH_{2m+1})_3)_x(C_pH_{2p+1})_y$ (m, n, p=1 to 20, x+y=3).

For example, the dithiophene unit could comprise:

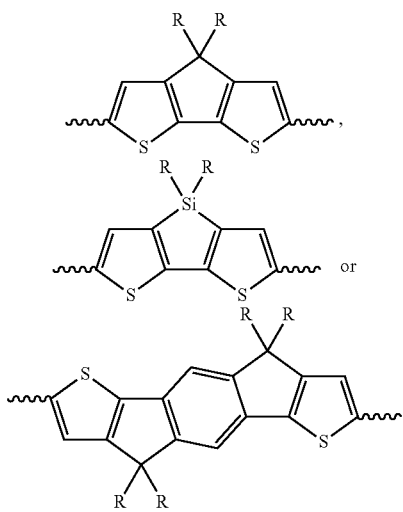

In one or more embodiments, the repeat unit further comprises an acceptor attached to the donor, the acceptor including a pyridine of the structure:

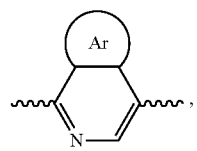

wherein Ar is a substituted or non-substituted aromatic functional group, or Ar is nothing and the valence of the pyridine ring is completed with hydrogen. In one or more embodiments, the pyridine is regioregularly arranged along the conjugated main chain section.

Examples of the pyridine unit include, but are not limited to:

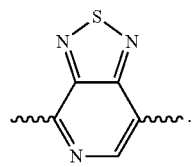

In one or more embodiments, the repeat unit further comprises an acceptor attached to the donor, comprising the structure:

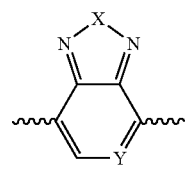

wherein X is O, S, Se, or N—R where R is H or a substituted or non-substituted alkyl, aryl or alkoxy chain; and Y is either C or N.

Thus, in one or more embodiments, combination of the pyridine and the dithiophene yields the polymer of the formula:

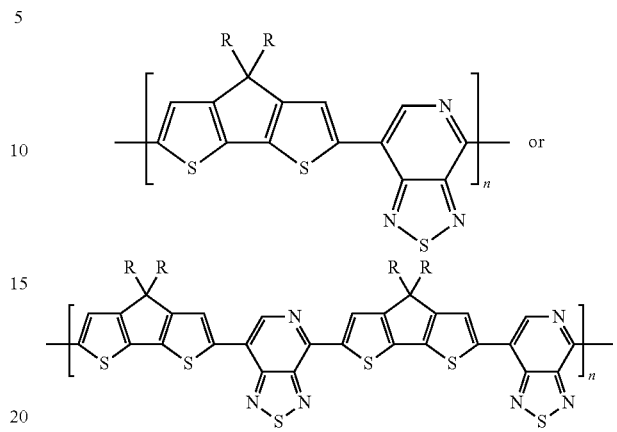

wherein the R has the branched structure and composition to achieve the lyotropic mesophase in solution as described herein.

In one or more further examples, the acceptor A comprises an aromatic ring comprising a side group (e.g., Fluorine) having reduced susceptibility to oxidization as compared to a pyridine ring (e.g., a regioregular fluoro-phenyl unit). For example, the acceptor has the structure:

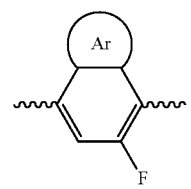

wherein Ar is a substituted or non-substituted aromatic functional group containing one, two, three or more aromatic rings, or Ar is nothing and the valence of the ring comprising fluorine (F) is completed with hydrogen. In one or more embodiments, the ring comprising F is regioregularly arranged along the conjugated main chain section.

In one or more embodiments, the repeat unit further comprises an acceptor attached to the donor, comprising the structure:

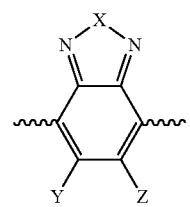

wherein X is O, S, Se, or N—R where R is H or a substituted or non-substituted alkyl, aryl or alkoxy chain; and Y and Z are independently selected to be H or F.

In one or more examples, the ring comprising the F has the structure:

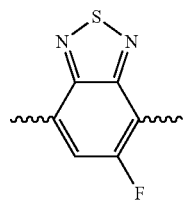

Figures 6A, 6B, 6C, 6D:
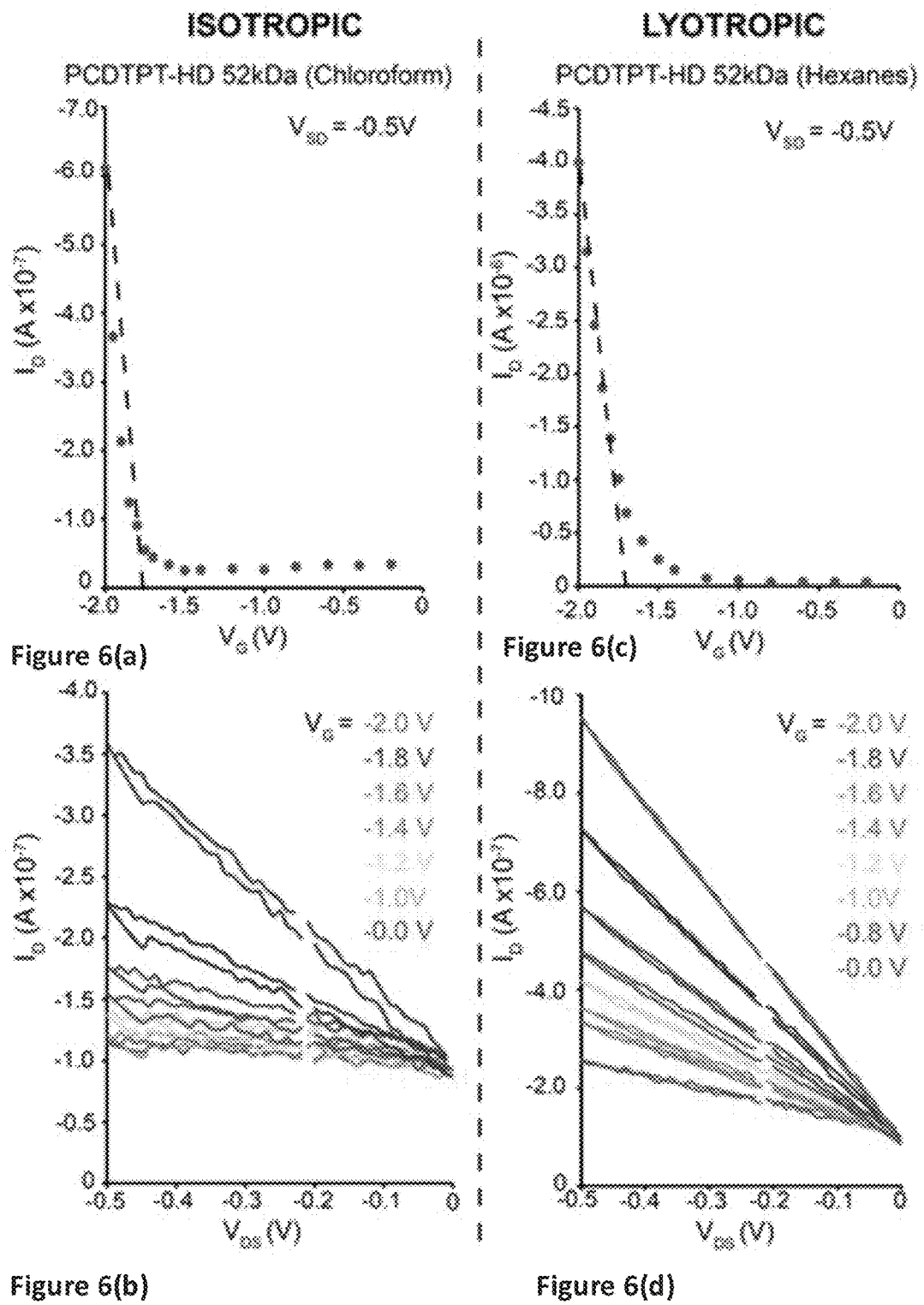
FIGS. 6(a)-6(d). Representative transfer (top) output (bottom) characteristics for transistors fabricated using PCDTPT-HD (52 kDa) cast from isotropic (left) and lyotropic (right) solutions.

Other examples include those illustrated in FIG. 6a of U.S. patent application Ser. No. 15/349,908 entitled "FLUORINE SUBSTITUTION INFLUENCE ON BENZO[2,1,3] THIODIAZOLE BASED POLYMERS FOR FIELD-EFFECT TRANSISTOR APPLICATIONS," (which application is incorporated by reference herein and cross-referenced above).

In one or more embodiments, the donor (connected to the fluorinated acceptor in the repeat unit) is a dithiophene as described previously.

Thus, in one or more embodiments, the semiconducting polymer is a regioregular semiconducting polymer comprising a repeating unit of the structure:

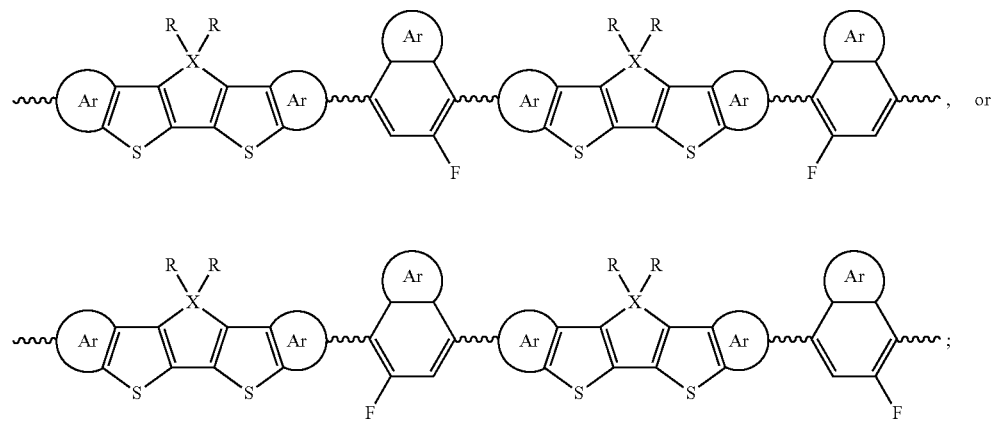

More specific examples include:

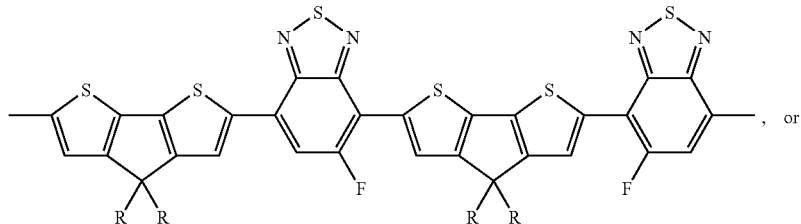

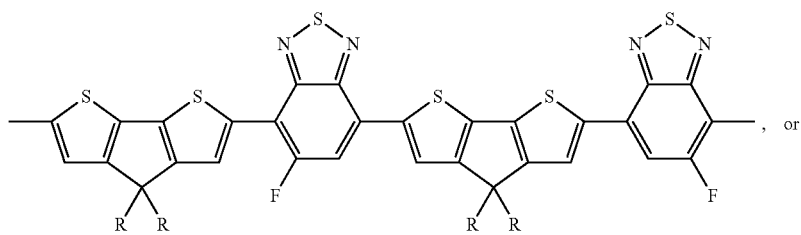

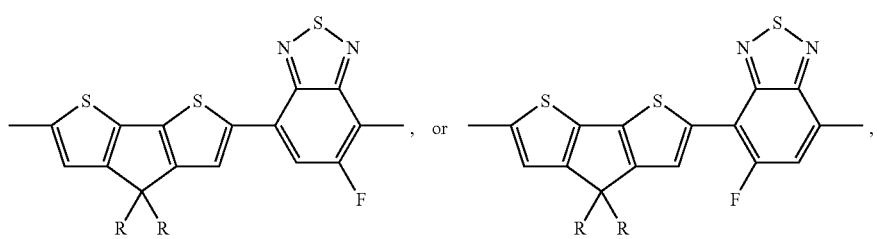

where the ring comprising F is regioregularly arranged along the conjugated main chain section pointing toward the direction shown in the structures above, Ar is a substituted or non-substituted aromatic functional group containing one, two, three or more aromatic rings, or Ar is nothing and the valence of the ring comprising fluorine (F) or the valence of the dithiophene is completed with hydrogen, and the R groups are the side chains 1204 having the branched structure and composition to achieve the lyotropic mesophase in solution as described herein (e.g., branched substituted or non-substituted alkyl, aryl or alkoxy chain are a $C_6$-$C_{50}$ substituted or non-substituted alkyl or alkoxy chain, comprising —($CH_2CH_2O$)n (n=2~20), $C_6H_5$, —$C_nF_{(2n+1)}$ (n=2~20), —($CH_2$)$_n$N($CH_3$)$_3$Br (n=2~20), 2-ethylhexyl, 2-hexyldecyl, 2-octyldodecyl, Ph$C_mH_{2m+1}$ (m=1-20), —($CH_2$)$_n$N($C_2H_5$)$_2$ (n=2~20), —($CH_2$)$_n$Si($C_mH_{2m+1}$)$_3$ (m, n=1 to 20), or —($CH_2$)$_n$Si(OSi($C_mH_{2m+1}$)$_3$)$_x$($C_pH_{2p+1}$)$_y$ (m, n, p=1 to 20, x+y=3).

Examples include branched side-chains having a size sufficiently large to form a lyotropic mesophase in a solvent, e.g., a branched side-chain comprising a $C_3$-$C_{50}$, $C_8$-$C_{50}$ or $C_9$-$C_{50}$ substituted or non-substituted alkyl chain. Examples of branched alkyl chains include isopropyl, sec-butyl, t-butyl, 1,2-dimethylpropyl, 1,1-dimethyl-propyl, 4-methylpentyl, 1-methylpentyl, 2-methylpentyl, 3-methylpentyl, 1,1-dimethylbutyl, 2,2-dimethylbutyl, 3,3-dimethylbutyl, 1,2-dimethylbutyl, 1,3-dimethylbutyl, 1,2,2-trimethylpropyl, 1,1,2-trimethylpropyl, 5-methylhexyl, 1-methylhexyl, 2,2-dimethylpentyl, 3,3-dimethylpentyl, 4,4-dimethylpentyl, 1,2-dimethylpentyl, 1,3-dimethylpentyl, 1,4-dimethylpentyl, 1,2,3-trimethylbutyl, 1,1,2-trimethylbutyl, 1,1,3-trimethylbutyl, 6-methylheptyl, 1-methylheptyl, 1,1,3,3-tetramethylbutyl, 1-, 2-, 3-, 4-, 5-, 6- or 7-methyloctyl, 1-, 2-, 3-, 4- or 5-ethylheptyl, 1-, 2- or 3-propylhexyl, 1-, 2-, 3-, 4-, 5-, 6-, 7- and 8-methylnonyl, 1-, 2-, 3-, 4-, 5- or 6-ethyloctyl, 1-, 2-, 3- or 4-propylheptyl, dimethyloctyl, 1-, 2-, 3-, 4-, 5-, 6-, 7-, 8- or 9-methyldecyl, 1-, 2-, 3-, 4-, 5-, 6- or 7-ethylnonyl, 1-, 2-, 3-, 4- or 5-propyloctyl, 1-, 2- or 3-butylheptyl, 1-pentylhexyl, 1-, 2-, 3-, 4-, 5-, 6-, 7-, 8-, 9- or 10-methylundecyl, 1-, 2-, 3-, 4-, 5-, 6-, 7- or 8-ethyldecyl, 1-, 2-, 3-, 4-, 5- or 6-propylnonyl, 1-, 2-, 3- or 4-butyloctyl, 1-, 2-pentylheptyl, branched decyl, undecyl, dodecyl, tridecyl, tetradecyl, pentadecyl, hexadecyl, heptadecyl, octadecyl, nonoadecyl, eicosyl such as 2-hexyldecyl, 2-octyldodecyl and the like.

The branched alkyl chain may optionally include a carbon chiral center, and the branched alkyl chain is enantiopure or enantioenriched.

For example, the semiconducting polymer can be regioregular poly[5-fluoro-[2,1,3]benzothiadiazole-4,7-diyl(4,4-dialkyl-4H-cyclopenta[2,1-b:3,4-b']dithiophene-2,6-diyl)-5-fluoro-[2,1,3]benzothiadiazole-7,4-diyl(4,4-dihexadecyl-4H-cyclopenta[2,1-b:3,4-b']dithiophene-2,6-diyl)] (P2F or PCDTFBT). The alkyl group is a branched alkyl side-chain comprising a $C_3$-$C_{50}$, $C_8$-$C_{50}$, or $C_9$-$C_{50}$ substituted or non-substituted alkyl chain.

Further examples of the fluorophenylene as the acceptor include fluorphenylene units having the structural formula:

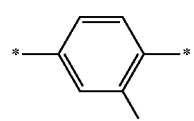

2-fluoro-1, 4-phenylene,

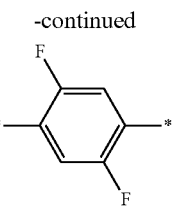

2, di-fluoro-1, 4-phenylene,

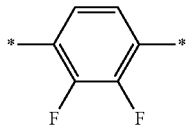

2, 3-fluoro-1, 4-phenylene,

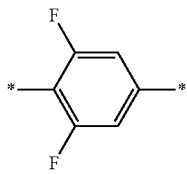

2, 6-difluoro-1, 4-phenylene,

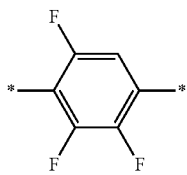

2, 3, 5-trifluoro-1, 4-phenylene, or

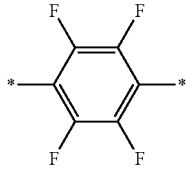

2, 3, 5, 6-tetrafluoro-1, 4-phenylene.

The 2-fluoro-1,4-phenylene, 2,6-difluoro-1,4-phenylene, and 2,3,5-trifluoro-1,4-phenylene may form regioregular polymers, whereas the other fluorophenylenes (2,5-difluoro-1,4-phenylene, 2,3-difluoro-1,4-phenylene, and 2,3,5,6-tetrafluoro-1,4-phenylene) do not.

In one or more examples, the phenylene comprising F is regioregularly arranged along the conjugated main chain section (e.g., pointing toward the direction shown in the structures above), the R groups are the side chains 1204 having the branched structure and composition to achieve the lyotropic mesophase in solution as described herein (e.g., a branched substituted or non-substituted alkyl, aryl or alkoxy chain comprising, for example, a $C_6$-$C_{30}$ substituted or non-substituted alkyl or alkoxy chain, —($CH_2CH_2O$)n (n=2~20), $C_6H_5$, —$C_nF_{(2n+1)}$ (n=2~20), —($CH_2$)$_n$N($CH_3$)$_3$Br (n=2~20), 2-ethylhexyl, 2-hexyldecyl, 2-octyldodecyl, Ph$C_mH_{2m+1}$ (m=1-20), —($CH_2$)$_n$N($C_2H_5$)$_2$ (n=2~20), —($CH_2$)$_n$Si($C_mH_{2m+1}$)$_3$ (m, n=1 to 20), or —($CH_2$)$_n$Si(OSi($C_mH_{2m+1}$)$_3$)$_x$($C_pH_{2p+1}$)$_y$ (m, n, p=1 to 20, x+y=3).

Other examples of regioregular structures include those described above but with the 2-fluoro-1,4-phenylene replaced with 2,6-difluoro-1,4-phenylene or 2,3,5-trifluoro-1,4-phenylene.

Further example regioregular structures include:

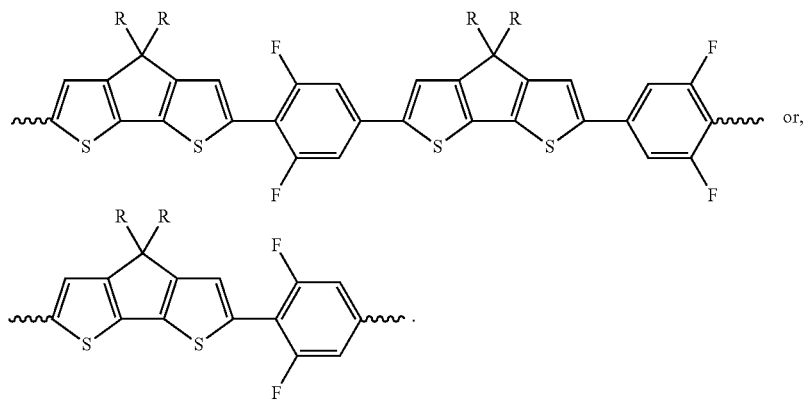

Examples of non-regioregular structures include:

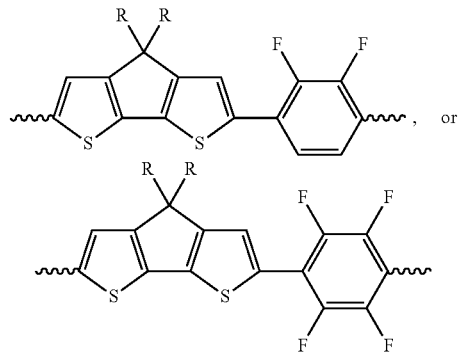

wherein the R groups are the side chains 1204 having the branched structure and composition to achieve the lyotropic mesophase in solution as described herein.

Block 1108 represents preparing/obtaining a lyotropic solution comprising a solvent and the side chains dissolved in the solvent, e.g., wherein the semiconducting polymers disposed in a lyotropic liquid crystalline mesophase 300, 800 (see FIG. 3(d) and FIG. 8(h)). The step can comprise selecting a selective solvent for the side chains; and combining the semiconducting polymers and the selective solvent so that the lyotropic solution is formed.

The solvent (e.g., hexane or chloroform) used in the solution is selected to form the semiconducting polymers exhibiting the lyotropic mesophase. In one or more embodiments, the solvent in the lyotropic solution is a selective solvent that has a propensity to dissolve the side chain (e.g., the solvent dissolves the side chains more effectively than the backbone of the semiconducting polymers, or the solvent selectively dissolves the side chains but not the backbone). The selective solvent can be a hydrocarbon (e.g., a substituted or non-substituted alkanes, alkenes, alkynes, ethers, esters, alcohols, halides, aldehydes, ketones, amines, amides), water, or a mixture of above.

In one or more embodiments, a fabricated liquid crystal mesophase is present at all concentrations of the lyotropic solution.

Molecular structure can be varied to obtain desirable thermodynamic mesophase parameters.

In one or more embodiments, differential solvent interactions with the semiconducting polymers are selected to make amphiphilic structures that form ordered aggregates, e.g., similar to micellation.

In one example, the lyotropic solution includes the lyotropic semiconducting polymers stacked into a crystalline structure (see, e.g., ultraviolet-visible (UV-Vis) absorption data and X-ray diffraction data presented herein), e.g., as characterized by having a thermal transition expected for a crystalline transition (e.g., as measured by DSC).

In a further example, the crystalline structure in the lyotropic solution includes a liquid crystal comprising an aggregate including at least 100 of the lyotropic semiconducting polymers (e.g., 100-1000 semiconducting polymers) bonded with pi-pi bonds, wherein the interaction strength of the crystalline phase and/or the liquid crystal is characterized by Maier-Saupe interaction parameter of at least 50 (e.g., in a range of 50-200).

In yet another example, the crystalline structure in the lyotropic solution includes liquid crystal 300,800 comprising an aggregate of the lyotropic semiconducting polymers bonded with pi-pi bonds, wherein the lyotropic semiconducting polymers have a number of segments or repeating units N, the interaction strength of the crystalline phase is measured by plotting $N^{-1}$ as a function of (nematic-isotropic clearing temperature)$^{-1}$ (K), and $N^{-1}$ is a linear function of (nematic-isotropic clearing temperature)$^{-1}$ (K).

Block 1110 represents solution casting/processing the lyotropic solution comprising the semiconducting copolymer(s) (e.g., onto the dielectric) to form a film comprising the semiconducting copolymer(s), so that the semiconducting polymers are deposited from the lyotropic solution comprising the semiconducting polymers in a lyotropic liquid crystalline mesophase.

In one or more embodiments, the lyotropic solution is coated onto the substrate using an equilibrium coating method.

Solution casting methods include, but are not limited to, inkjet printing, bar coating, spin coating, blade coating, spray coating, roll coating, dip coating, free span coating, dye coating, screen printing, and drop casting.

Block 1112 represents further processing the polymer film cast on the patterned dielectric layers. The step can comprise annealing/curing the film or allowing the film to dry. The step can comprise depositing source and drain contacts as described above, if necessary.

In one or more embodiments, a solid state film is formed comprising the lyotropic semiconducting polymers combined in a stack and pi-pi bonds between the lyotropic semiconducting polymers. In one or more examples, the lyotropic semiconducting polymers at a top of the film are aligned with the semiconducting polymers at a bottom of the film. In one or more embodiments, intermolecular interactions between the lyotropic semiconducting polymers are controlled and increased/enhanced to achieve high alignment of the semiconducting polymers in the solid state.

Block 1114 represents the end result, a device or film useful in a device.

FIGS. 12(*a*) and 12(*b*) illustrate OFETs comprising an active region comprising aligned donor-acceptor copolymers 1200 each comprising a main chain section or backbone 1202 including fused aromatic rings and a side chain 1204, the main chain section 1202 having a repeat unit 1206 that comprises at least one donor D (e.g., as described in Block 1106) and at least one acceptor A (as described in Block 1106).

The OFET further comprises a source contact S and a drain contact D to a the semiconducting polymer 1200 or a film 1208 comprising the semiconducting polymer 1200, wherein the source S and drain D are separated by a length of a channel; and a gate connection/contact G on a dielectric 1210, wherein the gate connection G applies a field to the semiconducting polymer 1200 across the dielectric 1210 between the polymer 1200 and the gate G to modulate conduction along the semiconducting polymer 1200 in a channel between the source contact S and the drain contact D, thereby switching the OFET on or off.

In one or more embodiments, the OFET comprises means (e.g., formation of liquid crystals and shear forces applied to the liquid crystals, or statutory equivalents thereof) for aligning the polymer 1200 to the channel. The liquid crystals can be oriented/aligned so that the semiconducting polymers 1200 each have their backbone/main chain axis 1202 aligned with an alignment direction 1212 in the channel pointing from the source contact S to the drain contact D, so that charge transport between the source S and the drain D is preferentially along the alignment direction 1212. Conduction between the source contact S and the drain contact D is predominantly along the backbones/main chain axes 1202, although charge hopping between adjacent polymers in the liquid crystal is also possible. For example, the means can align the backbones 1202 to an imaginary line bounded by/alignment direction between the source S and the drain D. The source and drain can be positioned such that a minimum distance between the source contact and drain contact is substantially parallel to the alignment direction 1212 of the backbones 1202.

In one or more embodiments, shear coating (e.g. blade coating), dip coating, and bar coating (or statutory equivalents thereof) is used to coat the semiconducting polymers 1200 on dielectric 1210 or substrate 1214. For example, the solution processing can include coating the lyotropic solution onto the substrate by applying a shear force/field 1216 to the lyotropic solution, wherein increased intermolecular interactions between the semiconducting polymers (tailored using the side chains 1204 and/or the selective solvent) increase the effectiveness of shear alignment of the semiconducting polymers caused by the shear force/field 1216. In one or more embodiments, the shear force 1216 is applied with a blade having a larger area (e.g., more than a single contact point) of contact with the lyotropic solution so as to increase a period of time and/or distance the lyotropic solution is in the shear field/force 1216.

Embodiments of the present invention are not limited to the particular sequence of depositing the source, drain, and gate contacts. For example, OFETs according to one or more embodiments of the present invention can be fabricated in a bottom gate & top contact geometry, bottom gate & bottom contact geometry, top gate & bottom contact geometry, and top gate & top contact geometry[110].

In one or more embodiments, the source, drain, gate, and dielectric have one or more compositions, structures, or configurations, the donor-acceptor copolymer has a structure (including regioregularity), side-chain length, side chain branching, side chain orientation, steric repulsion, donor composition, acceptor composition, and is disposed in a film having a crystallinity, quality, and morphology, the solvent for the lyotropic solution has a composition, and the OFET and the donor-acceptor copolymers are fabricated under conditions described herein such that:

the semiconducting polymers in the active region have increased crystallinity and mobility as compared to semiconducting polymers deposited from an isotropic solution; and/or a film/OFET comprising the semiconducting polymers has a mobility in a range of 0.1 $cm^2$ $V^{-1}s^{-1}$-30 $cm^2$ $V^{-1}s^{-1}$ or 0.1 $cm^2$ $V^{-1}s^{-1}$-200 $cm^2$ $V^{-1}s^{-1}$ for a source drain voltage in a range of −0.5 V-+0.5 V and a gate-source voltage in a range of −3V to +3 V, e.g., when the OFET comprises a dielectric comprising a polymerized ionic liquid (PIL) dielectric; and/or π-π stacking of the semiconductor polymers in the active region is characterized by a peak having a full width at half maximum of 0.11 $Å^{-1}$ or less, as measured by X-ray scattering; and/or the aligned conjugated polymer chains are stacked to form a crystalline structure having an orientational order parameter between 0.9 and 1.

Thus, it is unexpectedly found that combining a donor-acceptor semiconducting polymer (comprising fused aromatic rings and a branched and/or bulky side chain) with a selective solvent for the side chain achieves a film of semiconducting polymers having increased crystallinity and mobility. Moreover, the present disclosure describes that thermodynamic properties of liquid crystalline materials can be leveraged to simultaneously control the crystallinity and macroscopic orientation of small molecules and polymers. The increase in crystallinity, represented by the results described herein and achieved by one or more embodiments of the present invention, is unexpected and surprising at least because introducing large or branched side chains typically results in a more amorphous polymer. Moreover, lyotropic mesophases are rare in conjugated polymers, and in spite of the potential advantages for solution processed electronics, there have been no reports of the formation of a liquid crystalline structure in solution to the best of the inventor's knowledge.

Advantages and Improvements

While it is widely recognized that the fraction, packing, and unit cell of polymers can hugely impact transistor performance, the orientation of molecules and crystallites is vital to deconvoluting charge carrier pathways between electrodes and improving carrier mobility. Using liquid crystal processing techniques to control the morphology and molecular orientation of conjugated polymers in organic electronics is sought after as a method to decrease the tortuosity charge carriers experience during operation of polymer electronic devices such as transistors.[68-75] To this end, Kim et. al. showed that certain conjugated polymers exhibiting lyotropic liquid crystalline mesophases could be aligned using contact coating.[76, 77] However, conjugated polymers generally aren't liquid crystals, and methods to achieve macroscopic alignment of these materials (e.g., off-centre spin-coating from self-assembled or aggregated solution,[77] sandwich casting,[78, 79] epitaxial crystallization,[80, 81] or high temperature rubbing[81-83]) rely on using trapping non-equilibrium structures (using complex trapping non-equilibrium morphologies) to achieve deconvoluted carrier pathways, which methods and structures can be difficult to scale up or reliably reproduce with different materials.

Moreover, while it is possible to design conjugated polymers with control over bandgap, carrier polarity, and energy levels, conventional methods do not provide molecular design guidelines applicable to designing polymers that are more susceptible to macroscopic alignment. Thus, studies to date on the alignment of polymer chains are phenomenological, and don't provide predictive power for systems of different molecular structure or introduce rational design rules.

The present disclosure, on the other hand, describes how molecular design principles used tune electronic properties can be merged with molecular design principles that control intermolecular interactions and alignment for next generation organic electronic materials. Specifically, the present disclosure describes molecular design guidelines to achieve conjugated polymers with control over bandgap, carrier polarity, energy levels, in addition to macroscopic alignment.

For example, the present disclosure describes how polymer backbones can be selected to tune bandgap, carrier polarity, energy levels, and the polymer side chains are tailored to accentuate specific solvent-polymer interactions that promote the polymer's alignment. Conventional methods, however, do not tailor polymer side chains to accentuate specific solvent polymer interactions that promote polymer alignment. As described herein, the interactions can be leveraged to impart favorable morphological properties of these materials in solution prior to coating, which favorable morphological properties can be transferred from solution to the thin film and ultimately results in improved device performance. The approach of rational side chain design, according to one or more embodiments, bridges the gap from solution structure to solid state, and is a promising and general approach to allow the expression of lyotropic mesophases in rigid conjugated polymers.

Illustrative examples described herein show that when PCDTPT copolymers have large enough solubilizing alkyl chains, the polymers become soluble in non-polar solvents that have no affinity towards the conjugated backbone, and thus are selective solvents for the alkyl chains. This system is reminiscent of many amphiphiles that exhibit a structured lyotropic mesophase in selective solvents. The inventors of the present invention find that when PCDTPT copolymers can be dissolved in selective solvents, they exhibit the birefringent texture characteristic of a nematic lyotropic mesophase and the optical and thermal properties of a highly ordered solution.

Studies of the structure of the mesophase, and thermodynamic transition from ordered mesophase to isotropic solution using DSC in combination with variable temperature polarized optical microscopy and absorbance spectroscopy, shows that in lyotropic solutions, PCDTPT polymers exhibit highly ordered π-stacking in solution, which then disappears above a clearing temperature depending on the solvent and size of the solubilizing alkyl chain. GIWAXS on PCDTPT thin films reveals significantly improved crystallinity and larger crystallite size when cast from a lyotropic solution, particularly in the direction of π-stacking. This resulting high fidelity crystalline π-stacking observed in these lyotropic solutions (important for intermolecular charge transport) is significant and unexpected-highly crystalline π-stacking has been, until now, difficult to improve via molecular design or device processing.

The present disclosure has further demonstrated that systematically varying the steric repulsion and backbone attractions present in polymer liquid crystals enables strong intermolecular interactions allowing polymers to align more effectively with shear fields. Specifically, the present invention describes how the interactions can be quantified using the Maier-Saupe interaction parameter to reveal a correlation between strength of interaction and alignment during shear coating. Indeed, the Maier-Saupe interaction parameter is identified as a key parameter indicating how well polymers align with external shear fields. The results show that molecules exhibiting less steric repulsion and closer π-stacking distances have higher Maier-Saupe interaction parameters. Using these guidelines, intermolecular interactions are tailored so that the liquid crystalline materials align using shear coating methods.

Thus, in addition to leveraging differential solvent interactions to enable nascent crystalline structure in solution (which can then be transferred to the solid state imparting favourable crystalline morphologies for transistors), the differential intermolecular interactions within mesophases can also be leveraged to affect alignment during shear. Together these effects are harnessed to simultaneously allow for formation and alignment of lyotropic mesophases consisting of conjugated polymers, providing a greater understanding of how solution interactions improve the morphology using equilibrium processing techniques.

Embodiments of the invention use these results to fabricate transistors with macroscopically aligned polymer chains using a shear coating procedure from a lyotropic solution to improve transistor performance.

Further information on embodiments of the invention can be found in references[114, 115].

REFERENCES

The following references are incorporated by reference herein:

(1) Tseng, H.-R.; Phan, H.; Luo, C.; Wang, M.; Perez, L. A.; Patel, S. N.; Ying, L.; Kramer, E. J.; Nguyen, T.-Q.; Bazan, G. C.; Heeger, A. *J. Adv. Mater.* 2014, 26 (19), 2993.

(2) Luo, C.; Kyaw, A. K. K.; Perez, L. A.; Patel, S.; Wang, M.; Grimm, B.; Bazan, G. C.; Kramer, E. J.; Heeger, A. *J. Nano Lett.* 2014, 14 (5), 2764.

(3) Boudouris, B. W.; Ho, V.; Jimison, L. H.; Toney, M. F.; Salleo, A.; Segalman, R. A. *Macromolecules* 2011, 44 (17), 6653.

(4) Duong, D. T.; Ho, V.; Shang, Z.; Mollinger, S.; Mannsfeld, S. C. B.; Dacufia, J.; Toney, M. F.; Segalman, R.; Salleo, A. *Adv. Funct. Mater.* 2014, 24 (28), 4515.

(5) Kline, R. J.; McGehee, M. D.; Kadnikova, E. N.; Liu, J.; Frechet, J. M. J.; Toney, M. F. *Macromolecules* 2005, 38 (8), 3312.

(6) Jimison, L. H.; Toney, M. F.; McCulloch, I.; Heeney, M.; Salleo, A. *Adv. Mater.* 2009, 21 (16), 1568.

(7) Vangerven, T.; Verstappen, P.; Drijkoningen, J.; Dierckx, W.; Himmelberger, S.; Salleo, A.; Vanderzande, D.; Maes, W.; Manca, J. V. *Chem. Mater.* 2015, 27 (10), 3726.

(8) Steyrleuthner, R.; Di Pietro, R.; Collins, B. A.; Polzer, F.; Himmelberger, S.; Schubert, M.; Chen, Z.; Zhang, S.; Salleo, A.; Ade, H.; Facchetti, A.; Neher, D. *J. Am. Chem. Soc.* 2014, 136 (11), 4245.

(9) Himmelberger, S.; Vandewal, K.; Fei, Z.; Heeney, M.; Salleo, A. *Macromolecules* 2014, 47 (20), 7151.

(10) Himmelberger, S.; Salleo, A. *MRC* 2015, 5 (3), 303.

(11) Tsao, H. N.; Cho, D.; Andreasen, J. W.; Rouhanipour, A.; Breiby, D. W.; Pisula, W.; Mullen, K. *Adv. Mater.* 2009, 21 (2), 209.

(12) Zen, A.; Pflaum, J.; Hirschmann, S.; Zhuang, W.; Jaiser, F.; Asawapirom, U.; Rabe, J. P.; Scherf, U.; Neher, D. *Adv. Funct. Mater.* 2004, 14 (8), 757.

(13) Olivier, Y.; Niedzialek, D.; Lemaur, V.; Pisula, W.; Mullen, K.; Koldemir, U.; Reynolds, J. R.; Lazzaroni, R.; Cornil, J.; Beljonne, D. *Adv. Mater.* 2014, 26 (14), 2119.

(14) Yan, H.; Song, Y.; McKeown, G. R.; Scholes, G. D.; Seferos, D. S. *Adv. Mater.* 2015, 27 (23), 3484.

(15) Yan, H.; Hollinger, J.; Bridges, C. R.; McKeown, G. R.; Al-Faouri, T.; Seferos, D. S. *Chem. Mater.* 2014, 26 (15), 4605.

(16) Biniek, L.; Leclerc, N.; Heiser, T.; Bechara, R.; Brinkmann, M. *Macromolecules* 2013, 46 (10), 4014.

(17) Fischer, F. S. U.; Trefz, D.; Back, J.; Kayunkid, N.; Tornow, B.; Albrecht, S.; Yager, K. G.; Singh, G.; Karim, A.; Neher, D.; Brinkmann, M.; Ludwigs, S. *Adv. Mater.* 2014, 27 (7), 1223.

(18) Tremel, K.; Fischer, F. S. U.; Kayunkid, N.; Pietro, R. D.; Tkachov, R.; Kiriy, A.; Neher, D.; Ludwigs, S.; Brinkmann, M. *Adv. Energy Mater.* 2014, 4 (10), 1301659.

(19) Yuan, Y.; Girl, G.; Ayzner, A. L.; Zoombelt, A. P.; Mannsfeld, S. C. B.; Chen, J.; Nordlund, D.; Toney, M. F.; Huang, J.; Bao, Z. *Nature Communications* 2014, 5, 1.

(20) Giri, G.; Verploegen, E.; Mannsfeld, S. C. B.; Atahan-Evrenk, S.; Do Hwan Kim; Lee, S. Y.; Becerril, H. A.; Aspuru-Guzik, A.; Toney, M. F.; Bao, Z. *Nature* 2011, 480 (7378), 504.

(21) Verploegen, E.; Mondal, R.; Bettinger, C. J.; Sok, S.; Toney, M. F.; Bao, Z. *Adv. Funct. Mater.* 2010, 20 (20), 3519.

(22) Briseno, A. L.; Mannsfeld, S. C. B.; Jenekhe, S. A.; Bao, Z.; Xia, Y. *Materials Today* 2008, 11 (4), 38.

(23) Kim, N.-K.; Jang, S.-Y.; Pace, G.; Caironi, M.; Park, W.-T.; Khim, D.; Kim, J.; Kim, D.-Y.; Noh, Y.-Y. *Chem. Mater.* 2015, 27 (24), 8345.

(24) Lee, J.; Jo, S. B.; Kim, M.; Kim, H. G.; Shin, J.; Kim, H.; Cho, K. *Adv. Mater.* 2014, 26 (39), 6706.

(25) Wang, S.; Kappl, M.; Liebewirth, I.; Müller, M.; Kirchhoff, K.; Pisula, W.; Millen, K. *Adv. Mater.* 2011, 24 (3), 417.

(26) Gemünden, P.; Poelking, C.; Kremer, K.; Andrienko, D.; Daoulas, K. C. *Macromolecules* 2013, 46 (14), 5762.

(27) Ho, V.; Boudouris, B. W.; Segalman, R. A. *Macromolecules* 2010, 43 (19), 7895.

(28) Olsen, B. D.; Alcazar, D.; Krikorian, V.; Toney, M. F.; Thomas, E. L.; Segalman, R. A. *Macromolecules* 2008, 41 (1), 58.

(29) Bao, Z.; Chen, Y.; Cai, R.; Yu, L. *Macromolecules* 1993, 26, 5281.

(30) Heeney, M.; Bailey, C.; Giles, M.; Shkunov, M.; Sparrowe, D.; Tierney, S.; Zhang, W.; McCulloch, I. *Macromolecules* 2004, 37 (14), 5250.

(31) McCulloch, I.; Heeney, M.; Bailey, C.; Genevicius, K.; MacDonald, I.; Shkunov, M.; Sparrowe, D.; Tierney, S.; Wagner, R.; Zhang, W.; Chabinyc, M. L.; Kline, R. J.; McGehee, M. D.; Toney, M. F. *Nature Publishing Group* 2006, 5 (4), 328.

(32) Grell, M.; Redecker, M.; Whitehead, K. S.; Bradley, D. D. C.; Inbasekaran, M.; Woo, E. P. *Liquid Crystals* 1999, 26 (9), 1403.

(33) Goto, H.; Wang, A.; Nimori, S.; Kawabata, K. *Liquid Crystals* 2013, 40 (9), 1159.

(34) Ko, S.; Kim, D. H.; Ayzner, A. L.; Mannsfeld, S. C. B.; Verploegen, E.; Nardes, A. M.; Kopidakis, N.; Toney, M. F.; Bao, Z. *Chem. Mater.* 2015, 27 (4), 1223.

(35) Snyder, C. R.; Kline, R. J.; DeLongchamp, D. M.; Nieuwendaal, R. C.; Richter, L. J.; Heeney, M.; McCulloch, I. *J. Polym. Sci. B Polym. Phys.* 2015, 53 (23), 1641.

(36) Wang, C.; Jimison, L. H.; Goris, L.; McCulloch, I.; Heeney, M.; Ziegler, A.; Salleo, A. *Adv. Mater.* 2010, 22 (6), 697.

(37) Biniek, L.; Leclerc, N.; Heiser, T.; Bechara, R.; Brinkmann, M. *Macromolecules* 2013, 46 (10), 4014.

(38) Street, R. A.; Northrup, J. E.; Salleo, A. *Phys. Rev. B* 2005, 71 (16), 165202.

(39) Kleinhenz, N.; Rosu, C.; Chatterjee, S.; Chang, M.; Nayani, K.; Xue, Z.; Kim, E.; Middlebrooks, J.; Russo, P. S.; Park, J. O.; Srinivasarao, M.; Reichmanis, E. *Chem. Mater.* 2015, 27 (7), 2687.

(40) Choi, D.; Chang, M.; Reichmanis, E. *Adv. Funct. Mater.* 2014, 25 (6), 920.

(41) Park, M. S.; Aiyar, A.; Park, J. O.; Reichmanis, E.; Srinivasarao, M. *J. Am. Chem. Soc.* 2011, 133 (19), 7244.

(42) Kim, B.-G.; Jeong, E. J.; Chung, J. W.; Seo, S.; Koo, B.; Kim, J. *Nat Mater* 2013, 12 (7), 659.

(43) Acree, W. E.; Abraham, M. H. *Fluid Phase Equilibria* 2002, 201 (2), 245.

(44) Ford, M. J.; Wang, M.; Patel, S. N.; Phan, H.; Segalman, R. A.; Nguyen, T.-Q.; Bazan, G. C. *Chem. Mater.* 2016, 28 (5), 1256.

(45) Ying, L.; Hsu, B. B. Y.; Zhan, H.; Welch, G. C.; Zalar, P.; Perez, L. A.; Kramer, E. J.; Nguyen, T.-Q.; Heeger, A. J.; Wong, W.-Y.; Bazan, G. C. *J. Am. Chem. Soc.* 2011, 133 (46), 18538.

(46) Hinkel, F.; Marszalek, T.; Zajaczkowski, W.; Puniredd, S. R.; Baumgarten, M.; Pisula, W.; Mullen, K. *Chem. Mater.* 2014, 26 (16), 4844.

(47) Kim, Y.; Cook, S.; Tuladhar, S. M.; Choulis, S. A.; Nelson, J.; Durrant, J. R.; Bradley, D. D. C.; Giles, M.; McCulloch, I.; Ha, C.-S.; Ree, M. *Nature Publishing Group* 2006, 5 (3), 197.

(48) Prosa, T. J.; Winokur, M. J.; Moulton, J.; Smith, P.; Heeger, A. J. *Macromolecules* 1992, 25 (17), 4364.

(49) Chen, T. A.; Wu, X.; Rieke, R. D. *J. Am. Chem. Soc.* 1995, 117 (1), 233.

(50) Prosa, T. J.; Winokur, M. J.; McCullough, R. D. *Macromolecules* 1996, 29 (46), 3654.

(51) Meille, S. V.; Romita, V.; Caronna, T.; Lovinger, A. J.; Catellani, M.; Belobrzeckaja, L. *Macromolecules* 1997, 30 (25), 7898.

(52) Beaujuge, P. M.; Pisula, W.; Tsao, H. N.; Ellinger, S.; Mullen, K.; Reynolds, J. R. *J. Am. Chem. Soc.* 2009, 131 (22), 7514.

(53) Huang, Y.; Guo, X.; Liu, F.; Huo, L.; Chen, Y.; Russell, T. P.; Han, C. C.; Li, Y.; Hou, J. *Adv. Mater.* 2012, 24 (25), 3383.

(54) Noriega, R.; Rivnay, J.; Vandewal, K.; Koch, F. P. V.; Stingelin, N.; Smith, P.; Toney, M. F.; Salleo, A. *Nat Mater* 2013, 12 (11), 1038.

(55) Duong, D. T.; Toney, M. F.; Salleo, A. *Phys. Rev. B* 2012, 86 (20), 205205.

(56) Hedstrom, S.; Henriksson, P.; Wang, E. *J. Phys. Chem. C* 2015, 119, 645.

(57) Brinkmann, M.; Gonthier, E.; Bogen, S.; Tremel, K.; Ludwigs, S.; Hufnagel, M.; Sommer, M. *ACS Nano* 2012, 6 (11), 10319.

(58) Fischer, F. S. U.; Kayunkid, N.; Trefz, D.; Ludwigs, S.; Brinkmann, M. *Macromolecules* 2015, 48 (12), 3974.

(59) Patel, S. N.; Su, G. M.; Luo, C.; Wang, M.; Perez, L. A.; Fischer, D. A.; Prendergast, D.; Bazan, G. C.; Heeger, A. J.; Chabinyc, M. L.; Kramer, E. J. *Macromolecules* 2015, 48 (18), 6606.

(60) Street, R. A.; Northrup, J. E.; Salleo, A. *Phys. Rev. B* 2005, 71 (16), 165202.

(61) Popere, B. C.; Bartels, J.; Evans, C. M.; Segalman, R. A., Submitted to ACS Macro Letters 2016.

(62) Thomas, E. M.*; Popere, B. C.*; Fang, H.*; Chabinyc, M. L.; Segalman, R. A., Submitted to Adv. Func. Mater. 2016.

(63) Choi, J.-H.; Xie, W.; Gu, Y.; Frisbie, C. D.; Lodge, T. P. *ACS Appl Mater Interfaces* 2015, 7 (13), 7294.

(64) Lincker, F.; Delbosc, N.; Bailly, S.; De Bettignies, R.; Billon, M.; Pron, A.; Demadrille, R. *Adv. Funct. Mater.* 2008, 18 (21), 3444.

(65) Sun, Y.; Chien, S.-C.; Yip, H.-L.; Zhang, Y.; Chen, K.-S.; Zeigler, D. F.; Chen, F.-C.; Lin, B.; Jen, A. K. Y. *J. Mater. Chem.* 2011, 21 (35), 13247.

(66) Ellinger, S.; Ziener, U.; Thewalt, U.; Landfester, K.; Möller, M. *Chem. Mater.* 2007, 19, 1070.

(67) Love, B. E.; Jones, E. G. *J. Org. Chem.* 1999, 64 (10), 3755.

(68) Lagerwall, J.; Scalia, G.; Haluska, M.; Dettlaff-Weglikowska, U.; Roth, S.; Giesselmann, F. Nanotube Alignment Using Lyotropic Liquid Crystals. *Adv. Mater.* 2007, 19 (3), 359-364.

(69) Madsen, L. A.; Dingemans, T. J.; Nakata, M.; Samulski, E. T. Thermotropic Biaxial Nematic Liquid Crystals. *Phys. Rev. Lett.* 2004, 92 (14), 145505-145510.

(70) Jeong, J.; Han, G.; Johnson, A. T. C.; Collings, P. J.; Lubensky, T. C.; Yodh, A. G. Homeotropic Alignment of Lyotropic Chromonic Liquid Crystals Using Noncovalent Interactions. *Langmuir* 2014, 30 (10), 2914-2920.

(71) Geary, J. M.; Goodby, J. W.; Kmetz, A. R.; Patel, J. S. The Mechanism of Polymer Alignment of Liquid-Crystal Materials. *Journal of Applied Physics* 1987, 62 (10), 4100-4108.

(72) Stohr, J.; Samant, M. G. Liquid Crystal Alignment by Rubbed Polymer Surfaces: a Microscopic Bond Orientation Model. *Journal of Electron Spectroscopy and Related Phenomena* 1999, 99, 189-207.

(73) Jones, L. P. Alignment Properties of Liquid Crystals. In *Handbook of Visual Display Technology*, J. Chen, W. Cranton, M. Fihn, Springer-Verlag Berlin Heidelberg 2012, Chapter 7, 1388-1401.

(74) Tao, Y.; Zohar, H.; Olsen, B. D.; Segalman, R. A. Hierarchical Nanostructure Control in Rod-Coil Block Copolymers with Magnetic Fields. *Nano Lett.* 2007, 7 (9), 2742-2746.

(75) Coropceanu, V.; Cornil, J.; da Silva Filho, D. A.; Olivier, Y.; Silbey, R.; Bredas, J.-L. Charge Transport in Organic Semiconductors. *Chem. Rev.* 2007, 107 (4), 926-952.

(76) Kim, B.-G.; Jeong, E. J.; Chung, J. W.; Seo, S.; Koo, B.; Kim, J. A molecular design principle of lyotropic liquid-crystalline conjugated polymers with directed alignment capability for plastic electronics. *Nat. Mater.* 2013, 12 (7), 659-664.

(77) Kim, N.-K.; Jang, S.-Y.; Pace, G.; Caironi, M.; Park, W.-T.; Khim, D.; Kim, J.; Kim, D.-Y.; Noh, Y.-Y. High-Performance Organic Field-Effect Transistors with Directionally Aligned Conjugated Polymer Film Deposited from Pre-Aggregated Solution. *Chem. Mater.* 2015, 27 (24), 8345-8353.

(78) Tseng, H.-R.; Phan, H.; Luo, C.; Wang, M.; Perez, L. A.; Patel, S. N.; Ying, L.; Kramer, E. J.; Nguyen, T.-Q.; Bazan, G. C.; Heeger, A. J. High-Mobility Field-Effect Transistors Fabricated with Macroscopic Aligned Semiconducting Polymers. *Adv. Mater.* 2014, 26 (19), 2993-2998.

(79) Luo, C.; Kyaw, A. K. K.; Perez, L. A.; Patel, S.; Wang, M.; Grimm, B.; Bazan, G. C.; Kramer, E. J.; Heeger, A. J. General Strategy for Self-Assembly of Highly Oriented Nanocrystalline Semiconducting Polymers with High Mobility. *Nano Lett.* 2014, 14 (5), 2764-2771.

(80) Brinkmann, M.; Contal, C.; Kayunkid, N.; Djuric, T.; Resel, R. Highly Oriented and Nanotextured Films of Regioregular Poly(3-Hexylthiophene) Grown by Epitaxy on the Nanostructured Surface of an Aromatic Substrate. *Macromolecules* 2010, 43 (18), 7604-7610.

(81) Brinkmann, M.; Hartmann, L.; Biniek, L.; Tremel, K.; Kayunkid, N. Orienting Semi-Conducting Conjugated Polymers. *Macromol. Rapid Commun.* 2013, 35 (1), 9-26.

(82) Tremel, K.; Fischer, F. S. U.; Kayunkid, N.; Pietro, R. D.; Tkachov, R.; Kiriy, A.; Neher, D.; Ludwigs, S.; Brinkmann, M. Charge Transport Anisotropy in Highly Oriented Thin Films of the Acceptor Polymer P(NDI2OD-T2). *Adv. Energy Mater.* 2014, 4 (10), 1301659.

(83) Biniek, L.; Leclerc, N.; Heiser, T.; Bechara, R.; Brinkmann, M. Large Scale Alignment and Charge Transport Anisotropy of pBTTT Films Oriented by High Temperature Rubbing. *Macromolecules* 2013, 46 (10), 4014-4023.

(84) Bridges, C. R.; Ford, M. J.; Popere, B. C.; Bazan, G. C.; Segalman, R. A. Formation and Structure of Lyotropic Liquid Crystalline Mesophases in Donor-Acceptor Semiconducting Polymers. *Macromolecules* 2016, 49 (19), 7220-7229.

(85) Olsen, B. D.; Jang, S.-Y.; Liining, J. M.; Segalman, R. A. Higher Order Liquid Crystalline Structure in Low-Polydispersity DEH-PPV. *Macromolecules* 2006, 39 (13), 4469-4479.

(89) Ho, V.; Boudouris, B. W.; Segalman, R. A. Tuning Polythiophene Crystallization Through Systematic Side Chain Functionalization. *Macromolecules* 2010, 43 (19), 7895-7899.

(90) Soule, E. R.; Rey, A. D. Modelling Complex Liquid Crystal Mixtures: From Polymer Dispersed Mesophase to Nematic Nanocolloids. *Molecular Simulation* 2012, 38 (8), 735-750.

(91) Aliev, M. A.; Ugolkova, E. A.; Kuzminyh, N. Y. The Landau-De Gennes Free Energy Expansion of a Melt of v-Shaped Polymer Molecules. *The Journal of Chemical Physics* 2016, 145 (8), 084908-084913.

(92) Heeney, M.; Bailey, C.; Giles, M.; Shkunov, M.; Sparrowe, D.; Tierney, S.; Zhang, W.; McCulloch, I. Alkylidene Fluorene Liquid Crystalline Semiconducting Polymers for Organic Field Effect Transistor Devices. *Macromolecules* 2004, 37 (14), 5250-5256.

(93) Noriega, R.; Rivnay, J.; Vandewal, K.; Koch, F. P. V.; Stingelin, N.; Smith, P.; Toney, M. F.; Salleo, A. A general relationship between disorder, aggregation and charge transport in conjugated polymers. *Nat. Mater.* 2013, 12 (11), 1038-1044.

(94) Duong, D. T.; Toney, M. F.; Salleo, A. Role of confinement and aggregation in charge transport in semicrystalline polythiophene thin films. *Phys. Rev. B: Condens. Matter Mater. Phys.* 2012, 86 (20), 205205.

(95) Hedstrom, S.; Henriksson, P.; Wang, E. Temperature-Dependent Optical Properties of Flexible Donor-Acceptor Polymers. *J. Phys. Chem. C* 2015, 119, 6453-6463.

(96) Fischer, F. S. U.; Kayunkid, N.; Trefz, D.; Ludwigs, S.; Brinkmann, M. Structural Models of Poly(cyclopentadithiophene-alt-benzothiadiazole) with Branched Side Chains: Impact of a Single Fluorine Atom on the Crystal Structure and Polymorphism of a Conjugated Polymer. *Macromolecules* 2015, 48 (12), 3974-3982.

(97) Ford, M. J.; Wang, M.; Patel, S. N.; Phan, H.; Segalman, R. A.; Nguyen, T.-Q.; Bazan, G. C. High Mobility Organic Field-Effect Transistors from Majority Insulator Blends. *Chem. Mater.* 2016, 28 (5), 1256-1260.

(98) Ying, L.; Hsu, B. B. Y.; Zhan, H.; Welch, G. C.; Zalar, P.; Perez, L. A.; Kramer, E. J.; Nguyen, T.-Q.; Heeger, A. J.; Wong, W.-Y.; Bazan, G. C. Regioregular Pyridal[2,1,3]thiadiazole it-Conjugated Copolymers. *J. Am. Chem. Soc.* 2011, 133 (46), 18538-18541.

(100) Reinspach, J. A.; Diao, Y.; Giri, G.; Sachse, T.; England, K.; Zhou, Y.; Tassone, C.; Worfolk, B. J.; Presselt, M.; Toney, M. F.; Mannsfeld, S.; Bao, Z. Tuning the Morphology of Solution-Sheared P3HT:PCBM Films. *ACS Appl. Mater. Interfaces* 2016, 8 (3), 1742-1751.

(101) Giri, G.; DeLongchamp, D. M.; Reinspach, J.; Fischer, D. A.; Richter, L. J.; Xu, J.; Benight, S.; Ayzner, A.; He, M.; Fang, L.; Xue, G.; Toney, M. F.; Bao, Z. Effect of Solution Shearing Method on Packing and Disorder of Organic Semiconductor Polymers. *Chem. Mater.* 2015, 27 (7), 2350-2359.

(102) Giri, G.; Verploegen, E.; Mannsfeld, S. C. B.; Atahan-Evrenk, S.; Do Hwan Kim; Lee, S. Y.; Becerril, H. A.; Aspuru-Guzik, A.; Toney, M. F.; Bao, Z. Tuning Charge Transport in Solution-Sheared Organic Semiconductors Using Lattice Strain. *Nature* 2011, 480 (7378), 504-508.

(104) Lussem, B.; Riede, M.; Leo, K. Doping of Organic Semiconductors. *Phys. Stat. Sol. (a)* 2012, 210 (1), 9-43.

(105) Lussem, B.; Keum, C.-M.; Kasemann, D.; Naab, B.; Bao, Z.; Leo, K. Doped Organic Transistors. *Chem. Rev.* 2016, 116(22), 13714-13751.

(106) Salzmann, I.; Heimel, G.; Oehzelt, M.; Winkler, S.; Koch, N. Molecular Electrical Doping of Organic Semiconductors: Fundamental Mechanisms and Emerging Dopant Design Rules. *Acc. Chem. Res.* 2016, 49 (3), 370-378.

(107) Emin, D. Optical Properties of Large and Small Polarons and Bipolarons. *Phys. Rev. B* 1993, 48 (18), 13691-13702.

(108) Mladenović, M.; Vukmirović, N. Charge Carrier Localization and Transport in Organic Semiconductors: Insights From Atomistic Multiscale Simulations. *Adv. Funct. Mater.* 2014, 25 (13), 1915-1932.

(110) DiBenedetto et. al., Molecular Self-Assembled Monolayers and Multilayers for Organic and Unconventional Inorganic Thin-Film Transistor Applications, *Adv. Mater.* 2009, 21, 1407-1433 DOI 10.1002/adma.200803267.

(111) Appendix A of priority application U.S. Provisional Patent Application No. 62/367,401 filed Jul. 27, 2016, by Colin R. Bridges, Michael J. Ford, Guillermo C. Bazan, and Rachel A. Segalman, entitled "FORMATION AND STRUCTURE OF LYOTROPIC LIQUID CRYSTALLINE MESOPHASES IN DONOR-ACCEPTOR SEMICONDUCTING POLYMERS," Attorney's Docket No., 30794.623-US-P1 (2017-036).

(112) Appendix B of priority application U.S. Provisional Patent Application No. 62/480,693 filed Apr. 3, 2017, by Colin Bridges and Rachel A. Segalman, entitled "MOLECULAR CONSIDERATIONS FOR MESOPHASE INTERACTION AND ALIGNMENT OF LYOTROPIC LIQUID CRYSTALLINE SEMICONDUCTING POLYMERS,".

(114) Molecular Considerations for Mesophase Interaction and Alignment of Lyotropic Liquid Crystalline Semiconducting Polymers C R Bridges, M J Ford, G C Bazan, R A Segalman—ACS Macro Lett., 2017, 6 (6), pp 619-624 (including supporting information).

(115) Formation and Structure of Lyotropic Liquid Crystalline Mesophases in Donor-Acceptor Semiconducting Polymers, Colin R. Bridges, Michael J. Ford, Bhooshan C. Popere, Guillermo C. Bazan, and Rachel A. Segalman *Macromolecules,* 2016, 49 (19), pp 7220-7229 (including supporting information).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A composition of matter, comprising:
   lyotropic semiconducting polymers each having a donor-acceptor copolymer backbone and a side chain attached to the backbone, wherein the donor-acceptor copolymer backbone comprises fused aromatic rings.

2. The composition of matter of claim 1, wherein:
   the semiconducting polymers are amphiphilic semiconducting polymers, and
   the side chains dissolve in a solvent more effectively than the backbone.

3. The composition of matter of claim 1, further comprising:
   a lyotropic solution comprising a solvent and the side chains dissolved in the solvent, and
   solvent enhanced intermolecular interactions between the lyotropic semiconducting polymers that align the lyotropic semiconducting polymers with a direction of a shear force applied to the solution, so as to dispose the lyotropic semiconducting polymers in an aligned crystalline structure.

4. The composition of matter of claim 1, further comprising:
   a lyotropic solution including a liquid crystal comprising an aggregate of at least 100 of the lyotropic semiconducting polymers bonded with pi-pi bonds, wherein the liquid crystal is characterized by a Maier-Saupe interaction parameter of at least 50.

5. The composition of matter of claim 1, further comprising:
   a lyotropic solution including the lyotropic semiconducting polymers disposed in a liquid crystal, wherein the lyotropic semiconducting polymers are bonded with pi-pi bonds, the lyotropic semiconducting polymers have a number of repeating units N, and $N^{-1}$ is a linear function of (nematic-isotropic clearing temperature)$^{-1}$ (K).

6. The composition of matter of claim 2, wherein the solvent comprises at least one compound selected from an alkane, an alkene, an alkyne, an ether, an ester, an alcohol, a halide, an aldehyde, a ketone, an amine, an amide, and water.

7. The composition of matter of claim 1, wherein the side chain is a branched $C_8$-$C_{50}$ alkyl chain.

8. The composition of matter of claim 1, wherein the side chain is a branched $C_3$-$C_{50}$ chain extending more towards a direction parallel to the backbone than towards a direction perpendicular to the backbone.

9. The composition of matter of claim 1, further comprising a solid state film comprising the lyotropic semiconducting polymers combined in a stack and pi-pi bonds between the lyotropic semiconducting polymers.

10. The composition of matter of claim 1, wherein the semiconducting polymers at a top of the film are aligned with the semiconducting polymers at a bottom of the film.

11. An organic device, comprising:
an active region comprising lyotropic semiconducting polymers, wherein the semiconducting polymers each have a donor-acceptor copolymer backbone comprising fused aromatic rings.

12. The device of claim 11, wherein:
the active region is cast from a lyotropic solution,
the active region has increased crystallinity and mobility as compared to an active region comprising the lyotropic semiconducting polymers cast from an isotropic solution.

13. The device of the claim 11, wherein π-π stacking of the lyotropic semiconductor polymers in the active region is characterized by a peak having a full width at half maximum of 0.11 Å$^{-1}$ or less, as measured by X-ray scattering.

14. The device of claim 11, wherein:
π-π stacking of the lyotropic semiconductor polymers in the active region is characterized by observation of secondary (0n0) and (n00) reflections and off-axis peaks, as measured by X-ray scattering, and
n is an integer.

15. The device of claim 11, wherein:
the active region is cast from a lyotropic solution comprising a solvent, and
the lyotropic semiconducting polymers have branched side-chains comprising a $C_3$-$C_{50}$ substituted or non-substituted alkyl chain and the solvent is a hydrocarbon.

16. The device of claim 11, wherein the backbone has a repeat unit that comprises:
an acceptor of the structure:

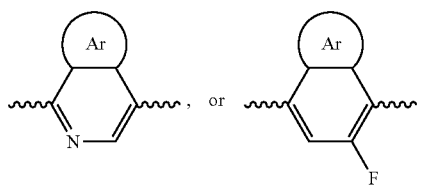

wherein Ar is a substituted or non-substituted aromatic functional group, or Ar is nothing and the valence of the pyridine ring or fluorinated ring is completed with hydrogen; and a donor of the structure:

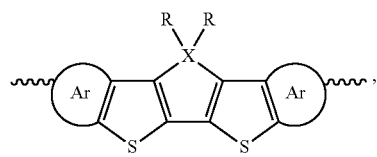

wherein each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, C═C, Si, Ge, N or P.

17. The device of claim 11, wherein the lyotropic semiconducting polymers comprise at least one compound selected from PCDTPT-EH, PCDTPT-HD, PCDTPT-ODD, PCDTPT-ene-HD, and PCDTPT-ene-ODD.

18. A method of fabricating an organic device, comprising:
obtaining or preparing a lyotropic solution comprising semiconducting polymers disposed in a lyotropic liquid crystalline mesophase, wherein the semiconducting polymers each have a donor-acceptor copolymer backbone comprising fused aromatic rings and a side chain attached to the backbone; and solution processing the lyotropic solution on a substrate to form an active region comprising the semiconducting polymers.

19. The method of claim 18, further comprising:
selecting a selective solvent for the side chains; and
combining the semiconducting polymers and the selective solvent so that the lyotropic solution is formed.

20. The method of claim 19, wherein the selective solvent is at least one compound selected from an alkane, an alkene, an alkyne, an ether, an ester, an alcohol, a halide, an aldehyde, a ketone, an amine, an amide, and water.

21. The method of claim 18, wherein the solution processing comprises coating the lyotropic solution onto the substrate using an equilibrium coating method selected from blade coating, bar coating, roll coating, dip coating, dye coating, gravure coating, and flow coating.

* * * * *